(12) United States Patent
Hiner et al.

(10) Patent No.: US 10,784,232 B2
(45) Date of Patent: Sep. 22, 2020

(54) SEMICONDUCTOR PACKAGE AND FABRICATING METHOD THEREOF

(71) Applicant: Amkor Technology, Inc., Tempe, AZ (US)

(72) Inventors: David Hiner, Chandler, AZ (US); Michael Kelly, Queen Creek, AZ (US); Ronald Huemoeller, Gilbert, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 16/700,592

(22) Filed: Dec. 2, 2019

(65) Prior Publication Data

US 2020/0227385 A1 Jul. 16, 2020

Related U.S. Application Data

(63) Continuation of application No. 16/213,769, filed on Dec. 7, 2018, now Pat. No. 10,497,674, which is a (Continued)

(51) Int. Cl.
*H01L 25/065* (2006.01)
*H01L 23/538* (2006.01)
(Continued)

(52) U.S. Cl.
CPC .......... *H01L 25/0655* (2013.01); *H01L 21/56* (2013.01); *H01L 21/561* (2013.01); *H01L 21/563* (2013.01); *H01L 21/568* (2013.01); *H01L 21/6835* (2013.01); *H01L 23/3128* (2013.01); *H01L 23/3135* (2013.01); *H01L 23/3185* (2013.01); *H01L 23/5383* (2013.01); *H01L 23/5385* (2013.01); *H01L 23/5386* (2013.01); *H01L 24/14* (2013.01); *H01L 24/16* (2013.01); *H01L 24/73* (2013.01); *H01L 24/97* (2013.01); *H01L 25/50* (2013.01); (Continued)

(58) Field of Classification Search
CPC ....... H01L 2224/97; H01L 2224/16225; H01L 23/49816; H01L 2224/16227; H01L 2224/1403; H01L 2224/95001; H01L 2224/81005; H01L 2224/18; H01L 2224/73204; H01L 2221/68345; H01L 23/5383; H01L 23/5386; H01L 23/3185; H01L 23/3135; H01L 23/5385; H01L 24/73; H01L 24/14; H01L 24/97; H01L 24/16; H01L 21/486; H01L 21/56; H01L 21/568; H01L 21/563; H01L 21/6835; H01L 21/561; H01L 25/0655
See application file for complete search history.

(56) References Cited

U.S. PATENT DOCUMENTS 7,402,901 B2 7/2008 Hatano
8,546,955 B1 10/2013 Wu
(Continued)

*Primary Examiner* — Jasmine J Clark
(74) *Attorney, Agent, or Firm* — McAndrews, Held & Malloy, Ltd.

(57) ABSTRACT

A semiconductor package structure and a method for making a semiconductor package. As non-limiting examples, various aspects of this disclosure provide various semiconductor package structures, and methods for making thereof, that comprise a connect die that routes electrical signals between a plurality of other semiconductor die.

20 Claims, 31 Drawing Sheets

Related U.S. Application Data continuation-in-part of application No. 15/707,646, filed on Sep. 18, 2017, now Pat. No. 10,312,220, which is a continuation-in-part of application No. 15/594,313, filed on May 12, 2017, now Pat. No. 10,032,748, which is a continuation of application No. 15/207,186, filed on Jul. 11, 2016, now Pat. No. 9,653,428.

(60) Provisional application No. 62/287,544, filed on Jan. 27, 2016.

(51) Int. Cl.
*H01L 23/00* (2006.01)
*H01L 21/56* (2006.01)
*H01L 23/31* (2006.01)
*H01L 21/683* (2006.01)
*H01L 25/00* (2006.01)
*H01L 23/498* (2006.01)
*H01L 21/48* (2006.01)

(52) U.S. Cl.
CPC ...... *H01L 21/486* (2013.01); *H01L 23/49816* (2013.01); *H01L 2221/68345* (2013.01); *H01L 2224/1403* (2013.01); *H01L 2224/16225* (2013.01); *H01L 2224/16227* (2013.01); *H01L 2224/18* (2013.01); *H01L 2224/73204* (2013.01); *H01L 2224/81005* (2013.01); *H01L 2224/95001* (2013.01); *H01L 2224/97* (2013.01)

(56) References Cited

U.S. PATENT DOCUMENTS

| | | |
|---|---|---|
| 9,026,872 B2 | 5/2015 | Camarota |
| 9,653,428 B1 | 5/2017 | Hiner et al. |
| 9,741,664 B2 * | 8/2017 | Chiu ........................ H01L 24/23 |
| 2013/0063843 A1 | 3/2013 | Chen |
| 2013/0168854 A1 | 7/2013 | Karikalan |
| 2013/0207261 A1 | 8/2013 | Thacker |
| 2015/0364422 A1 | 12/2015 | Zhai |
| 2016/0126161 A1 | 5/2016 | Fang |
| 2016/0240497 A1 | 8/2016 | Chen |
| 2017/0301625 A1 | 10/2017 | Mahajan |

* cited by examiner 400A-1

411

400A-2

411

400A-3

412

400A-4

412

SEMICONDUCTOR PACKAGE AND FABRICATING METHOD THEREOF

CROSS-REFERENCE TO RELATED APPLICATIONS/INCORPORATION BY REFERENCE

This application is a continuation of U.S. patent application Ser. No. 16/213,769, filed Dec. 7, 2018, and titled "SEMICONDUCTOR PACKAGE AND FABRICATING METHOD THEREOF," expected to issue as U.S. Pat. No. 10,497,674; which is a continuation-in-part of U.S. patent application Ser. No. 15/707,646, filed Sep. 18, 2017, and titled "SEMICONDUCTOR PACKAGE AND FABRICATING METHOD THEREOF," now U.S. Pat. No. 10,312,220; which is a continuation-in-part of U.S. patent application Ser. No. 15/594,313, filed May 12, 2017, and titled "SEMICONDUCTOR PACKAGE AND FABRICATING METHOD THEREOF," now U.S. Pat. No. 10,032,748; which is a continuation of U.S. patent application Ser. No. 15/207,186, filed Jul. 11, 2016, and titled "SEMICONDUCTOR PACKAGE AND FABRICATING METHOD THEREOF," now U.S. Pat. No. 9,653,428; which makes reference to, claims priority to, and claims benefit from U.S. Provisional Application No. 62/287,544, filed on Jan. 27, 2016, and titled "SEMICONDUCTOR PACKAGE AND FABRICATING METHOD THEREOF," each of which is hereby incorporated herein by reference in its entirety.

This application is related to U.S. patent application Ser. No. 14/686,725, filed Apr. 14, 2015, and titled "SEMICONDUCTOR PACKAGE WITH HIGH ROUTING DENSITY PATCH"; U.S. patent application Ser. No. 14/823,689, filed Aug. 11, 2015, and titled "SEMICONDUCTOR PACKAGE AND FABRICATING METHOD THEREOF," now U.S. Pat. No. 9,543,242; U.S. patent application Ser. No. 15/400,041, filed Jan. 6, 2017, and titled "SEMICONDUCTOR PACKAGE AND FABRICATING METHOD THEREOF"; and U.S. patent application Ser. No. 15/066,724, filed Mar. 10, 2016, and titled "SEMICONDUCTOR PACKAGE AND MANUFACTURING METHOD THEREOF," each of which is hereby incorporated herein by reference in its entirety.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
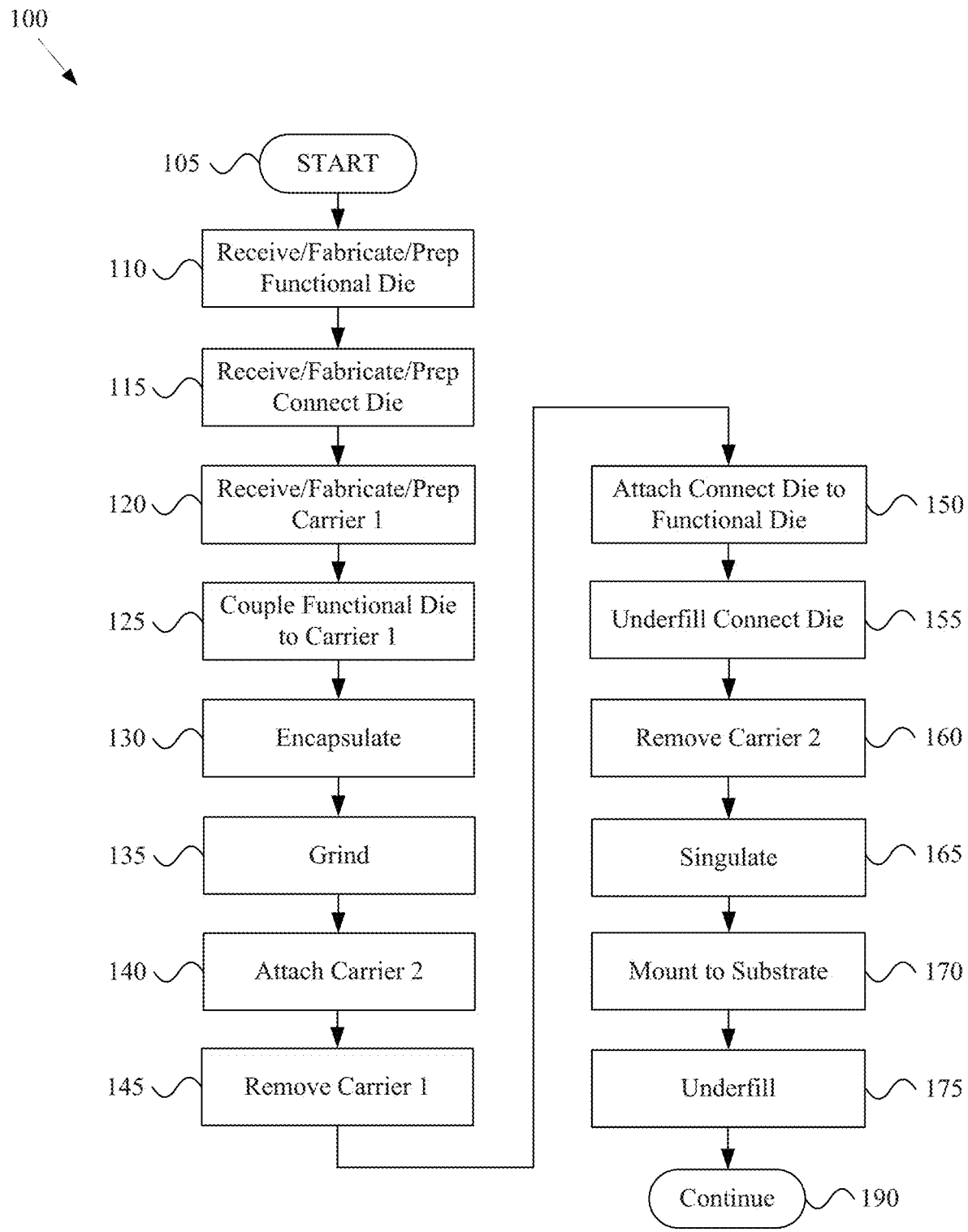
FIG. 1 shows a flow diagram of an example method of making an electronic device, in accordance with various aspects of the present disclosure.

Various aspects of this disclosure provide a semiconductor package structure and a method for making a semiconductor package. As non-limiting examples, various aspects of this disclosure provide various semiconductor package structures, and methods for making thereof, that comprise a connect die that routes electrical signals between a plurality of other semiconductor die.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

Various aspects of the present disclosure provide a semiconductor device or package and a fabricating (or manufacturing) method thereof, which can decrease the cost, increase the reliability, and/or increase the manufacturability of the semiconductor device or package.

The above and other aspects of the present disclosure will be described in or be apparent from the following description of various example implementations. Various aspects of the present disclosure will now be presented with reference to accompanying drawings, such that those skilled in the art may readily practice the various aspects.

Figure 2A:
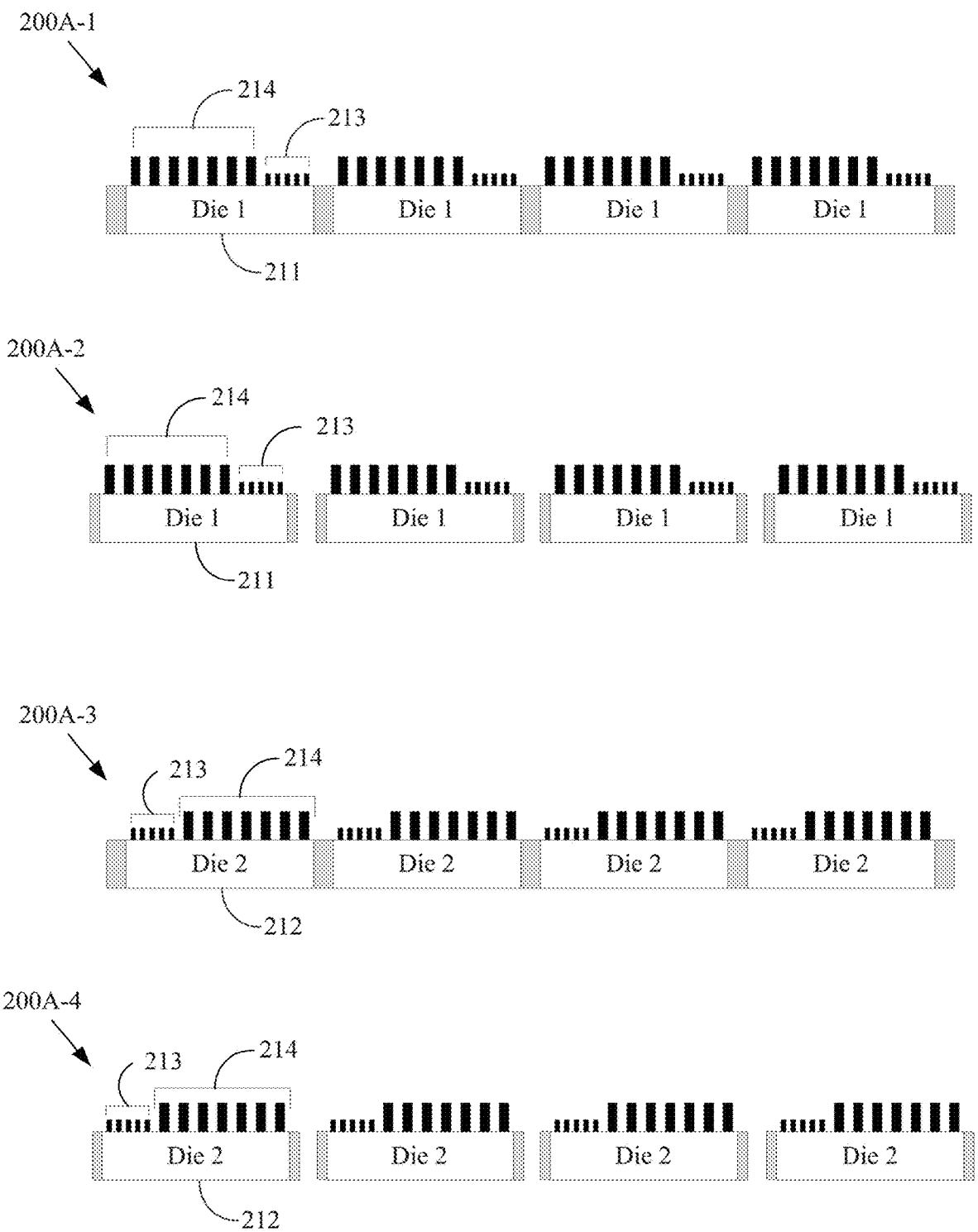
FIGS. 2A-2Q show cross-sectional views illustrating an example electronic device and an example method of making an example electronic device, in accordance with various aspects of the present disclosure.
Figures 1, 2B:
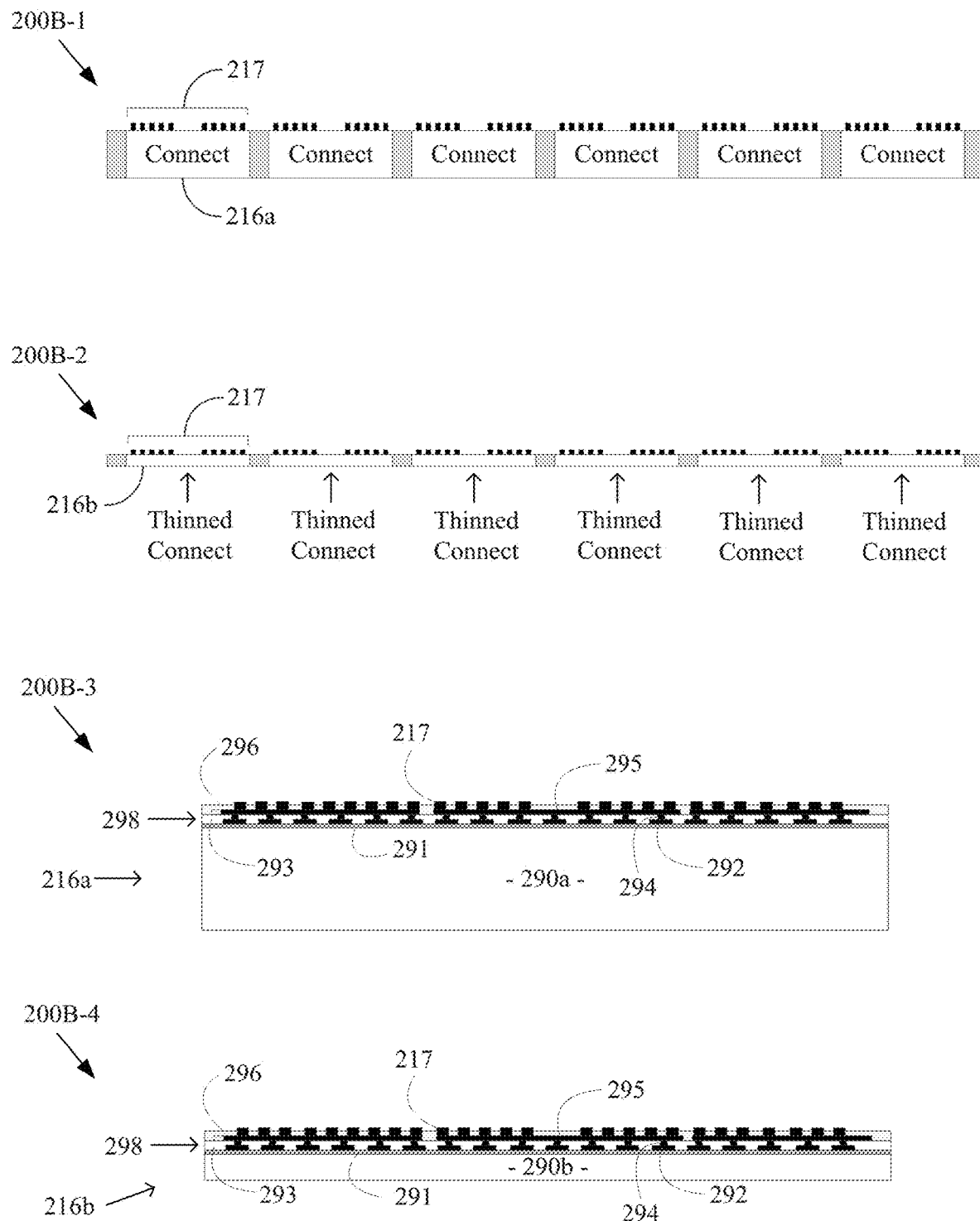
Figures 2, 2B:
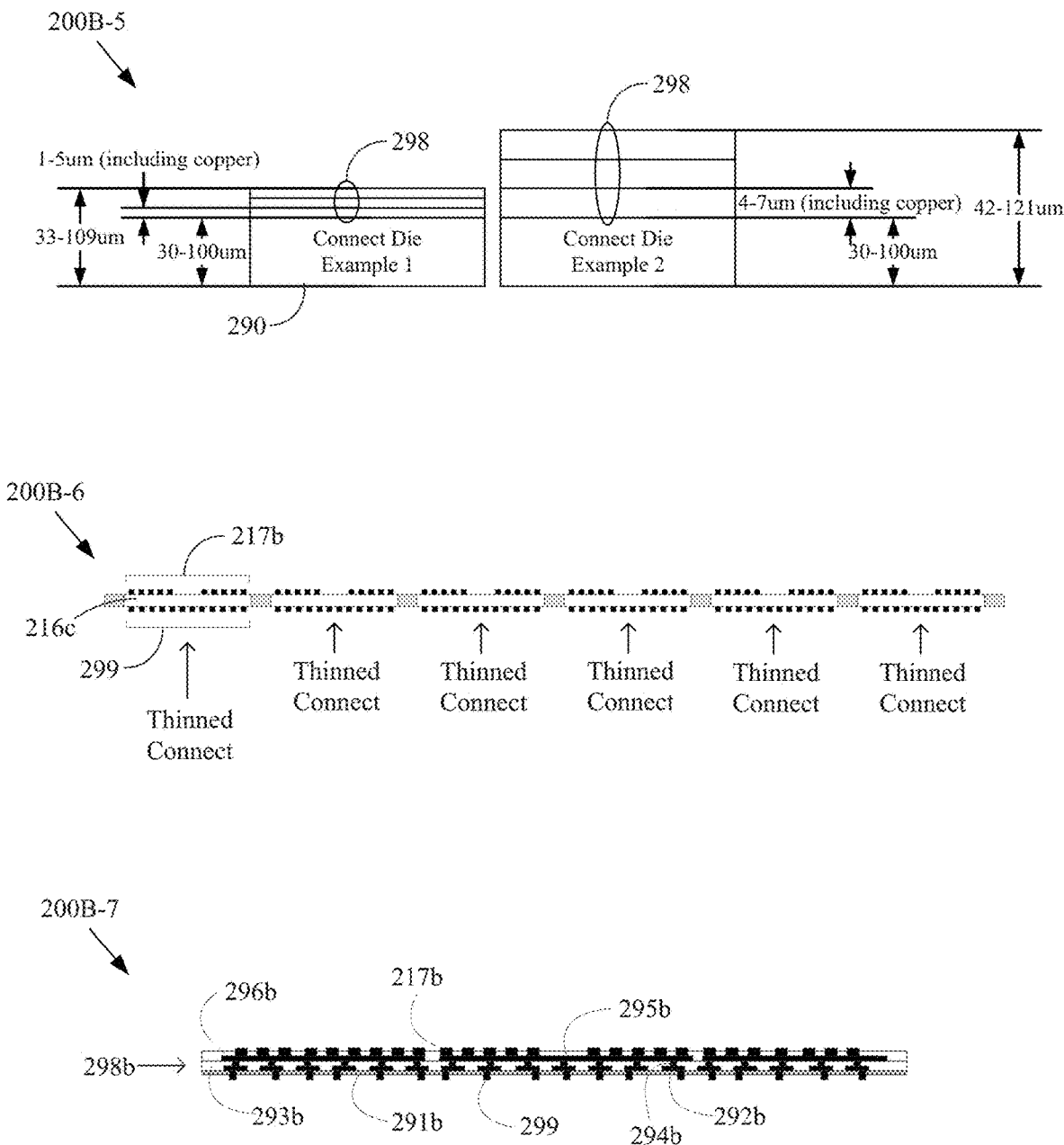

FIG. 1 shows a flow diagram of an example method 100 of making an electronic device (e.g., a semiconductor package, etc.). The example method 100 may, for example, share any or all characteristics with any other example method(s) discussed herein (e.g., the example method 300 of FIG. 3, the example method 500 of FIG. 5, the example method 700 of FIG. 7, etc.). FIGS. 2A-2Q show cross-sectional views illustrating an example electronic device (e.g., a semiconductor package, etc.) and an example method of making an example electronic device, in accordance with various aspects of the present disclosure. FIGS. 2A-2Q may, for example, illustrate an example electronic device at various blocks (or steps) of the method 100 of FIG. 1. FIGS. 1 and 2A-2Q will now be discussed together. It should be noted that the order of the example blocks of the method 100 may vary without departing from the scope of this disclosure.

The example method 100 may begin executing at block 105. The method 100 may begin executing in response to any of a variety of causes or conditions, non-limiting examples of which are provided herein. For example, the method 100 may begin executing automatically in response to one or more signals received from one or more upstream and/or downstream manufacturing stations, in response to a signal from a central manufacturing line controller, upon arrival of components and/or manufacturing materials utilized during performance of the method 100, etc. Also for example, the method 100 may begin executing in response to an operator command to begin. Additionally for example, the method 100 may begin executing in response to receiving execution flow from any other method block (or step) discussed herein.

The example method 100 may, at block 110, comprise receiving, fabricating, and/or preparing a plurality of functional die. Block 110 may comprise receiving, fabricating, and/or preparing a plurality of functional die in any of a variety of manners, non-limiting examples of which are provided herein. For example, block 110 may share any or all characteristics with any of the functional die receiving, fabricating, and/or preparing operations discussed herein. Various example aspects of block 110 are presented at FIG. 2A.

Block 110 may, for example, comprise receiving the plurality of functional die (or any portion thereof) from an upstream manufacturing process at a same facility or geographical location. Block 110 may also, for example, comprise receiving the functional die (or any portion thereof) from a supplier (e.g., from a foundry, etc.).

The received, fabricated, and/or prepared functional die may comprise any of a variety of characteristics. For example, though not shown, the received die may comprise a plurality of different die on a same wafer (e.g., a Multi-Project Wafer (MPW)). An example of such a configuration is shown at example 210A of FIG. 2A of U.S. patent application Ser. No. 15/594,313, which is hereby incorporated herein by reference in its entirety for all purposes. In such an MPW configuration, a wafer may include a plurality of different types of functional dies. For example, a first die may comprise a processor, and a second die may comprise a memory chip. Also for example, a first die may comprise a processor, and a second die may comprise a co-processor. Additionally for example, a first die and second die may both comprise memory chips. In general, the die may comprise active semiconductor circuitry. Though the various examples presented herein generally place or attached singulated functional dies, such dies may also be connected to each other prior to placement (e.g., as part of a same semiconductor wafer, as part of a reconstituted wafer, etc.).

Block 110 may, for example, comprise receiving the functional dies in one or more respective wafers dedicated to single types of dies. For example, as shown at FIG. 2A, the example 200A-1 shows a wafer dedicated to an entire wafer of Die 1, an example die of which is shown at label 211, and the example wafer 200A-3 shows a wafer dedicated to an entire wafer of Die 2, an example die of which is shown at label 212. It should be understood that, although various examples shown herein generally relate to first and second functional dies (e.g., Die 1 and Die 2), the scope of this disclosure extends to any number of functional dies (e.g., three die, four die, etc.) of the same or different types. The scope of this disclosure also extends to passive electronic components (e.g., resistors, capacitors, inductors, etc.), for example in addition to or instead of functional semiconductor dies.

The functional die 211 and 212 may comprise die interconnection structures. For example, the first functional die 211, as shown in FIG. 2A, comprises a first set of one or more die interconnection structures 213, and a second set of one or more die interconnection structures 214. Similarly, the second functional die 212 may comprise such structures. The die interconnection structures 213 and 214 may comprise any of a variety of die interconnection structure characteristics, non-limiting examples of which are provided herein.

The first die interconnection structures 213 may, for example, comprise metal (e.g., copper, aluminum, etc.) pillars or lands. The first die interconnection structures 213 may also, for example, comprise conductive bumps (e.g., C4 bumps, etc.) or balls, wires, pillars, etc.

The first die interconnection structures 213 may be formed in any of a variety of manners. For example, the first die interconnection structures 213 may be plated on die pads of the functional die 211. Also for example, the first die interconnection structures 213 may be printed and reflowed, wire bonded, etc. Note that in some example implementations, the first die interconnection structures 213 may be die pads of the first functional die 211.

The first die interconnection structures 213 may, for example, be capped. For example, the first die interconnection structures 213 may be solder-capped. Also for example, the first die interconnection structures 213 may be capped with a metal layer (e.g., a metal layer other than solder that forms a substitutional solid solution or intermetallic compounds with copper). For example, the first die interconnection structures 213 may be formed and/or connected as explained in U.S. patent application Ser. No. 14/963,037, filed on Dec. 8, 2015, and titled "Transient Interface Gradient Bonding for Metal Bonds," the entire content of which is hereby incorporated herein by reference. Additionally for example, the first die interconnection structures 213 may be formed and/or connected as explained in U.S. patent application Ser. No. 14/989,455, filed on Jan. 6, 2016, and titled "Semiconductor Product with Interlocking Metal-to-Metal Bonds and Method for Manufacturing Thereof," the entire content of which is hereby incorporated herein by reference.

The first die interconnection structures 213 may, for example, comprise any of a variety of dimensional characteristics. For example, in an example implementation, the first die interconnection structures 213 may comprise a pitch (e.g., a center-to-center spacing) of 30 microns and a diameter (or width, minor or major axis width, etc.) of 17.5 microns. Also for example, in an example implementation, the first die interconnection structures 213 may comprise a pitch in the 20-40 (or 30-40) micron range and a diameter (or width, minor or major axis width, etc.) in the 10-25 micron range. The first die interconnection structures 213 may, for example, be 15-20 microns tall.

The second die interconnection structures 214 may, for example, share any or all characteristics with the first die interconnection structures 213. Some or all of the second die interconnection structures 214 may, for example, be substantially different from the first die interconnection structures 213.

The second die interconnection structures 214 may, for example, comprise metal (e.g., copper, aluminum, etc.) pillars or lands. The second die interconnection structures 214 may also, for example, comprise conductive bumps (e.g., C4 bumps, etc.) or balls, wires, etc. The second die interconnection structures 214 may, for example, be the same general type of interconnection structure as the first die interconnection structures 213, but need not be. For example, both the first die interconnection structures 213 and the second die interconnection structures 214 may comprise copper pillars. Also for example, the first die interconnection structures 213 may comprise metal lands, and the second die interconnection structures 214 may comprise copper pillars.

The second die interconnection structures 214 may be formed in any of a variety of manners. For example, the second die interconnection structures 214 may be plated on die pads of the functional die 211. Also for example, the second die interconnection structures 214 may be printed and reflowed, wire bonded, etc. The second die interconnection structures 214 may be formed in a same process step as the first die interconnection structures 213, but such die interconnection structures 213 and 214 may also be formed in separate respective steps and/or in overlapping steps.

For example, in a first example scenario, a first portion of each of the second die interconnection structures 214 (e.g., a first half, a first third, etc.) may be formed in a same first plating operation as the first die interconnection structures 213. Continuing the first example scenario, a second portion of each of the second die interconnection structures 214 (e.g., a second half, a remaining two thirds, etc.) may then be formed in a second plating operation. For example, during the second plating operation, the first die interconnection structures 213 may be inhibited from additional plating (e.g., by a dielectric or protective mask layer formed thereon, by removal of an electroplating signals, etc.). In another example scenario, the second die interconnection structures 214 may be formed in a second plating process that is completely independent of a first plating process utilized for formation of the first die interconnection structures 213, which may for example be covered by a protective mask layer during the second plating process.

The second die interconnection structures 214 may, for example, be non-capped. For example, the second die interconnection structures 214 might not be solder-capped. In an example scenario, the first die interconnection structures 213 may be capped (e.g., solder-capped, metal layer capped, etc.) while the second die interconnection structures 214 are not capped. In another example scenario, none of the first die interconnection structures 213 and the second die interconnection structures 214 are capped.

The second die interconnection structures 214 may, for example, comprise any of a variety of dimensional characteristics. For example, in an example implementation, the second die interconnection structures 214 may comprise a pitch (e.g., a center-to-center spacing) of 80 microns and a diameter (or width) of 25 microns or more. Also for example, in an example implementation, the second die interconnection structures 214 may comprise a pitch in the 50-80 micron range and a diameter (or width, minor or major axis width, etc.) in the 20-30 micron range. Additionally for example, in an example implementation, the second die interconnection structures 214 may comprise a pitch in the 80-150 (or 100-150) micron range and a diameter (or width, minor major axis width, etc.) in the 25-40 micron range. The second die interconnection structures 214 may, for example, be 40-80 microns tall.

It should be noted that the functional dies (e.g., in wafer form, etc.) may be received already having one or more of the die interconnection structures 213/214 (or any portion thereof) formed thereon.

It should also be noted that the functional dies (e.g., in wafer form) may be thinned at this point from their original die thickness (e.g., by grinding, mechanical and/or chemical thinning, etc.), but need not be. For example, the functional die wafers (e.g., the wafers shown in examples 200A-1, 200A-2, 200A-3, and/or 200A-4) may be full thickness wafers. Also, for example, the functional die wafers (e.g., the wafers shown in examples 200A-1, 200A-2, 200A-3, 200A-4, etc.) may be at least partially thinned to reduce the thickness of the resulting package while still providing for safe handling of the wafers.

In general, block 110 may comprise receiving, fabricating, and/or preparing a plurality of functional die. Accordingly, the scope of this disclosure should not be limited by characteristics of any particular manner of such receiving and/or fabricating, nor by any particular characteristics of such functional die.

The example method 100 may, at block 115, comprise receiving, fabricating, and/or preparing connect die. Block 115 may comprise receiving and/or fabricating a plurality of connect die in any of a variety of manners, non-limiting examples of which are provided herein. Various example aspects of block 115 are presented in the examples 200B-1 to 200B-7 shown at FIGS. 2B-1 and 2B-2.

Block 115 may, for example, comprise receiving the plurality of connect die from an upstream manufacturing process at a same facility or geographical location. Block 115 may also, for example, comprise receiving the connect die from a supplier (e.g., from a foundry, etc.).

The received, fabricated, and/or prepared connect die may comprise any of a variety of characteristics. For example, the received, fabricated, and/or prepared die may comprise a plurality of connect die on a wafer (e.g., a silicon or other semiconductor wafer, a glass wafer or panel, a metal wafer or panel, etc.). For example, as shown at FIG. 2B-1, the example 200B-1 comprises an entire wafer of connect die, an example connect die of which is shown at label 216a. It should be understood that, although various examples shown herein generally relate to the utilization of a single connect die in a package, multiple connect die (e.g., of a same or different design) may be utilized in a single electronic device package. Non-limiting examples of such a configuration are provided herein.

In the examples (e.g., 200B-1 to 200B-4) shown herein, the connect dies may, for example, only include electrical routing circuitry (e.g., without active semiconductor components and/or passive components). Note, however, that the scope of this disclosure is not limited thereto. For example, the connect dies shown herein may comprise passive electronic components (e.g., resistors, capacitors, inductors, integrated passive devices (IPDs), etc.) and/or active electronic components (e.g., transistors, logic circuits, semiconductor processing components, semiconductor memory components, etc.) and/or optical components, etc.

The connect die may comprise connect die interconnection structures. For example, the example connect die 216a shown in FIG. 200B-1 comprises connect die interconnection structures 217. The connect die interconnection structures 217 may comprise any of a variety of interconnection structure characteristics, non-limiting examples of which are provided herein. Though this discussion will generally present all of the connect die interconnection structures 217 as being the same as each other, they may also be different from each other. For example, referring to FIG. 2B-1, the left portion of the connect die interconnection structures 217 may be the same as, or different from, the right portion of the connect die interconnection structures 217.

The connect die interconnection structures 217 and/or the formation thereof may share any or all characteristics with the first die interconnection structures 213 and/or the second die interconnection structures 214, and/or the formation thereof, discussed herein. In an example implementation, a first portion of the connect die interconnection structures 217 may comprise spacing, layout, shape, size, and/or material characteristics that provide for mating such first portion to respective first die interconnection structures 213 of a first functional die 211, and a second portion of the connect die interconnection structures 217 may comprise spacing, layout, shape, size, and/or material characteristics that provide for mating such second portion to respective first die interconnection structures 213 of a second functional die 212.

The connect die interconnection structures 217 may, for example, comprise metal (e.g., copper, aluminum, etc.) pillars or lands. The connect die interconnection structures 217 may also, for example, comprise conductive bumps (e.g., C4 bumps, etc.) or balls, wires, pillars, etc.

The connect die interconnection structures 217 may be formed in any of a variety of manners. For example, the connect die interconnection structures 217 may be plated on die pads of the connect die 216a. Also for example, the connect die interconnection structures 217 may be printed and reflowed, wire bonded, etc. Note that in some example implementations, the connect die interconnection structures 217 may be die pads of the connect die 216a.

The connect die interconnection structures 217 may, for example, be capped. For example, the connect die interconnection structures 217 may be solder-capped. Also for example, the connect die interconnection structures 217 may be capped with a metal layer (e.g., a metal layer that forms a substitutional solid solution or intermetallic compounds with copper). For example, the connect die interconnection structures 217 may be formed and/or connected as explained in U.S. patent application Ser. No. 14/963,037, filed on Dec. 8, 2015, and titled "Transient Interface Gradient Bonding for Metal Bonds," the entire content of which is hereby incorporated herein by reference. Additionally for example, the connect die interconnection structures 217 may be formed and/or connected as explained in U.S. patent application Ser. No. 14/989,455, filed on Jan. 6, 2016, and titled "Semiconductor Product with Interlocking Metal-to-Metal Bonds and Method for Manufacturing Thereof," the entire content of which is hereby incorporated herein by reference.

The connect die interconnection structures 217 may, for example, comprise any of a variety of dimensional characteristics. For example, in an example implementation, the connect die interconnection structures 217 may comprise a pitch (e.g., a center-to-center spacing) of 30 microns and a diameter (or width, minor or major axis width, etc.) of 17.5 microns. Also for example, in an example implementation, the connect die interconnection structures 217 may comprise a pitch in the 20-40 (or 30-40) micron range and a diameter (or width, minor or major axis width, etc.) in the 10-25 micron range. The connect die interconnection structures 217 may, for example, be 15-20 microns tall.

In an example scenario, the connect die interconnection structures 217 may comprise copper pillars that mate with respective first die interconnection structures 213 (e.g., metal lands, conductive bumps, copper pillars, etc.) of a first functional die 211 and a second functional die 212.

The connect die 216a (or a wafer 200B-1 thereof) may be formed in any of a variety of manners, non-limiting examples of which are discussed herein. For example, referring to FIG. 2B-1, a connect die 216a (e.g., shown in example 200B-3), or a wafer thereof (e.g., shown in example 200B-1), may for example comprise a support layer 290a (e.g., a silicon or other semiconductor layer, a glass layer, a metal layer, a plastic layer, etc.). A redistribution (RD) structure 298 may be formed on the support layer 290. The RD structure 298 may, for example, comprise a base dielectric layer 291, a first dielectric layer 293, first conductive traces 292, a second dielectric layer 296, second conductive traces 295, and connect die interconnection structures 217.

The base dielectric layer 291 may, for example, be on the support layer 290. The base dielectric layer 291 may, for example, comprise an oxide layer, a nitride layer, any of a variety of inorganic dielectric materials, etc. The base dielectric layer 291 may, for example, be formed to specification and/or may be native. The base dielectric layer 291 may be referred to as a passivation layer. The base dielectric layer 291 may be or comprise, for example, a silicon dioxide layer formed using a low pressure chemical vapor deposition (LPCVD) process. In other example implementations, the base dielectric layer 291 may be formed of any of a variety of organic dielectric materials, many examples of which are provided herein.

The connect die 216a (e.g., shown in example 200B-3), or wafer thereof (e.g., shown in example 200B-1), may also for example comprise first conductive traces 292 and a first dielectric layer 293. The first conductive traces 292 may, for example, comprise deposited conductive metal (e.g., copper, aluminum, tungsten, etc.). The first conductive traces 292 may, for example, be formed by sputtering, electro-plating, electroless plating, etc. The first conductive traces 292 may, for example, be formed at a sub-micron or sub-two-micron pitch (or center-to-center spacing). The first dielectric layer 293 may, for example, comprise an inorganic dielectric material (e.g., silicon oxide, silicon nitride, etc.). Note that in various implementations, the first dielectric layer 293 may be formed prior to the first conductive traces 292, for example formed with apertures which are then filled with the first conductive traces 292 or a portion thereof. In an example implementation, for example comprising copper conductive traces, a dual damascene process may be utilized to deposit the traces.

In an alternative assembly, the first dielectric layer 293 may comprise an organic dielectric material. For example, the first dielectric layer 293 may comprise bismaleimidetriazine (BT), phenolic resin, polyimide (PI), benzo cyclo butene (BCB), poly benz oxazole (PBO), epoxy and equivalents thereof and compounds thereof, but aspects of the present disclosure are not limited thereto. The organic dielectric material may be formed in any of a variety of manners, for example chemical vapor deposition (CVD). In such an alternative assembly, the first conductive traces 292 may, for example, be at a 2-5 micron pitch (or center-to-center spacing).

The connect die 216a (e.g., shown in example 200B-3), or wafer 200B-1 thereof (e.g., shown in example 200B-1), may also for example comprise second conductive traces 295 and a second dielectric layer 296. The second conductive traces 295 may, for example, comprise deposited conductive metal (e.g., copper, etc.). The second conductive traces 295 may, for example, be connected to respective first conductive traces 292 through respective conductive vias 294 or apertures (e.g., in the first dielectric layer 293). The second dielectric layer 296 may, for example, comprise an inorganic dielectric material (e.g., silicon oxide, silicon nitride, etc.). In an alternative assembly, the second dielectric layer 296 may comprise an organic dielectric material. For example, the second dielectric layer 296 may comprise bismaleimidetriazine (BT), phenolic resin, polyimide (PI), benzo cyclo butene (BCB), poly benz oxazole (PBO), epoxy and equivalents thereof and compounds thereof, but aspects of the present disclosure are not limited thereto. The second dielectric layer 296 may, for example, be formed using a CVD process, but the scope of this disclosure is not limited thereto. Note that the various dielectric layers (e.g., the first dielectric layer 293, second dielectric layer 296, etc.) may be formed of identical dielectric material and/or formed using identical processes, but this is not required. For example, the first dielectric layer 293 may be formed of any of the inorganic dielectric materials discussed herein, the second dielectric layer 296 may be formed of any of the organic dielectric materials discussed herein, and vice versa.

Though two sets of dielectric layers and conductive traces are illustrated in FIG. 2B-1, it should be understood that the RD structure 298 of the connect die 216a (e.g., shown in example 200B-3), or wafer thereof (e.g., shown in example 200B-1), may comprise any number of such layers and traces. For example, the RD structure 298 might comprise only one dielectric layer and/or set of conductive traces, three sets of dielectric layers and/or conductive traces, etc.

The connect die interconnection structures 217 (e.g., conductive bumps, conductive balls, conductive pillars or posts, conductive lands or pads, etc.) may be formed on a surface of the RD structure 298. Examples of such connect die interconnection structures 217 are shown in FIGS. 2B-1 and 2B-2, in which connect die interconnection structures 217 are shown formed on the front (or top) side of the RD structure 298 and electrically connected to respective second conductive traces 295 through conductive vias in the second dielectric layer 296. Such connect die interconnection structures 217 may, for example, be utilized to couple the RD structure 298 to various electronic components (e.g., active semiconductor components or die, passive components, etc.), including for example the first functional die 211 and second function die 212 discussed herein.

The connect die interconnection structures 217 may, for example, comprise any of a variety of conductive materials (e.g., any one of or a combination of copper, nickel, gold, etc.). The connect die interconnection structures 217 may also, for example, comprise solder. Also for example, the connect die interconnection structures 217 may comprise solder balls or bumps, multi-ball solder columns, elongated solder balls, metal (e.g., copper) core balls with a layer of solder over a metal core, plated pillar structures (e.g., copper pillars, etc.), wire structures (e.g., wire bonding wires), etc.

Referring to FIG. 2B-1, the example 200B-1 showing a wafer of connect die 216a may be thinned, for example to produce the thin connect die wafer of thin connect die 216b as shown at example 200B-2. For example, the thin connect die wafer (e.g., as shown in example 200B-2) may be thinned (e.g., by grinding, chemical and/or mechanical thinning, etc.) to an extent that still allows for safe handling of the thin connect die wafer and/or individual thin connect die 216b thereof, yet provides for a low profile. For example, referring to FIG. 2B-1, in an example implementation in which the support layer 290 comprises silicon, the thin connect die 216b may still comprise at least a portion of the silicon support layer 290. For example, the bottom side (or back side) of the thin connect die 216b may comprise enough of the non-conductive support layer 290, base dielectric layer 291, etc., to prohibit conductive access at the bottom side of the remaining support layer 290 to the conductive layers at the top side. In other examples, thin connect die 216b may be thinned to substantially or completely remove support layer 290. In such examples, conductive access at the bottom side of connect die 216b may still be blocked by base dielectric 291.

For example, in an example implementation, the thin connect die wafer (e.g., as shown at example 200B-2), or thin connect die 216b thereof, may have a thickness of 50 microns or less. In another example implementation, the thin connect die wafer (or thin connect die 216b thereof) may have a thickness in a range from 20 to 40 microns. As will be discussed herein the thickness of the thin connect die 216b may be smaller than the length of the second die interconnection structures 214 of the first die 211 and the second die 212, for example so that the thin connect die 216b can fit between the carrier and the functional dies 211 and 212.

Two example connect die implementations, labeled "Connect Die Example 1" and "Connect Die Example 2" are shown at 200B-5 of FIG. 2B-2. Connect Die Example 1 may, for example, utilize inorganic dielectric layers (and/or a combination of inorganic and organic dielectric layers) in the RD structure 298 and a semiconductor support layer 290. Connect Die Example 1 may, for example, be produced utilizing Amkor Technology's Silicon-Less Integrated Module (SLIM™) technology. The semiconductor support layer may for example be 30-100 um (e.g., 70 um) thick, and each level (or sublayer or layer) of the RD structure (e.g., including at least a dielectric layer and a conductive layer) may for example be 1-3 um (e.g., 3 um, 5 um, etc.) thick. The total thickness of the example resulting structure may, for example, range from 33-109 um (e.g., <80 um, etc.). Note that the scope of this disclosure is not limited to any particular dimensions.

Connect Die Example 2 may, for example, utilize organic dielectric layers (and/or a combination of inorganic and organic dielectric layers) in the RD structure 298 and a semiconductor support layer 290. Connect Die Example 2 may, for example, be produced utilizing Amkor Technology's Silicon Wafer Integrated Fan-out (SWIFT™) technology. The semiconductor support layer may for example be 30-100 um (e.g., 70 um) thick, and each level (or sub-layer or layer) of the RD structure (e.g., including at least a dielectric layer and a conductive layer) may for example be 4-7 urn thick, 10 urn thick, etc. The total thickness of the example resulting structure may, for example, range from 41-121 urn (e.g., <80 urn, 100 urn, 110 urn etc.). Note that the scope of this disclosure is not limited to any particular dimensions. Note also that in various example implementations, the support layer 290 of the Connect Die Example 2 can be thinned (e.g., relative to the Connect Die Example 1) to result in a same or similar overall thickness.

The example implementations presented herein generally concern one-sided connect dies that may, for example, have interconnection structures on only one side. It should be noted, however, that the scope of this disclosure is not limited to such one-sided structures. For example, as shown at examples 200B-6 and 200B-7, the connect die 216c may comprise interconnection structures on both sides. Example implementations of such a connect die 216c (e.g., as shown at example 200B-7), which may also be referred to as a two-sided connect die, and wafer thereof (e.g., as shown at example 200B-6), are shown at FIG. 2B-2. The example wafer (e.g., of example 200B-6) may, for example, share any or all characteristics with the example wafers (e.g., of examples 200B-1 and/or 200B-2) shown in FIG. 2B and discussed herein. Also for example, the example connect die 216c may share any or all characteristics with the example connect die 216a and/or 216b shown in FIG. 2B-1 and discussed herein. For example, the connect die interconnection structures 217b may share any or all characteristics with the connect die interconnection structures 217 shown in FIG. 2B-1 and discussed herein. Also for example, any or all of the redistribution (RD) structure 298b, base dielectric layer 291b, first conductive traces 292b, first dielectric layer 293b, conductive vias 294b, second conductive traces 295b, and second dielectric layer 296b, may share any or all characteristics with the redistribution (RD) structure 298, base dielectric layer 291, first conductive traces 292, first dielectric layer 293, conductive vias 294, second conductive traces 295, and second dielectric layer 296 shown in FIG. 2B-1 and discussed herein, respectively. The example connect die 216c also includes a second set of connect die interconnection structures 299 received and/or fabricated on the side of the connect die 216c opposite the connect die interconnection structures 217b. Such second connect die interconnection structures 299 may share any or all characteristics with the connect die interconnection structures 217. In an example implementation, the second connect die interconnection structures 299 may be formed first as the RD structure 298b is build up on a support structure (e.g., like the support structure 290), which is then removed or thinned or planarized (e.g., by grinding, peeling, stripping, etching, etc.).

Similarly, any or all of the example methods and structures shown in U.S. patent application Ser. No. 15/594,313, which is hereby incorporated herein in its entirety by reference, may be performed with any of such connect die 216a, 216b, and/or 216c.

Note that one or more or all of the second connect die interconnection structures 299 may be isolated from other electrical circuitry of the connect die 216c, which may also be referred to herein as dummy structures (e.g., dummy pillars, etc.), anchoring structures (e.g., anchoring pillars, etc.), etc. For example, any or all of the second connect die interconnection structures 299 might be formed solely for anchoring the connect die 216c to the carrier or RD structure or metal pattern at a later step. Note also that one or more or all of the second connect die interconnection structures 299 may be electrically connected to electrical traces, which may for example connect to electronic device circuitry of die attached to the connect die 216c. Such structures may, for example, be referred to as active structures (e.g., active pillars, etc.), etc.

In general, block 115 may comprise receiving, fabricating, and/or preparing connect die. Accordingly, the scope of this disclosure should not be limited by characteristics of any particular manner of such receiving, fabricating, and/or preparing or by any particular characteristics of such connect die.

The example method 100 may, at block 120, comprise receiving, fabricating, and/or preparing a first carrier. Block 120 may comprise receiving, fabricating, and/or preparing a carrier in any of a variety of manners, non-limiting examples of which are provided herein. For example, block 120 may, for example, share any or all characteristics with other carrier receiving, fabricating, and/or preparing steps discussed herein. Various example aspects of block 120 are presented at example 200C of FIG. 2C.

Block 120 may, for example, comprise receiving the carrier from an upstream manufacturing process at a same facility or geographical location. Block 120 may also, for example, comprise receiving the carrier from a supplier (e.g., from a foundry, etc.).

The received, fabricated, and/or prepared carrier 221 may comprise any of a variety of characteristics. For example, the carrier 221 may comprise a semiconductor wafer or panel (e.g., a typical semiconductor wafer, a low-grade semiconductor wafer utilizing lower grade silicon than used for the functional die discussed herein, etc.). Also for example, the carrier 221 may comprise metal, glass, plastic, etc. The carrier 221 may, for example, be reusable or destructible (e.g., single-use, multi-use, etc.)

The carrier 221 may comprise any of a variety of shapes. For example, the carrier may be wafer shaped (e.g., circular, etc.) may be panel-shaped (e.g., square-shaped, rectangular-shaped, etc.), etc. The carrier 221 may have any of a variety of lateral dimensions and/or thicknesses. For example, the carrier 221 may have the same or similar lateral dimensions and/or thicknesses of a wafer of the functional die and/or connect die discussed herein. Also for example, the carrier 221 may have the same or similar thickness as a wafer of the functional die and/or connect die discussed herein. The scope of this disclosure is not limited by any particular carrier characteristics (e.g., material, shape, dimensions, etc.).

Figure 2C:
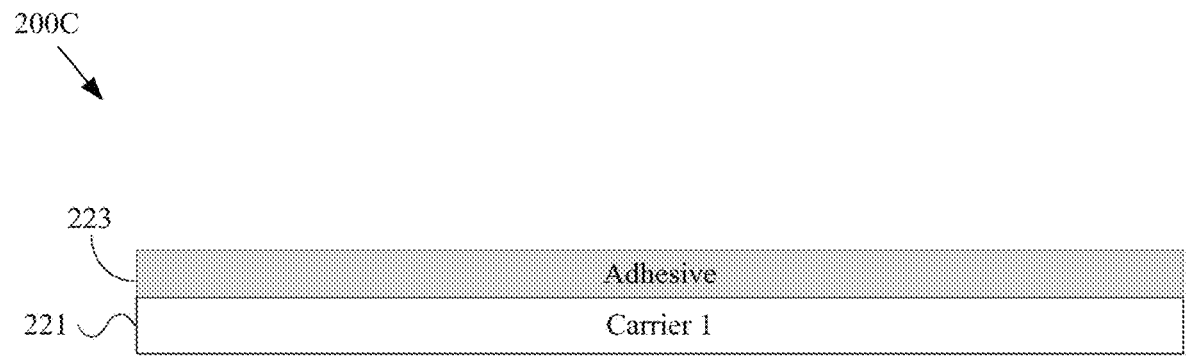

The example 200C shown at FIG. 2C comprises a layer of adhesive material 223. The adhesive material 223 may comprise any of a variety of types of adhesives. For example, the adhesive may be a liquid, paste, tape, etc.

The adhesive 223 may comprise any of a variety of dimensions. For example, the adhesive 223 may cover the entirety of a top side of the first carrier 221. Also for example, the adhesive may cover a central portion of a top side of the first carrier 221, while leaving peripheral edges of the top side of the first carrier 221 uncovered. Also for example, the adhesive may cover respective portions of the top side of the first carrier 221 that positionally correspond to future positions of the functional die of a single electronic package.

The adhesive 223 may have a thickness that is greater than a height of the second die interconnection structures 214, and thus also greater than a height of the first die interconnection structures 213 (e.g., 5% greater, 10% greater, 20% greater, etc.).

The example carrier 221 may share any or all characteristics with any carrier discussed herein. For example, and without limitation, the carrier may be free of signal distribution layers, but may also comprise one or more signal distribution layers. An example of such structure and the formation thereof is illustrated in the example 600A of FIG. 6A and discussed herein.

In general, block 120 may comprise receiving, fabricating, and/or preparing a carrier. Accordingly, the scope of this disclosure should not be limited by characteristics of any particular condition in which the carrier is received, of any particular manner of fabricating the carrier, and/or of any particular manner of preparing such a carrier for use.

Figure 2D:
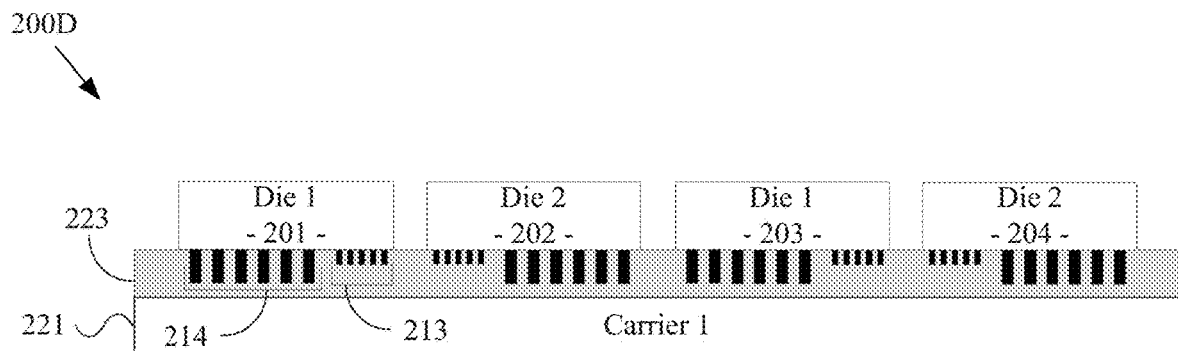

The example method 100 may, at block 125, comprise coupling (or mounting) functional die to the carrier (e.g., to the top side of a non-conductive carrier, to a metal pattern on the top side of the carrier, to an RD structure on a top side of the carrier, etc.). Block 125 may comprise performing such coupling in any of a variety of manners, non-limiting examples of which are provided herein. For example, block 125 may, for example, share any or all characteristics with other die-mounting steps discussed herein Various example aspects of block 125 are presented in the example 200D shown at FIG. 2D.

The functional die 201-204 (e.g., any of the functional die 211 and 212) may, for example, be received as individual die. Also for example, one or more of the functional die 201-204 may be received on a single wafer, one or more of the functional die 201-204 may be received on multiple respective wafers (e.g., as shown at example 200A-1 and 200A-3, etc.), etc. In a scenario in which one or both of the functional die are received in wafer form, the functional die may be singulated from the wafer. Note that if any of the functional die 201-204 are received on a single MPW, such functional die may be singulated from the wafer as an attached set (e.g., connected with bulk silicon).

Block 125 may comprise placing the functional die 201-204 in the adhesive layer 223. For example, the second die interconnection structures 214 and the first die interconnection structures 213 may be fully (or partially) inserted into the adhesive layer 223. As discussed herein, the adhesive layer 223 may be thicker than the height of the second die interconnection structures 214, such that when the bottom surface of the dies 201-204 contacts the top surface of the adhesive layer 223, the bottom ends of the second die interconnection structures 214 do not contact the carrier 221. In an alternative implementation, however, the adhesive layer 223 may be thinner than the height of the second die interconnection structures 214, but still thick enough to cover at least a portion of the first die interconnection structures 213 when the dies 201-204 are placed on the adhesive layer 223.

Block 125 may comprise placing the functional die 201-204 utilizing, for example, a die pick-and-place machine.

It should be noted that although the illustrations herein generally present the functional die 201-204 (and interconnection structures thereof) as being similarly sized and shaped, such symmetry is not required. For example, the functional die 201-204 may be of different respective shapes and sizes, may have different types and/or numbers of interconnection structures, etc. It should also be noted that the functional die 201-204 (or any so-called functional die discussed herein) may be semiconductor die, but may also be any of a variety of electronic components, for example passive electronic components, active electronic components, bare dies, packaged dies, etc. Thus, the scope of this disclosure should not be limited by characteristics of the functional die 201-204 (or any so-called functional die discussed herein).

In general, block 125 may comprise coupling (or mounting) functional die to the carrier. Accordingly, the scope of this disclosure should not be limited by characteristics of any particular manner of performing such coupling or by any particular characteristics of such functional die, interconnection structures, carrier, attachment means, etc.

The example method 100 may, at block 130, comprise encapsulating. Block 130 may comprise performing such encapsulating in any of a variety of manners, non-limiting examples of which are provided herein. Various example aspects of block 130 are presented in the example 200E shown at FIG. 2E. Block 130 may, for example, share any or all characteristics with other encapsulating discussed herein.

Block 130 may, for example, comprise performing a wafer (or panel) level molding process. As discussed herein, prior to singulating individual modules, any or all of the process steps discussed herein may be performed at the panel or wafer level. Referring to the example implementation 200E shown at FIG. 2E, the encapsulating material 226' may cover a top side of the adhesive 223, top sides of the functional die 201-204, at least portions (or all) of lateral side surfaces of the functional die 201-204, etc. The encapsulating material 226' may also, for example, cover any portion of the second die interconnection structures 214, first die interconnection structures 213, and bottom surface of the functional die 201-204 that are exposed from the 223 (if any of such components are exposed).

The encapsulating material 226' may comprise any of a variety of types of encapsulating material, for example molding material, any of the dielectric materials presented herein, etc.

Figure 2E:
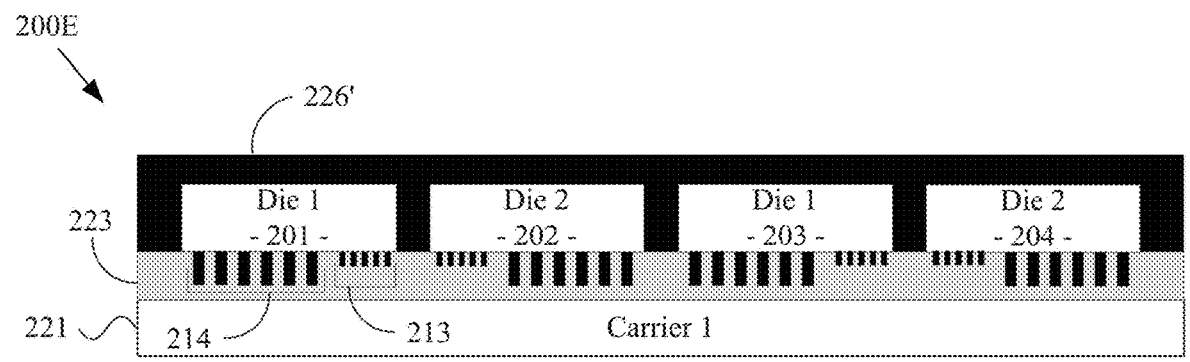
Figure 2F:
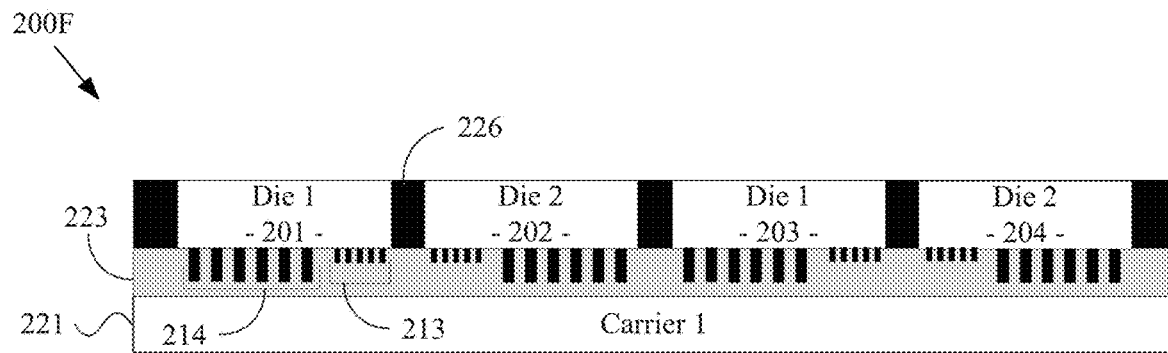

Though the encapsulating material 226' (as shown in FIG. 2E) is shown covering the top sides of the functional die 201-204, any or all of such top sides (or any respective portions of such top sides) may be exposed from the encapsulating material 226 (as shown in FIG. 2F). Block 130 may, for example, comprise originally forming the encapsulating material 226 with the die top sides exposed (e.g., utilizing a film assisted molding technique, die-seal molding technique, etc.), forming the encapsulating material 226' followed by a thinning process (e.g., performed at block 135) to thin the encapsulating material 226' enough to expose the top sides of any or all of the functional dies 201-204, forming the encapsulating material 226' followed by a thinning process (e.g., performed at block 135) to thin the encapsulating material but still leave a portion of the encapsulating material 226' to cover the top sides (or any respective portion thereof) of any or all of the functional dies 201-204, etc.

In general, block 130 may comprise encapsulating. Accordingly, the scope of this disclosure should not be limited by characteristics of any particular manner of performing such encapsulating or of any particular type of encapsulating material or configuration thereof.

The example method 100 may, at block 135, comprise grinding the encapsulating material. Block 135 may comprise performing such grinding (or any thinning or planarizing) in any of a variety of manners, non-limiting examples of which are provided herein. Block 135 may, for example, share any or all characteristics with other grinding (or thinning) blocks (or steps) discussed herein. Various example aspects of block 135 are presented in the example 200F shown at FIG. 2F.

As discussed herein, in various example implementations, the encapsulating material 226' may originally be formed to a thickness that is greater than ultimately desired. In such example implementations, block 135 may be performed to grind (or otherwise thin or planarize) the encapsulating material 226'. In the example 200F shown in FIG. 2F, the encapsulating material 226' has been ground to result in the encapsulating material 226. The top surface of the grinded (or thinned or planarized) encapsulating material 226 is coplanar with the top surfaces of the functional die 201-204, which are thus exposed from the encapsulating material 226. Note that in various example implementations, one of more of the functional die 201-204 may be exposed and one or more of the functional die 201-204 may remain covered by the encapsulating material 226. Note that if performed, such grinding operation need not expose the top sides of the functional die 201-204.

In an example implementation, block 135 may comprise grinding (or thinning or planarizing) both the encapsulating material 226' and back sides of any or all of the functional die 201-204, thus providing for coplanarity of the top surfaces of the encapsulating material 226 and of one or more of the functional dies 201-204.

In general, block 135 may comprise grinding the encapsulating material. Accordingly, the scope of this disclosure should not be limited by characteristics of any particular manner of performing such grinding (or thinning or planarizing).

The example method 100 may, at block 140, comprise attaching a second carrier. Block 140 may comprise attaching the second carrier in any of a variety of manners, non-limiting examples of which are provided herein. For example, block 140 may share any or all characteristics with any carrier attaching discussed herein. Various example aspects of block 140 are shown at FIG. 2G.

Figure 2G:
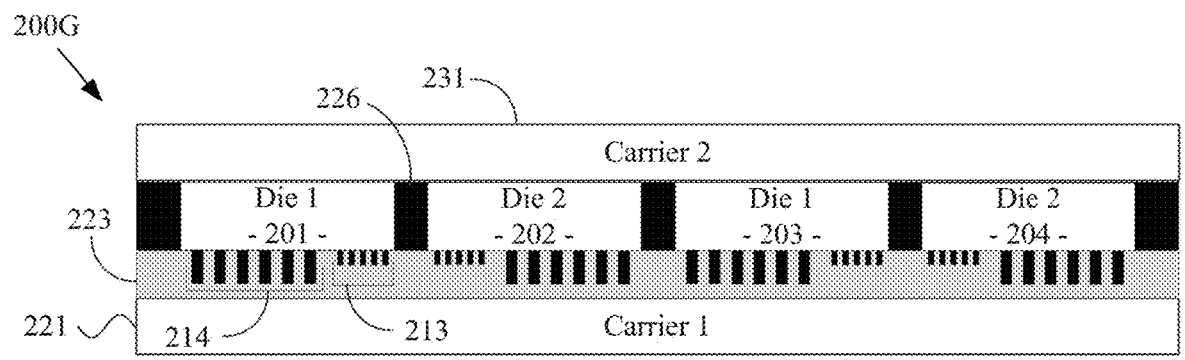

As shown in the example 200G of FIG. 2G, the second carrier 231 may be attached to the top sides of the encapsulating material 226 and/or top sides of the functional die 201-204. Note that the assembly may be still in a wafer (or panel) form at this point. The second carrier 231 may comprise any of a variety of characteristics. For example, the second carrier 231 may comprise a glass carrier, silicon (or semiconductor) carrier, metal carrier, plastic carrier, etc. Block 140 may comprise attaching (or coupling or mounting) the second carrier 231 in any of a variety of manners. For example, block 140 may comprise attaching the second carrier 231 using an adhesive, using a mechanical attachment mechanism, using vacuum attachment, etc.

In general, block 140 may comprise attaching a second carrier. Accordingly, the scope of this disclosure should not be limited by characteristics of any particular manner of attaching a carrier or by characteristics of any particular type of carrier.

The example method 100 may, at block 145, comprise removing the first carrier. Block 145 may comprise removing the first carrier in any of a variety of manners, non-limiting examples of which are provided herein. For example, block 145 may share any or all characteristics with any carrier-removal process discussed herein. Various example aspects of block 145 are presented in the example 200H shown at FIG. 2H.

Figure 2H:
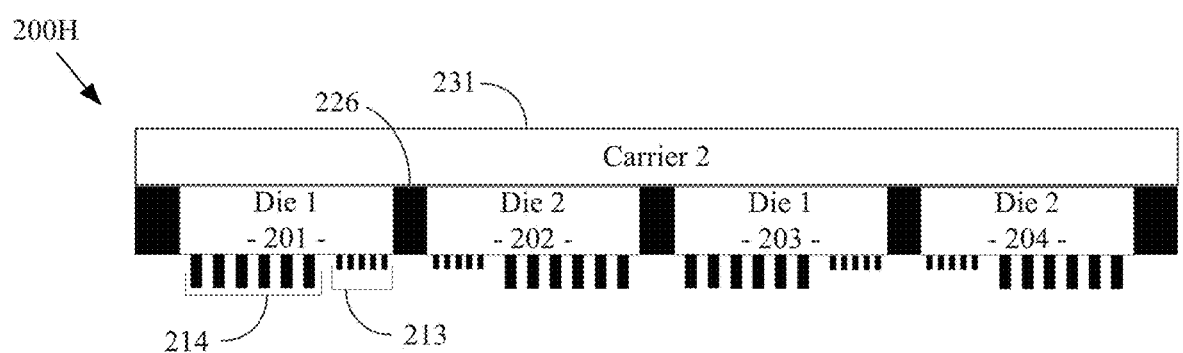

For example, the example 200H of FIG. 2H shows the first carrier 221 removed (e.g., in comparison with the example 200G of FIG. 2G). Block 145 may comprise performing such carrier removal in any of a variety of manners (e.g., grinding, etching, chemical-mechanical planarization, peeling, shearing, thermal or laser releasing, etc.).

Also for example, block 145 may comprise removing the adhesive layer 223 utilized at block 125 to couple the functional die 201-204 to the first carrier 221. Such adhesive layer 223 may, for example, be removed with the first carrier 221 in a single step or multi-step process. For example, in an example implementation, block 145 may comprise pulling the first carrier 221 from the functional die 201-204 and the encapsulating material 226, with the adhesive (or a portion thereof) being removed along with the first carrier 221. Also for example, block 145 may comprise utilizing solvents, thermal energy, light energy, or other cleaning techniques to remove the adhesive layer 223 (e.g., the entire adhesive layer 223 and/or any portion of the adhesive layer 223 that remains after removing the first carrier 221, etc.) from the functional die 201-204 (e.g., from a bottom surface of the functional die 201-204, from the first 213 and/or second 214 die interconnection structures, etc.) and the encapsulating material 226.

In general, block 145 may comprise removing the first carrier. Accordingly, the scope of this disclosure should not be limited by characteristics of any particular manner of removing a carrier or by characteristics of any particular type of carrier.

The example method 100 may, at block 150, comprise attaching (or coupling or mounting) connect die to the functional die. Block 150 may comprise performing such attaching in any of a variety of manners, non-limiting examples of which are provided herein. Block 150 may, for example, share any or all characteristics with any die attaching process discussed herein. Various example aspects of block 150 are presented at FIG. 2I.

For example, die interconnection structures 217 of the first connect die 216b (e.g., any or all of such connect die) may be mechanically and electrically connected to the respective first die interconnection structures 213 of the first functional die 201 and of the second functional die 202.

Such interconnection structures may be connected in any of a variety of manners. For example, the connection may be performed by soldering. In an example implementation, the first die interconnection structures 213 and/or the connect die interconnection structures 217 may comprise solder caps (or other solder structures) that may be reflowed to perform the connection. Such solder caps may, for example, be reflowed by mass reflow, thermal compression bonding (TCB), etc. In another example implementation, the connection may be performed by direct metal-to-metal (e.g., copper-to-copper, etc.) bonding, instead of utilizing solder. Examples of such connections are provided in U.S. patent application Ser. No. 14/963,037, filed on Dec. 8, 2015, and titled "Transient Interface Gradient Bonding for Metal Bonds," and U.S. patent application Ser. No. 14/989,455, filed on Jan. 6, 2016, and titled "Semiconductor Product with Interlocking Metal-to-Metal Bonds and Method for Manufacturing Thereof," the entire content of each of which is hereby incorporated herein by reference. Any of a variety of techniques may be utilized to attach the first die interconnection structures 213 to the connect die interconnection structures 217 (e.g., mass reflow, thermal-compression bonding (TCB), direct metal-to-metal intermetallic bonding, conductive adhesive, etc.).

As shown in the example 200I, first die interconnection structures 213 of the first connect die 201 are connected to respective connect die interconnection structures 217 of the connect die 216b, and first die interconnection structures 213 of the second connect die 202 are connected to respective connect die interconnection structures 217 of the connect die 216b. As connected, the connect die 216b provides an electrical connection between various die interconnection structures of the first functional die 201 and the second functional die 202 via the RD structures 298 (e.g., as shown in the example 200B-3 of FIG. 2B-1, etc.).

Figure 2I:
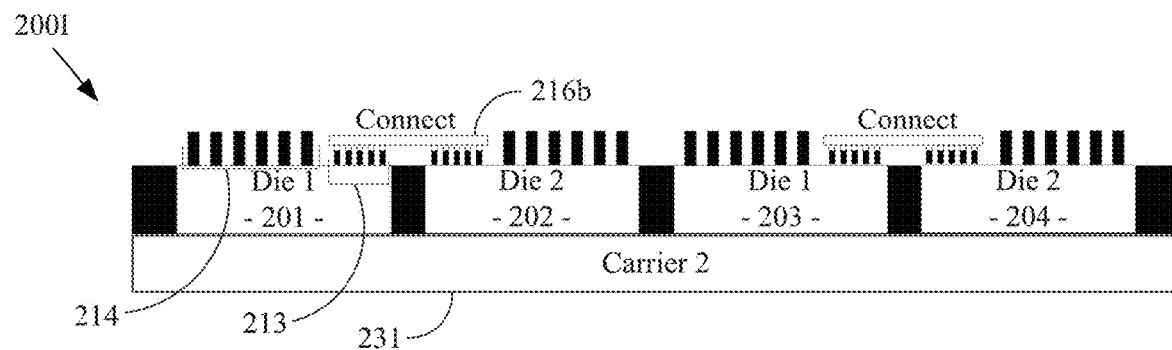

In the example 200I shown in FIG. 2I, the height of the second die interconnection structures 214 may, for example, be greater than (or equal to) the combined height of the first die interconnection structures 213, the connect die interconnection structures 217, the RD structure 298, and any support layer 290b of the connect die 216b. Such a height difference may, for example, provide room for a buffer material (e.g., underfill, etc.) between the connect die 216b and another substrate (e.g., as shown in the example 200N of FIG. 2N and discussed herein).

Note that although the example connect die (216b) are shown as one-sided connect die (e.g., like the example connect die 216b of FIG. 2B-1), the scope of this disclosure is not limited thereto. For example, any or all of such example connect die 216b may be two-sided (e.g., like the example connect die 216c of FIG. 2B-2).

In general, block 150 may comprise attaching (or coupling or mounting) connect die to the functional die. Accordingly, the scope of this disclosure should not be limited by characteristics of any particular manner of performing such attaching or by characteristics of any particular type of attaching structure.

The example method 100 may, at block 155, comprise underfilling the connect die. Block 155 may comprise performing such underfilling in any of a variety of manners, non-limiting examples of which are provided herein. Block 155 may, for example, share any or all characteristics with any underfilling process discussed herein. Various example aspects of block 155 are presented in the example 200J shown at FIG. 2J.

Note that underfill may be applied between the connect die 216b and the functional die 201-204. In a scenario in which pre-applied underfill (PUF) is utilized, such PUF may be applied to the functional die 201-204 and/or to the connect die 216b before the coupling of the connect die interconnection structures 217 to the first die interconnection structures 213 of the functional die 201-204 (e.g., at block 150).

Block 155 may comprise forming the underfill after the attachment performed at block 150 (e.g., a capillary underfill, etc.). As shown in the example implementation 200J of FIG. 2J, the underfill material 223 (e.g., any underfill material discussed herein, etc.) may completely or partially cover the bottom side of the connect die 216b (e.g., as oriented in FIG. 2J) and/or at least a portion (if not all) of lateral sides of the connect die 216b. The underfill material 223 may also, for example, surround the connect die interconnection structures 217, and surround the first die interconnection structures 213 of the functional die 201-204. The underfill material 223 may additionally, for example, cover the top sides of the functional die 201-204 (as oriented in FIG. 2J) in regions corresponding to the first die interconnection structures 213.

Note that in various example implementations of the example method 100, the underfilling performed at block 155 may be skipped. For example, underfilling the connect die may be performed at another block (e.g., at block 175, etc.). Also for example, such underfilling may be omitted entirely.

In general, block 155 may comprise underfilling the connect die. Accordingly, the scope of this disclosure should not be limited by characteristics of any particular manner of performing such underfilling or by characteristics of any particular type of underfilling.

The example method 100 may, at block 160, comprise removing the second carrier. Block 160 may comprise removing the second carrier in any of a variety of manners, non-limiting examples of which are provided herein. For example, block 160 may share any or all characteristics with any carrier removal processing discussed herein (e.g., with regard to block 145, etc.). Various example aspects of block 160 are presented by the example 200K shown in FIG. 2K.

Figure 2J:
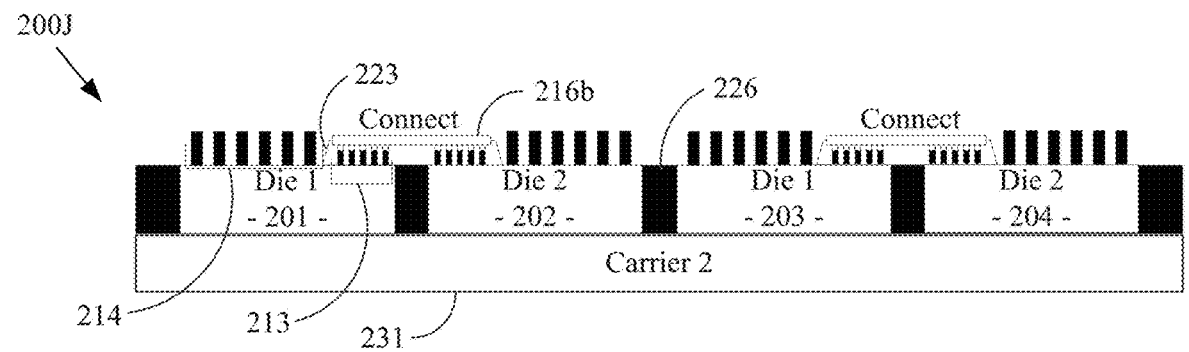
Figure 2K:
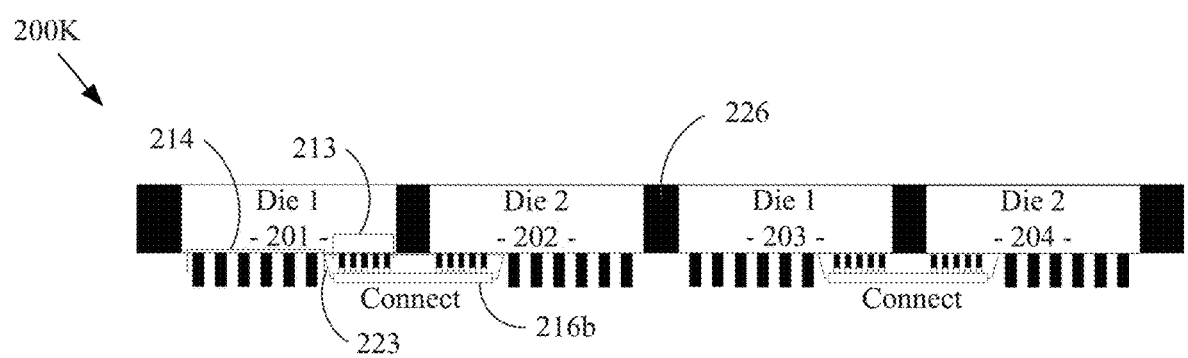

For example, the example implementation 200K shown in FIG. 2K does not include the second carrier 231 of the example implementation 200J shown in FIG. 2J. Note that such removal may, for example, comprise cleaning surfaces, removing adhesive if utilized, etc.

In general, block 160 may comprise removing the second carrier. Accordingly, the scope of this disclosure should not be limited by characteristics of any particular manner of performing such carrier removing or by characteristics of any particular type of carrier or carrier material being removed.

The example method 100 may, at block 165, comprise singulating. Block 165 may comprise performing such singulating in any of a variety of manners, non-limiting examples of which are discussed herein. Block 165 may, for example, share any or all characteristics with any singulating discussed herein. Various example aspects of block 165 are presented by the example 200L shown at FIG. 2L.

As discussed herein, the example assemblies shown herein may be formed on a wafer or panel that includes a plurality of such assemblies (or modules). For example, the example 200K shown in FIG. 2K has two assemblies (left and right) joined together by the encapsulating material 226. In such an example implementation, the wafer or panel may be singulated (or diced) to form individual assemblies (or modules). In the example 200L of FIG. 2L, the encapsulating material 226 is sawn (or cut, broken, snapped, diced, otherwise cut, etc.) into two encapsulating material portions 226a and 226b, each of which corresponds to a respective electronic device.

Figure 2L:
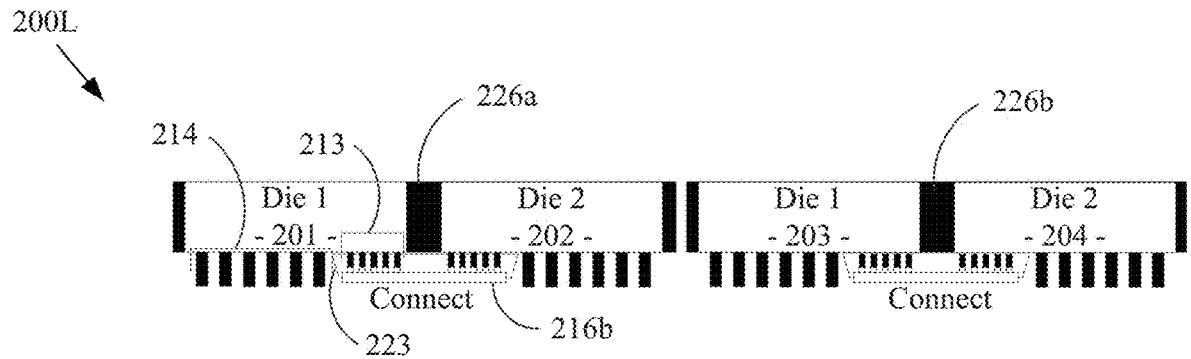

In the example implementation 200L shown in FIG. 2L, only the encapsulating material 226 need be cut. However, block 165 may comprise cutting any of a variety of materials, if present along a singulation street (or cut line). For example, block 165 may comprise cutting underfill material, carrier material, functional and/or connect die material, substrate material, etc.

In general, block 165 may comprise singulating. Accordingly, the scope of this disclosure should not be limited by any particular manner of singulating.

The example method 100 may, at block 170, comprise mounting to a substrate. Block 170 may, for example, comprise performing such attaching in any of a variety of manners, non-limiting examples of which are provided herein. For example, block 170 may share any or all characteristics with any of the mounting (or attaching) steps discussed herein (e.g., attaching interconnection structures, attaching die backsides, etc.). Various example aspects of block 170 are presented in the example 400M shown in FIG. 4M.

The substrate 288 may comprise any of a variety of characteristics, non-limiting examples of which are provided herein. For example, the substrate 288 may comprise a packaging substrate, an interposer, a mother board, printed wire board, functional semiconductor die, build-up redistribution structure of another device, etc. The substrate 288 may, for example, comprise a coreless substrate, an organic substrate, a ceramic substrate, etc. The substrate 288 may, for example, comprise one or more dielectric layers (e.g., organic and/or inorganic dielectric layers) and/or conductive layers formed on a semiconductor (e.g., silicon, etc.) substrate, a glass or metal substrate, a ceramic substrate, etc. The substrate 288 may, for example, share any or all characteristics with the RD structure 298 of FIG. 2B-1, the RD structure 298b of FIG. 2B-2, any RD structure discussed herein, etc. The substrate 288 may, for example, comprise an individual package substrate or may comprise a plurality of substrates coupled together (e.g., in a panel or wafer), which may be later singulated.

Figure 2M:
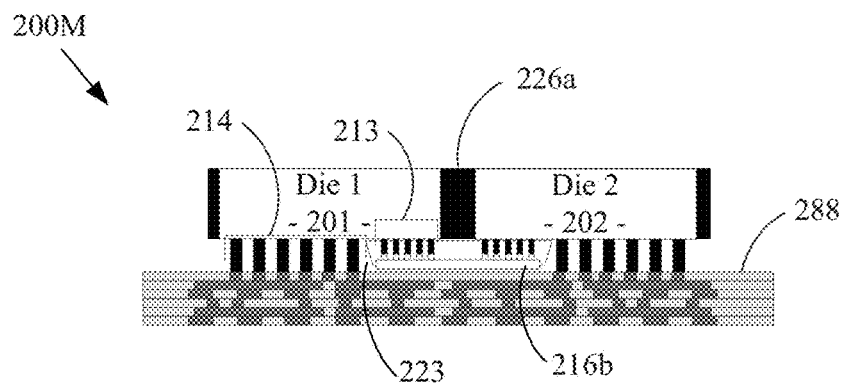

In the example 200M shown in FIG. 2M, block 170 may comprise soldering (e.g., utilizing mass reflow, thermal compression bonding, laser soldering, etc.) the second die interconnection structures 214 of the functional die 201-202 to respective pads (e.g., bond pads, traces, lands, etc.) or other interconnection structures (e.g., pillars, posts, balls, bumps, etc.) of the substrate 288.

Figure 2N:
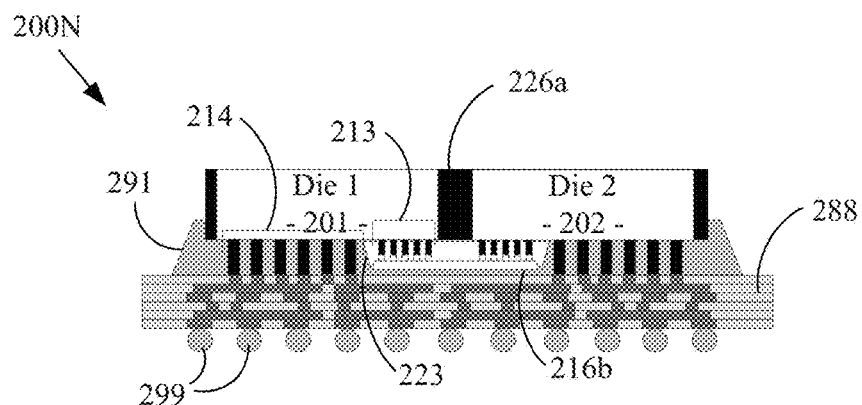

Note that in an example implementation in which the connect die 216b is a two-sided connect die like connect die 216c, block 170 may also comprise connecting the second set of connect die interconnection structures 299 to respective pads or other interconnection structures of the substrate 288. In the example 200M of FIG. 2M, however, the connect die 216b is a one-sided connect die. Note that, as discussed herein, since the second die interconnection structures 214 of the functional die 201-202 are taller than the combined height of the first die interconnection structures 213, the connect die interconnection structures 217, and the support layer 290b of the connect die 216b, there is a gap between the back side of the connect die 216b (lower side of the connect die 216b in FIG. 2M) and the top side of the substrate 288. As shown in FIG. 2N, this gap may be filled with an underfill.

In general, block 170 comprises mounting (or attaching or coupling) the assembly (or module) singulated at block 165 to a substrate. Accordingly, the scope of this disclosure should not be limited by characteristics of any particular type of mounting (or attaching) or of any particular mounting (or attaching) structure.

The example method 100 may, at block 175, comprise underfilling between the substrate and the assembly (or module) mounted thereto at block 170. Block 175 may comprise performing the underfilling in any of a variety of manners, non-limiting examples of which are provided herein. Block 175 may, for example, share any or all characteristics with any underfilling (or encapsulating) process discussed herein (e.g., with regard to block 155, etc.). Various aspects of block 175 are presented in the example 200N shown at FIG. 2N.

Block 175 may, for example, comprise performing a capillary or injected underfill process after the mounting performed at block 170. Also for example, in a scenario in which pre-applied underfill (PUF) is utilized, such PUF may be applied to the substrate, metal pattern of the substrate, and/or interconnection structures thereof before such mounting. Block 175 may also comprise performing such underfilling utilizing a molded underfilling process.

As shown in the example implementation 200N of FIG. 2N, the underfill material 291 (e.g., any underfill material discussed herein, etc.) may completely or partially cover the top side of the substrate 288. The underfill material 291 may also, for example, surround the second die interconnection structures 214 (and/or corresponding substrate pads) of the functional dies 201-202. The underfill material 291 may, for example, cover bottom sides of the functional dies 201-202, a bottom side of the connect die 216b, and a bottom side of the encapsulating material 226a. The underfill material 291 may also, for example, cover lateral side surfaces of the connect die 216b and/or exposed lateral surfaces of the underfill 223 between the connect die 216b and the functional die 201-202. The underfill material 291 may, for example, cover lateral side surfaces (e.g., all or a portion) of the encapsulating material 226a and/or the functional die 201-202.

In an example implementation in which the underfill 223 is not formed, the underfill material 291 may be formed instead of the underfill 223. For example, referring to the example 200N, the underfill material 223 may be replaced in the example 200N with more of the underfill material 291.

In an example implementation in which the underfill 223 is formed, the underfill material 291 may be a different type of underfill material than the underfill material 223. In another example implementation, both underfill materials 223 and 291 may be the same type of material.

As with block 155, block 175 may also be skipped, for example leaving space to be filled with another underfill (e.g., a molded underfill, etc.) at another block.

In general, block 175 comprises underfilling. Accordingly, the scope of this disclosure should not be limited by characteristics of any particular type of underfilling or of any particular underfill material.

The example method 100 may, at block 190, comprise performing continued processing. Such continued processing may comprise any of a variety of characteristics, non-limiting examples of which are provided herein. For example, block 190 may comprise returning execution flow of the example method 100 to any block thereof. Also for example, block 190 may comprise directing execution flow of the example method 100 to any other method block (or step) discussed herein (e.g., with regard to the example method 300 of FIG. 3, the example method 500 of FIG. 5, etc.).

For example, block 190 may comprise forming interconnection structures 299 (e.g., conductive balls, bumps, pillars, etc.) on the bottom side of the substrate 288.

Figure 2O:
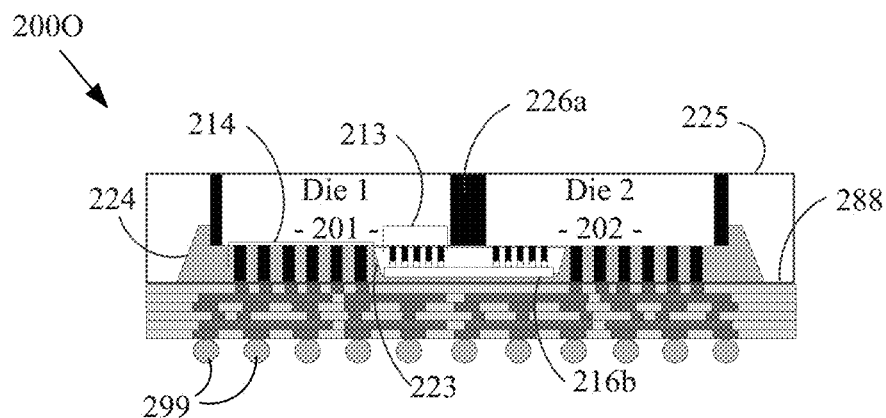

Also for example, as shown in the example 200O of FIG. 2O, block 190 may comprise forming an encapsulating material 225. Such an encapsulating material 225 may, for example, cover a top side of the substrate 288, lateral sides of the underfill 224, lateral sides of the encapsulating material 226a and/or lateral sides of the functional die 201-202. In the example 200O shown in FIG. 2O, a top side of the encapsulating material 225, a top side of the encapsulating material 226a, and/or top sides of the functional die 201-202 may be coplanar.

As discussed herein, the underfill 224 (e.g., as formed at block 175) might not be formed. In such case, the encapsulating material 225 may take its place as underfill. An example 200P of such structure and method is provided at FIG. 2P. Relative to the example implementation 200O shown in FIG. 2O, in the example implementation 200P, the underfill 224 of the example implementation 200O is replaced with the encapsulating material 225 as underfill.

As discussed herein, the underfill 223 (e.g., as formed at block 155) and the underfill 224 might not be formed. In such case, the encapsulating material 225 may take their place. An example implementation 200Q of such structure and method is provided at FIG. 2Q. Relative to the example implementation 200P shown in FIG. 2P, in the example implementation 200Q, the underfill 223 of the example implementation 200P is replaced with the encapsulating material 225.

Figure 2P:
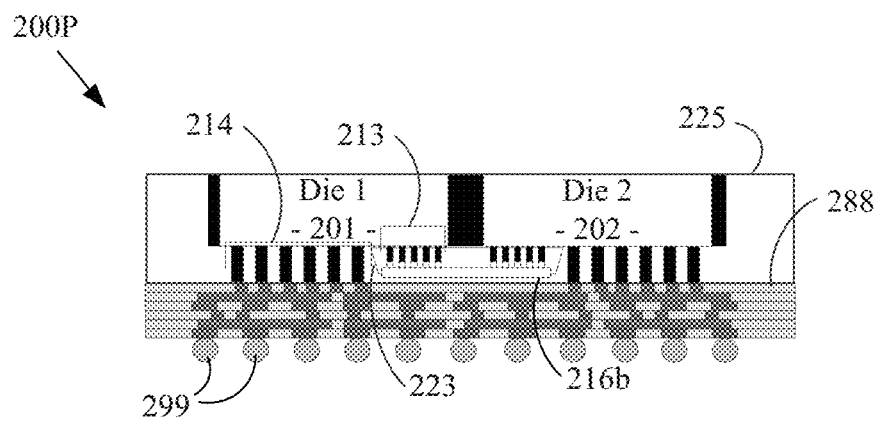
Figure 2Q:
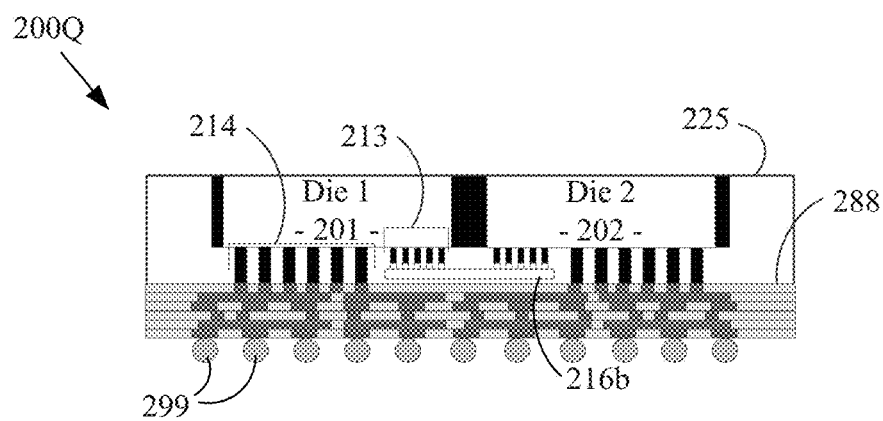

Note that in any of the example implementations 200O, 200P, and 200Q shown in FIGS. 2O, 2P, and 2Q, the lateral sides of the encapsulating material 225 and the substrate 288 may be coplanar.

In the example method 100 shown in FIG. 1 and FIGS. 2A-2Q, various die interconnection structures (e.g., first die interconnection structures 213, second die interconnection structures 214, connect die interconnection structures 217 (and/or 299), etc., were generally formed during die receiving, fabricating, and/or preparing processes. For example, such various die interconnection structures may generally be formed before their respective dies are integrated into the assembly. The scope of this disclosure, however, is not limited by the timing of such example implementations. For example, any or all the various die interconnection structures may be formed after their respective dies are integrated into the assembly. An example method 300 showing die interconnection structure forming at different stages will now be discussed.

Figure 3:
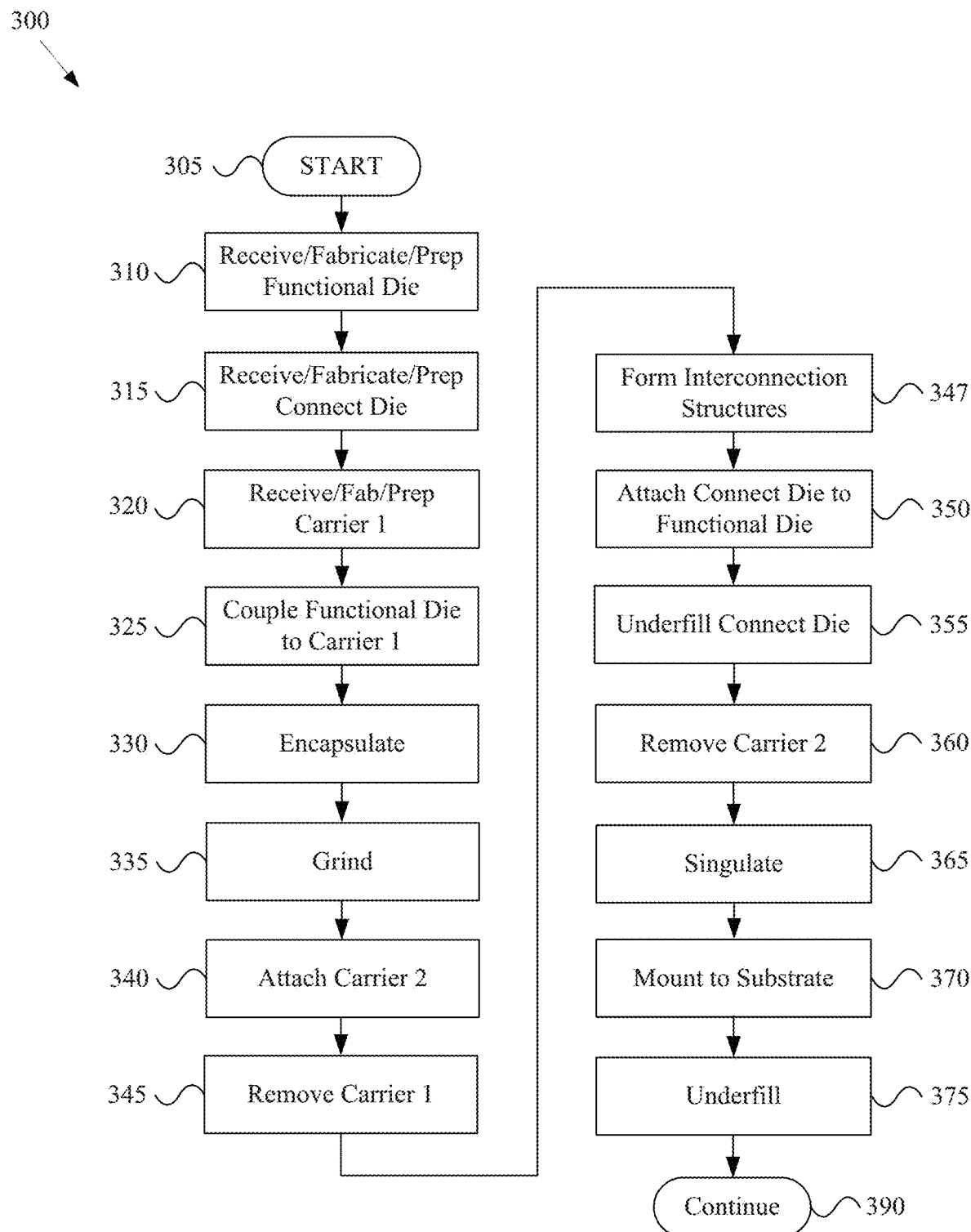
FIG. 3 shows a flow diagram of an example method of making an electronic device, in accordance with various aspects of the present disclosure.
Figure 4A:
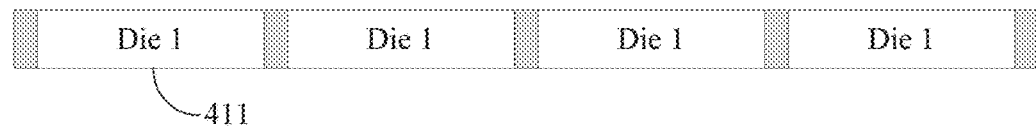
FIGS. 4A-4N show cross-sectional views illustrating an example electronic device and an example method of making an example electronic device, in accordance with various aspects of the present disclosure.
Figure 4A:
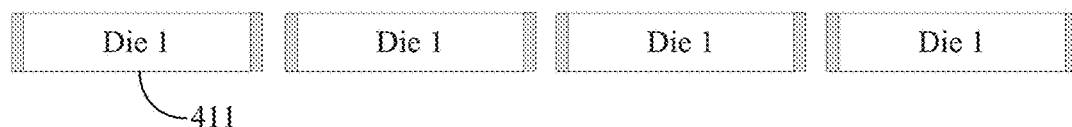
Figure 4A:
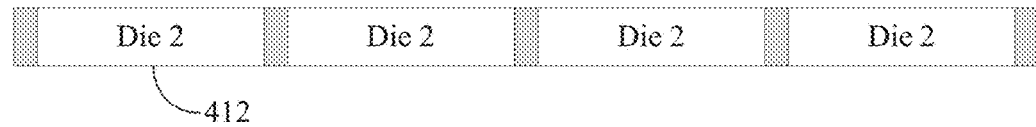
Figure 4A:
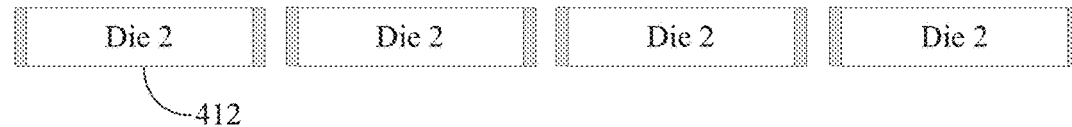
Figure 4B:
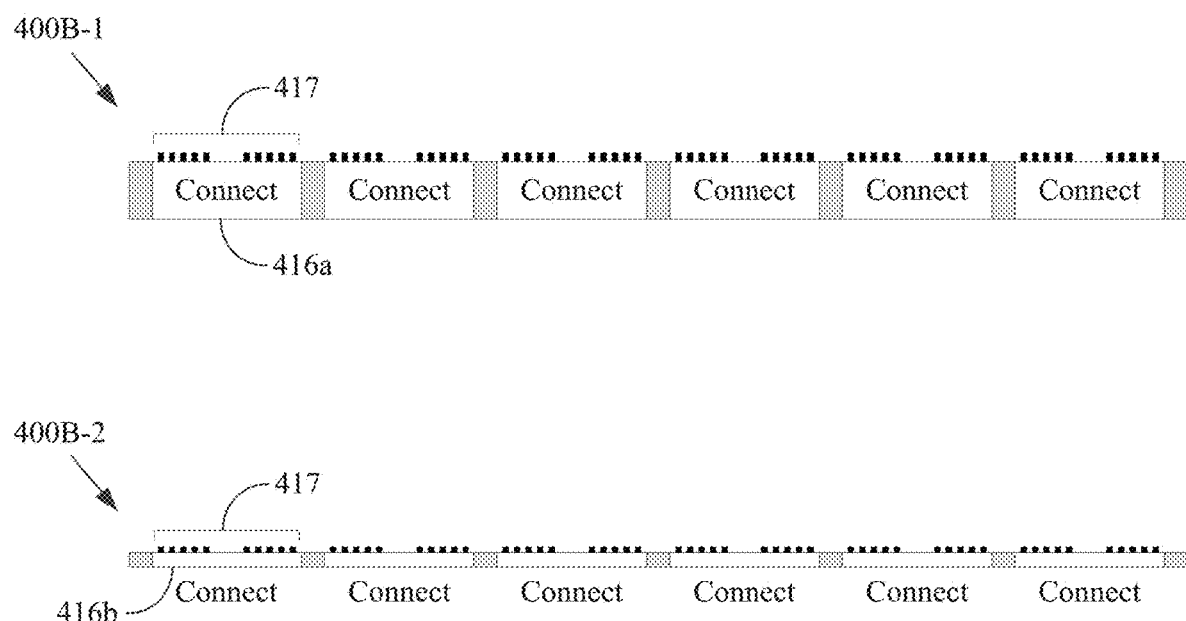

FIG. 3 shows a flow diagram of an example method 300 of making an electronic device (e.g., a semiconductor package, etc.). The example method 300 may, for example, share any or all characteristics with any other example method(s) discussed herein (e.g., the example method 100 of FIG. 1, the example method 500 of FIG. 5, the example method 700 of FIG. 7, etc.). FIGS. 4A-4N show cross-sectional views illustrating an example electronic device (e.g., a semiconductor package, etc.) and an example method of making an example electronic device, in accordance with various aspects of the present disclosure. FIGS. 4A-4N may, for example, illustrate an example electronic device at various blocks (or steps) of the method 300 of FIG. 3. FIGS. 3 and 4A-4N will now be discussed together. It should be noted that the order of the example blocks of the method 300 may vary without departing from the scope of this disclosure.

The example method 300 may begin executing at block 305. The method 300 may begin executing in response to any of a variety of causes or conditions, non-limiting examples of which are provided herein. For example, the method 300 may begin executing automatically in response to one or more signals received from one or more upstream and/or downstream manufacturing stations, in response to a signal from a central manufacturing line controller, etc. Also for example, the method 300 may begin executing in response to an operator command to begin. Additionally for example, the method 300 may begin executing in response to receiving execution flow from any other method block (or step) discussed herein.

The example method 300 may, at block 310, comprise receiving, fabricating, and/or preparing a plurality of functional die. Block 310 may comprise receiving, fabricating, and/or preparing a plurality of functional die in any of a variety of manners, non-limiting examples of which are provided herein. For example, block 310 may share any or all characteristics with block 110 of the example method 100 shown in FIG. 1 and discussed herein. Various aspects of block 310 are presented in the examples 400A-1 to 400A-4 shown at FIG. 4A.

Block 310 may, for example, comprise receiving the plurality of functional die from an upstream manufacturing process at a same facility or geographical location. Block 310 may also, for example, comprise receiving the functional die from a supplier (e.g., from a foundry). Block 310 may also, for example, comprise forming any or all features of the plurality of functional die.

In an example implementation, block 310 may share any or all characteristics with block 110 of the example method 100 of FIG. 1, but without the first 213 and second 214 die interconnection structures. As will be seen, such die interconnection structures may be formed later in the example method 300 (e.g., at block 347, etc.). Though not shown in FIG. 4A, each of the functional dies 411-412 may, for example, comprise die pads and/or underbump metallization structures on which such die interconnection structures may be formed.

The functional die 411-412 shown in FIG. 4A may, for example, share any or all characteristics with the functional die 211-212 shown in FIG. 2A (e.g., without the first 213 and second 214 die interconnection structures). For example and without limitation, the functional die 411-412 may comprise characteristics of any of a variety of electronic components (e.g., passive electronic components, active electronic components, bare dies or components, packaged dies or components, etc.).

In general, block 310 may comprise receiving, fabricating, and/or preparing a plurality of functional die. Accordingly, the scope of this disclosure should not be limited by characteristics of any particular manner of performing such receiving, fabricating, and/or preparing, nor by any particular characteristics of such functional die.

The example method 300 may, at block 315, comprise receiving, fabricating, and/or preparing connect die. Block 315 may comprise receiving, fabricating, and/or preparing one or more connect die in any of a variety of manners, non-limiting examples of which are provided herein. Block 315 may, for example, share any or all characteristics with block 115 of the example method 100 shown in FIG. 1 and discussed herein. Various example aspects of block 315 are presented in the examples 400B-1 and 400B-2 shown at FIG. 4B.

The connect die 416a and/or 416b (or wafer thereof) may, for example, comprise connect die interconnection structures 417. The connect die interconnection structures 417 may comprise any of a variety of characteristics. For example, the connect die interconnection structures 417 and/or the forming of any aspects thereof may share any or all characteristics with the connect die interconnection structures 217 and/or the forming thereof shown in FIGS. 2B-1 to 2B-2 and discussed herein.

The connect die 416a and/or 416b (or wafer thereof) may be formed in any of a variety of manners, non-limiting examples of which are provided herein, for example with regard to the connect die 216a, 216b, and/or 216c of FIGS. 2B-1 to 2B-2.

In general, block 315 may comprise receiving, fabricating, and/or preparing connect die. Accordingly, the scope of this disclosure should not be limited by characteristics of any particular manner of performing such receiving, fabricating, and/or preparing, nor by any particular characteristics of such connect die.

The example method 300 may, at block 320, comprise receiving, fabricating, and/or preparing a first carrier. Block 320 may comprise receiving, fabricating, and/or preparing a first carrier in any of a variety of manners, non-limiting examples of which are provided herein. Block 320 may, for example, share any or all characteristics with other carrier receiving, fabricating, and/or preparing steps discussed herein (e.g., with block 120 of the example method 100 of FIG. 1, etc.).

Figure 4C:
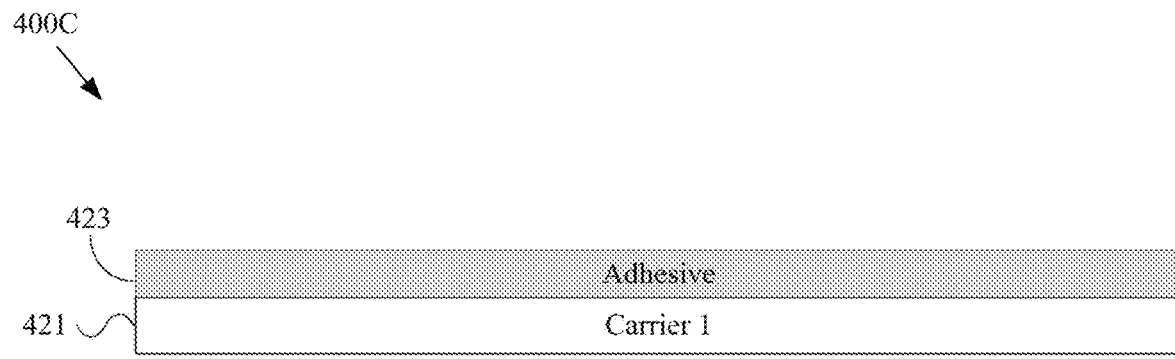

Various example aspects of block 320 are presented in the example 400C shown at FIG. 4C. For example, the carrier 421 may share any or all characteristics with the carrier 221 of FIG. 2C. Also for example, the adhesive 423 may share any or all characteristics with the adhesive 223 of FIG. 2C. Note however, that since the adhesive 423 does not receive die interconnection structures of the functional die (e.g., at block 325), the adhesive 423 need not be as thick as the adhesive 223.

In general, block 320 may comprise receiving, fabricating, and/or preparing a first carrier. Accordingly, the scope of this disclosure should not be limited by characteristics of any particular condition in which the carrier is received, of any particular manner of fabricating the carrier, and/or of any particular manner of preparing such a carrier for use.

The example method 300 may, at block 325, comprise coupling (or mounting) functional die to the carrier (e.g., to the top side of a non-conductive carrier, to a metal pattern on the top side of the carrier, to an RD structure on a top side of the carrier, etc.). Block 325 may comprise performing such coupling in any of a variety of manners, non-limiting examples of which are provided herein. For example, block 325 may, for example, share any or all characteristics with other die-mounting steps discussed herein (e.g., at block 125 of the example method 100 of FIG. 1, etc.).

Figure 4D:
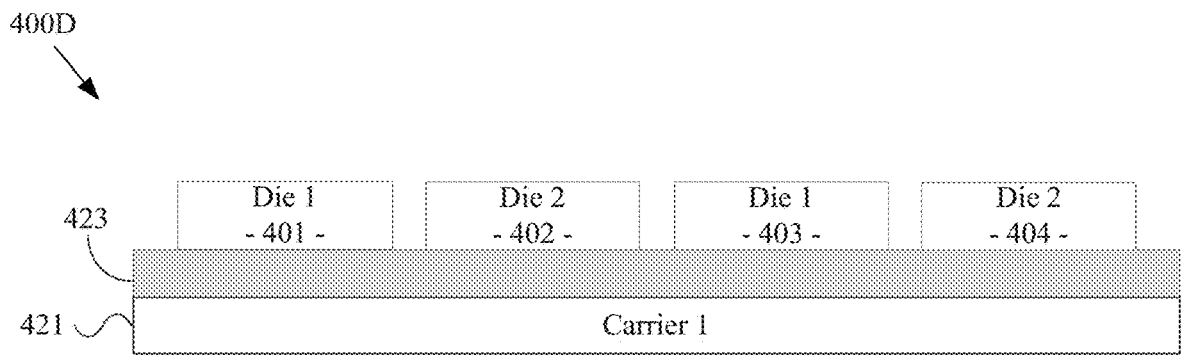

Various example aspects of block 325 are presented in the example 400D shown at FIG. 4D. The example 400D may share any or all characteristics with the example 200D of FIG. 2D. For example, the functional die 401-404 (e.g., instances of dies 411 and/or 412) may share any or all characteristics with the functional die 201-204 (e.g., instances of dies 211 and/or 212) of FIG. 2D (e.g., without the die interconnection structures 213 and 214 extending into the adhesive 223).

In the example 400D, respective active sides of the functional die 401-404 are shown being coupled to the adhesive 423, but the scope of this disclosure is not limited to such orientation. In an alternative implementation, respective inactive sides of the functional die 401-404 may be mounted to the adhesive 423 (e.g., where the functional die 404-404 may have through silicon vias or other structures to later connect to the connect die, etc.).

In general, block 325 may comprise coupling functional die to the carrier. Accordingly, the scope of this disclosure should not be limited by characteristics of any particular manner of performing such coupling.

The example method 300 may, at block 330, comprise encapsulating. Block 330 may comprise performing such encapsulating in any of a variety of manners, non-limiting examples of which are provided herein. For example, block 330 may share any or all characteristics with other encapsulating discussed herein (e.g., with block 130 of the example method 100 of FIG. 1, etc.).

Figure 4E:
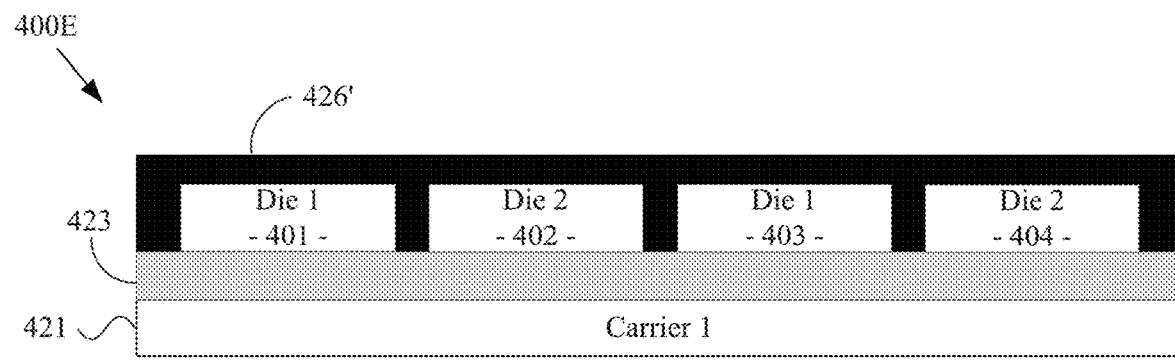

Various example aspects of block 330 are presented in the example 400E shown at FIG. 4E. For example, the encapsulating material 426' (and/or the forming thereof) may share any or all characteristics with the encapsulating material 226' (and/or the forming thereof) of FIG. 2E.

In general, block 330 may comprise encapsulating. Accordingly, the scope of this disclosure should not be limited by characteristics of any particular manner of performing such encapsulating, of any particular type of encapsulating material, etc.

The example method 300 may, at block 335, comprise grinding (or otherwise thinning or planarizing) the encapsulating material. Block 335 may comprise performing such grinding (or any thinning or planarizing process) in any of a variety of manners, non-limiting examples of which are provided herein. For example, block 335 may share any or all characteristics with other grinding (or thinning or planarizing) discussed herein (e.g., with block 135 of the example method 100 of FIG. 1, etc.).

Figure 4F:
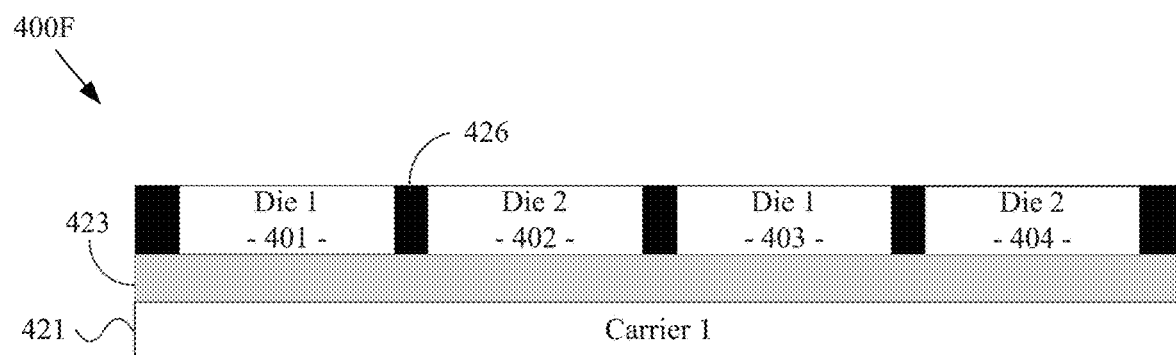

Various example aspects of block 335 are presented in the example 400F shown at FIG. 4F. The example grinded (or thinned or planarized, etc.) encapsulating material 426 (and/or the forming thereof) may share any or all characteristics with the encapsulating material 226 (and/or the forming thereof) of FIG. 2F.

In general, block 335 may comprise grinding (or otherwise thinning or planarizing) the encapsulating material. Accordingly, the scope of this disclosure should not be limited by characteristics of any particular manner of performing such grinding (or thinning or planarizing).

The example method 300 may, at block 340, comprise attaching a second carrier. Block 340 may comprise attaching the second carrier in any of a variety of manners, non-limiting examples of which are provided herein. For example, block 340 may share any or all characteristics with any carrier attaching discussed herein (e.g., with block 140 of the example method 100 of FIG. 1, etc.).

Figure 4G:
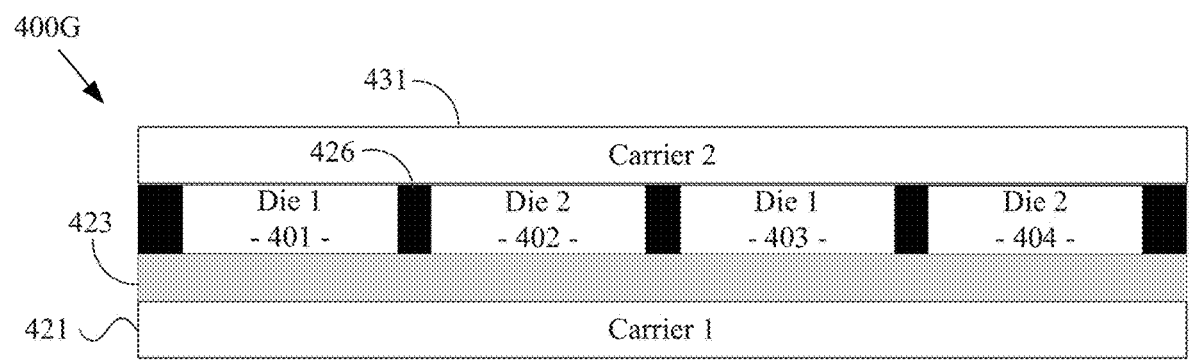

Various example aspects of block 340 are shown in the example 400G shown at FIG. 4G. The second carrier 431 (and/or the attaching thereof) may, for example, share any or all characteristics with the second carrier 231 of FIG. 2G.

In general, block 340 may comprise attaching a second carrier. Accordingly, the scope of this disclosure should not be limited by characteristics of any particular manner of performing such attaching and/or of any particular type of second carrier.

The example method 300 may, at block 345, comprise removing the first carrier. Block 345 may comprise removing the first carrier in any of a variety of manners, non-limiting examples of which are provided herein. For example, block 345 may share any or all characteristics with any carrier-removal discussed herein (e.g., with block 145 of the example method 100 shown in FIG. 1, etc.).

Figures 1, 4H:
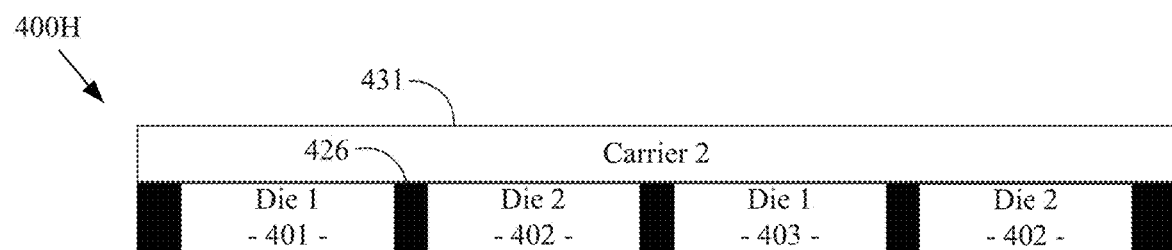
Figures 2, 4H:
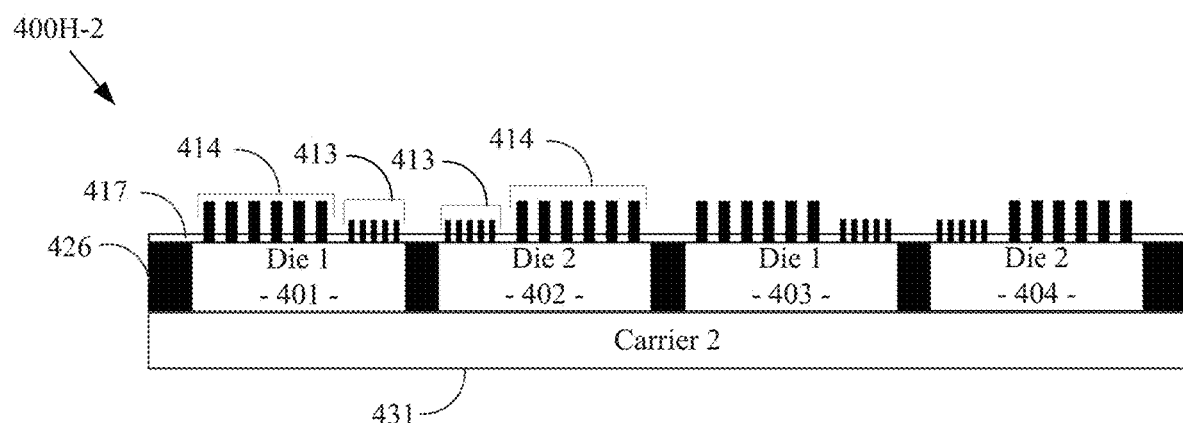

Various example aspects of block 345 are shown in the example 400H shown at FIG. 4H-1. For example, relative to the example 400G, the first carrier 421 has been removed.

In general, block 345 may comprise removing the first carrier. Accordingly, the scope of this disclosure should not be limited by characteristics of any particular manner of performing such removing.

The example method 300 may, at block 347, comprise forming interconnection structures. Block 347 may comprise forming the interconnection structures in any of a variety of manners, non-limiting examples of which are provided herein. For example, block 347 may share any or all characteristics with other interconnection structure forming processes (or steps or blocks) discussed herein (e.g., with regard to block 110 of the example method 100 shown in FIG. 1 and discussed herein, etc.).

Various example aspects of block 347 are shown at example 400H-2 of FIG. 4H-2. The first die interconnection structures 413 of FIG. 4H-2 (and/or the forming thereof)

may share any or all characteristics with the first die interconnection structures 213 of FIG. 2A (and/or the forming thereof). Similarly, the second die interconnection structures 414 of FIG. 4H-2 (and/or the forming thereof) may share any or all characteristics with the second die interconnection structures 214 of FIG. 2A (and/or the forming thereof).

The example implementation 400H-2 includes a passivation layer 417 (or re-passivation layer). Though not shown in the example implementations of FIG. 2A and/or other example implementations presented herein, such example implementations may also include such a passivation layer 417 (e.g., between the functional die and the die interconnection structures and/or around the bases of the die interconnection structures, between the connect die and the connect die interconnection structures and/or around the bases of the connect die interconnection structures, etc.). Block 347 may comprise forming such a passivation layer 417, for example in a scenario in which such a passivation layer 417 was not already formed prior to block 347. Note that the passivation layer 417 may also be omitted.

In an example implementation, for example in which the functional die are received or formed with an exterior inorganic dielectric layer, the passivation layer 417 may comprise an organic dielectric layer (e.g., comprising any of the organic dielectric layers discussed herein).

The passivation layer 417 (and/or the forming thereof) may comprise characteristics of any of the passivation (or dielectric) layers discussed herein (and/or the forming thereof). The first die interconnection structures 413 and the second die interconnection structures 414 may, for example, electrically connect to the functional die 401-404 through respective apertures in the passivation layer 417.

Though the passivation layer 417 is shown on the molding layer 426 and on the functional die 401-404, the passivation layer 417 may also be formed just on the functional die 401-404 (e.g., at block 310). In such an example implementation, the outer surface of the passivation layer 417 (e.g., the surface of the passivation layer 417 facing upward in FIG. 4H-2) may be coplanar with the corresponding surface of the encapsulating material 426 (e.g., the surface of the encapsulating material 426 facing upward in FIG. 4H-2).

In general, block 347 may comprise forming interconnection structures. Accordingly, the scope of this disclosure should not be limited by characteristics of any particular manner of such forming or by any particular characteristics of interconnection structures.

The example method 300 may, at block 350, comprise attaching (or coupling or mounting) connect die to the functional die. Block 350 may comprise performing such attaching in any of a variety of manners, non-limiting examples of which are provided herein. For example, block 350 may, for example, share any or all characteristics with any die attaching discussed herein (e.g., with block 150 of the example method 100 of FIG. 1, etc.).

Figure 4I:
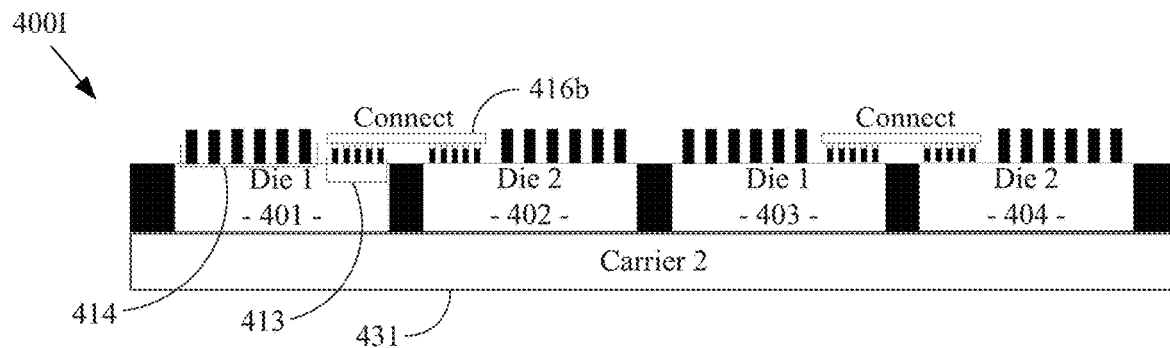

Various example aspects of block 350 are presented in the example 400I shown at FIG. 4I. The connect die 416b, the functional die 401-404, and/or the connection of such die to each other may, for example, share any or all characteristics with the connect die 216b, the functional die 201-204, and/or the connection of such die to each other of the example 200I shown in FIG. 2I.

In general, block 350 may comprise attaching connect die to the functional die. Accordingly, the scope of this disclosure should not be limited by characteristics of any particular manner of performing such attaching and/or of any particular structures utilized to perform such attaching.

The example method 300 may, at block 355, comprise underfilling the connect die. Block 355 may comprise performing such underfilling in any of a variety of manners, non-limiting examples of which are provided herein. Block 355 may, for example, share any or all characteristics with any underfilling discussed herein (e.g., with block 155 and/or block 175 of the example method 100 of FIG. 1, etc.).

Figure 4J:
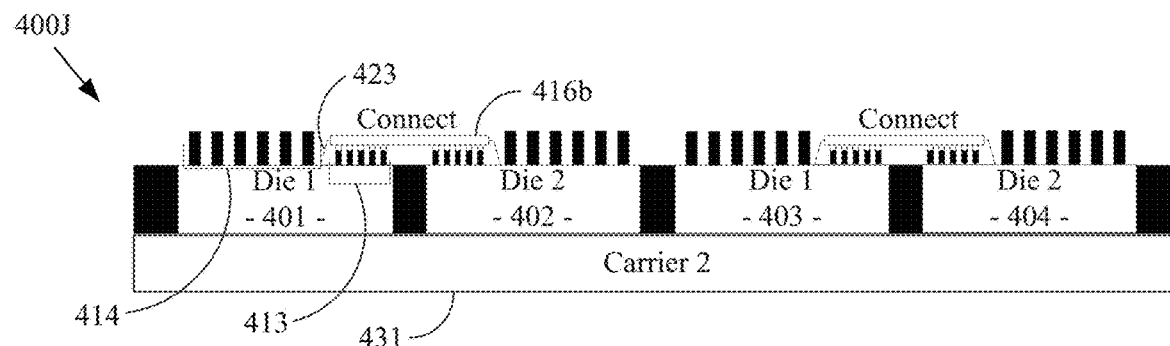

Various example aspects of block 355 are presented in the example 400J shown at FIG. 4J. For example, the underfill 423 of FIG. 4J (and/or the forming thereof) may share any or all characteristics with the underfill 223 of FIG. 2J (and/or the forming thereof). Note that, as with any of the underfilling discussed herein, various example implementations may omit performing such underfilling.

In general, block 355 may comprise underfilling the connect die. Accordingly, the scope of this disclosure should not be limited by characteristics of any particular manner of performing such underfilling or of any particular type of underfilling material.

The example method 300 may, at block 360, comprise removing the second carrier. Block 360 may comprise removing the second carrier in any of a variety of manners, non-limiting examples of which are provided herein. For example, block 360 may share any or all characteristics with any carrier removing discussed herein (e.g., with block 145 and/or block 160 of the example method 100 of FIG. 1, with block 345, etc.).

Figure 4K:
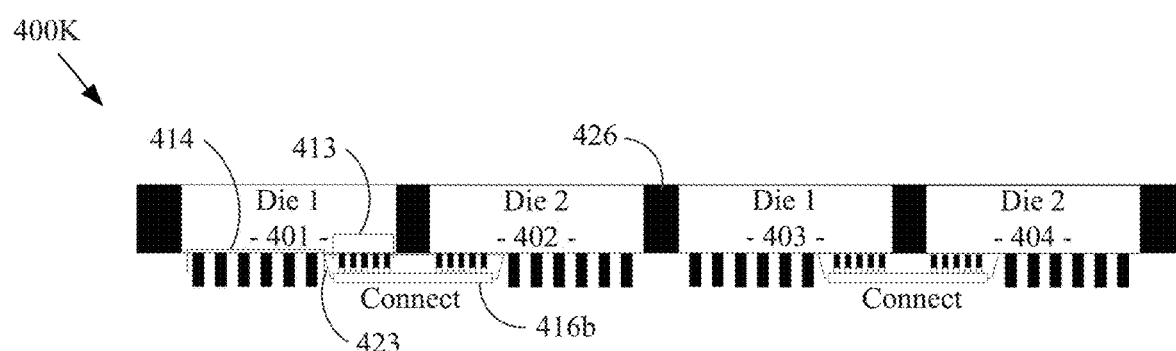

Various example aspects of block 360 are present in the example 400K shown at FIG. 4K. For example, comparing FIG. 4K to FIG. 4J, the second carrier 431 has been removed.

In general, block 360 may comprise removing the second carrier. Accordingly, the scope of this disclosure should not be limited by characteristics of any particular manner of performing such removing.

The example method 300 may, at block 365, comprise singulating. Block 365 may comprise performing such singulating in any of a variety of manners, non-limiting examples of which are discussed herein. Block 365 may, for example, share any or all characteristics with any singulating discussed herein (e.g., as discussed with regard to block 165 of the example method 100 of FIG. 1, etc.).

Figure 4L:
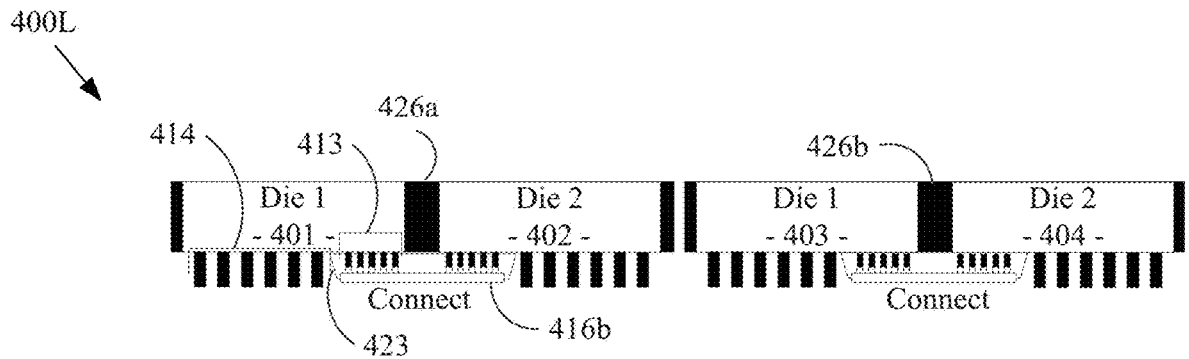

Various example aspects of block 365 are presented in the example 400L shown in FIG. 4L. The singulated structures (e.g., corresponding to the two encapsulating material portions 426a and 426b) may, for example, share any or all characteristics with the singulated structures (e.g., corresponding to the two encapsulating material portions 226a and 226b) of FIG. 2L.

In general, block 365 may comprise singulating. Accordingly, the scope of this disclosure should not be limited by characteristics of any particular manner of singulating.

The example method 300 may, at block 370, comprise mounting to a substrate. Block 370 may, for example, comprise performing such mounting (or coupling or attaching) in any of a variety of manners, non-limiting examples of which are provided herein. For example, block 370 may share any or all characteristics with any of the mounting (or coupling or attaching) discussed herein (e.g., with regard to block 170 of the example method 100 shown in FIG. 1, etc.).

Figure 4M:
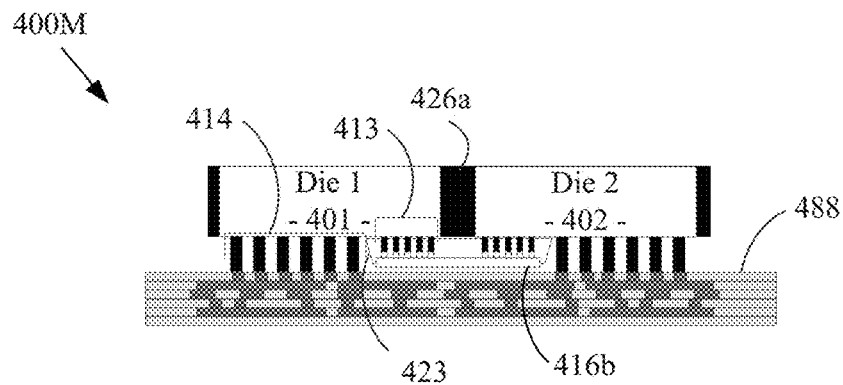
Figure 4N:
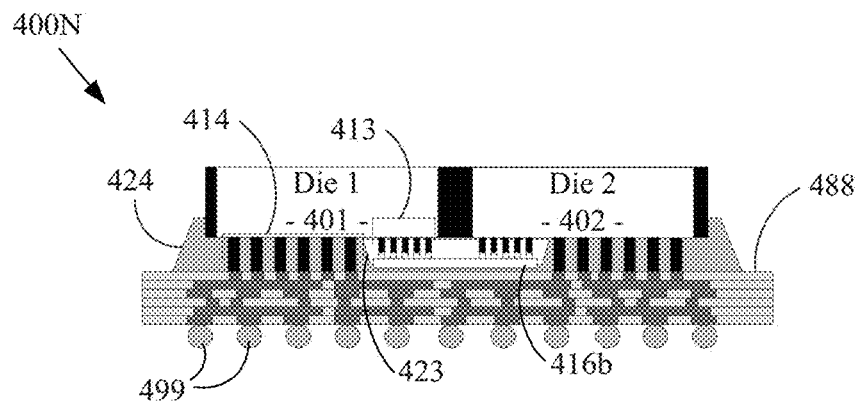

Various example aspects of block 370 are presented in the example 400M shown in FIG. 4M. For example, the substrate 488 (and/or the attachment to such substrate 288) may share any or all characteristics with the substrate 288 (and/or the attachment to such substrate 288) of the example 200M of FIG. 2M.

In general, block 370 may comprise mounting to a substrate. Accordingly, the scope of this disclosure should not be limited by characteristics of any particular manner of mounting to a substrate or of any particular type of substrate.

The example method 300 may, at block 375, comprise underfilling between the substrate and the assembly (or module) mounted thereto at block 370. Block 375 may comprise performing the underfilling in any of a variety of manners, non-limiting examples of which are provided herein. Block 375 may, for example, share any or all characteristics with any underfilling (or encapsulating) process discussed herein (e.g., with regard to block 355, with regard to blocks 155 and 175 of the example method 100 of FIG. 1, etc.).

Various aspects of block 375 are presented in the example 400N shown at FIG. 4N. The underfill 424 (and/or the forming thereof) may, for example, share any or all characteristics with the example underfill 224 (and/or the forming thereof) shown in the example 200N of FIG. 2N. Note that, as with any underfilling discussed herein, the underfilling of block 375 may be skipped or may be performed at a different point in the method.

In general, block 375 may comprise underfilling between the substrate and the assembly mounted thereto. Accordingly, the scope of this disclosure should not be limited by characteristics of any particular manner of mounting to a substrate or of any particular type of substrate.

The example method 300 may, at block 390, comprise performing continued processing. Such continued processing may comprise any of a variety of characteristics, non-limiting examples of which are provided herein. For example, block 390 may share any or all characteristics with block 190 of the example method 100 of FIG. 1, discussed herein.

For example, block 390 may comprise returning execution flow of the example method 300 to any block thereof. Also for example, block 390 may comprise directing execution flow of the example method 300 to any other method block (or step) discussed herein (e.g., with regard to the example method 100 of FIG. 1, the example method 500 of FIG. 5, the example method 700 of FIG. 7, etc.).

For example, block 390 may comprise forming interconnection structures 499 (e.g., conductive balls, bumps, pillars, etc.) on the bottom side of the substrate 488.

Also for example, as shown in the example 200O of FIG. 2O, the example 200P of FIG. 2P, and the example 200Q of FIG. 2Q, block 390 may comprise forming (or skipping the forming of) encapsulating material and/or underfill.

In various example implementations discussed herein, the functional die are mounted to a carrier prior to the connect die being attached to the functional die. The scope of this disclosure is not limited to such mounting order. A non-liming example in which the connect die are mounted to the carrier prior to being attached to the functional die will now be presented.

Figure 5:
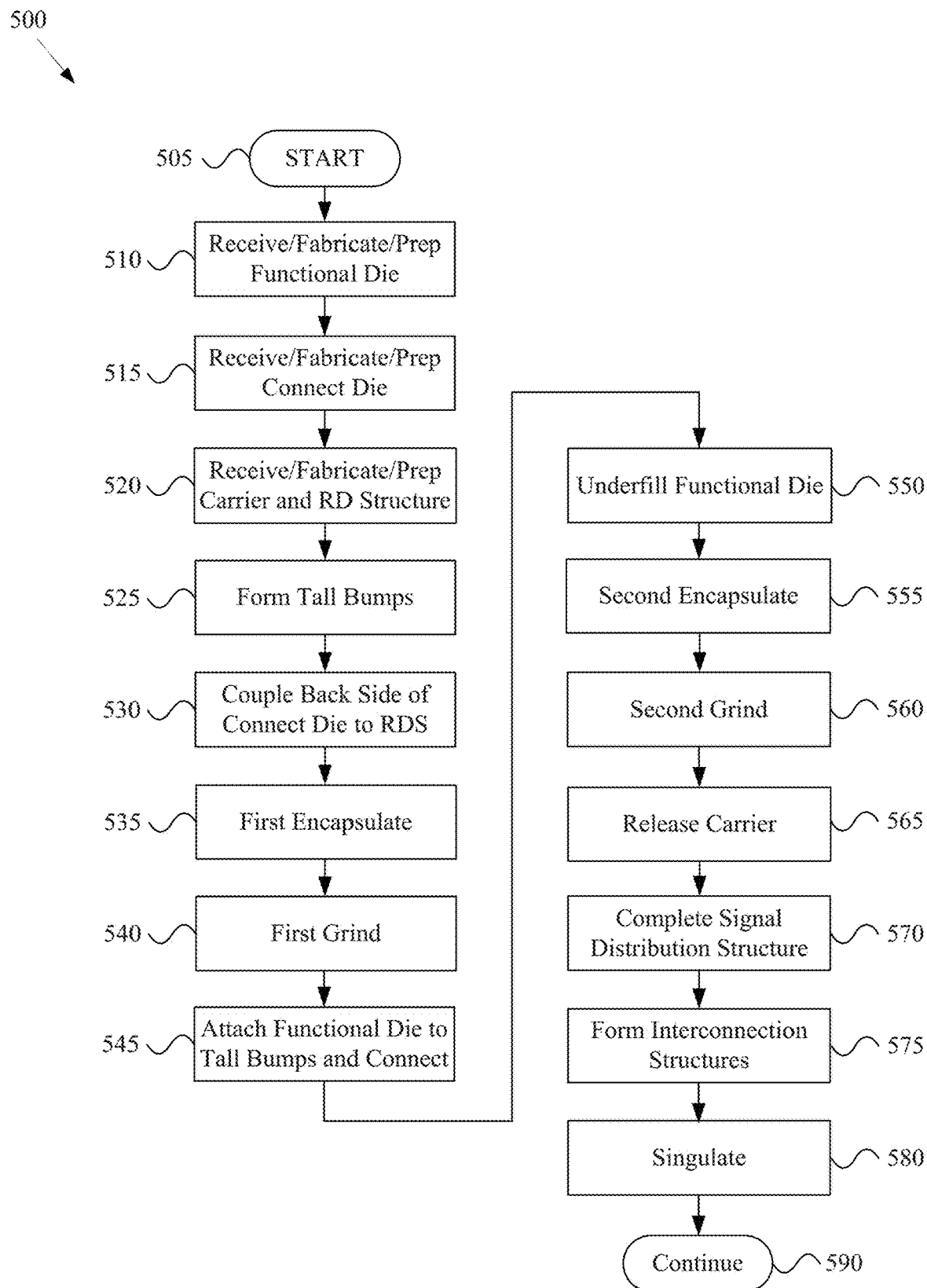
FIG. 5 shows a flow diagram of an example method of making an electronic device, in accordance with various aspects of the present disclosure.

FIG. 5 shows a flow diagram of an example method 500 of making an electronic device, in accordance with various aspects of the present disclosure. The example method 500 may, for example, share any or all characteristics with any other example method(s) discussed herein (e.g., the example method 100 of FIG. 1, the example method 300 of FIG. 3, the example method 700 of FIG. 7, etc.). FIGS. 6A-6M show cross-sectional views illustrating an example electronic device (e.g., a semiconductor package, etc.) and an example method of making an example electronic device, in accordance with various aspects of the present disclosure. FIGS. 6A-6M may, for example, illustrate an example electronic device at various blocks (or steps) of the method 500 of FIG. 5. FIGS. 5 and 6A-6M will now be discussed together. It should be noted that the order of the example blocks of the method 500 may vary without departing from the scope of this disclosure.

The example method 500 may begin executing at block 505. The method 500 may begin executing in response to any of a variety of causes or conditions, non-limiting examples of which are provided herein. For example, the method 500 may begin executing automatically in response to one or more signals received from one or more upstream and/or downstream manufacturing stations, in response to a signal from a central manufacturing line controller, etc. Also for example, the method 500 may begin executing in response to an operator command to begin. Additionally for example, the method 500 may begin executing in response to receiving execution flow from any other method block (or step) discussed herein.

The example method 500 may, at block 510, comprise receiving, fabricating, and/or preparing a plurality of functional die. Block 510 may comprise receiving, fabricating, and/or preparing a plurality of functional die in any of a variety of manners, non-limiting examples of which are provided herein. For example, block 510 may share any or all characteristics with block 310 of the example method 300 shown in FIG. 3 and discussed herein. Various aspects of block 510 are presented in the examples 400A-1 to 400A-4 shown at FIG. 4A. Note that block 510 may also, for example, share any or all characteristics with block 110 of the example method 100 shown in FIG. 1 and discussed herein.

The functional die 611a and 612a as shown in many of FIGS. 6A-6M (and/or the forming thereof) may, for example, share any or all characteristics with the functional die 411 and 412 (and/or the forming thereof) of FIG. 4A, with the functional die 211-212 (and/or the forming thereof) of FIG. 2A, etc. For example and without limitation, the functional die 611 and 612 may comprise characteristics of any of a variety of electronic components (e.g., passive electronic components, active electronic components, bare dies or components, packaged dies or components, etc.).

In general, block 510 may comprise receiving, fabricating, and/or preparing a plurality of functional die. Accordingly, the scope of this disclosure should not be limited by characteristics of any particular manner of performing such receiving and/or fabricating, nor by any particular characteristics of such functional die.

The example method 500 may, at block 515, comprise receiving, fabricating, and/or preparing connect die. Block 515 may comprise receiving and/or fabricating a plurality of connect die in any of a variety of manners, non-limiting examples of which are provided herein. For example, block 515 may share any or all characteristics with block 115 of the example method 100 shown in FIG. 1 and discussed herein. Various example aspects of block 515 are presented in the examples 200B-1 and 200B-7 shown at FIGS. 2B-1 to 2B-2. Note that block 515 may also, for example, share any or all characteristics with block 315 of the example method 300 shown in FIG. 3 and discussed herein.

The connect die 616b and the connect die interconnection structures 617 as shown in many of FIGS. 6A-6M (and/or the forming thereof) may, for example, share any or all characteristics with the connect die 216b and connect die interconnection structures 217 (and/or the forming thereof) of FIGS. 2B-1 to 2B-2.

Note that the connect die interconnection structures 617 (and/or the forming thereof) may, for example, share any or all characteristics with the first die interconnection structures 213 (and/or the forming thereof). For example, in an example implementation, instead of the first die interconnection structures like the first die interconnection structures 213 of FIG. 2A being formed on the functional die 211/212, same or similar connect die interconnection structures 617 may be formed on the connect die 616*b*.

In general, block 515 may comprise receiving, fabricating, and/or preparing connect die. Accordingly, the scope of this disclosure should not be limited by characteristics of any particular manner of such receiving, fabricating, and/or preparing or by any particular characteristics of such connect die.

The example method 500 may, at block 520, comprise receiving, fabricating, and/or preparing a carrier with a signal redistribution (RD) structure (or distribution structure) thereon. Block 520 may comprise performing such receiving fabricating, and/or preparing in any of a variety of manners, non-limiting examples of which are provided herein.

Block 520 may, for example, share any or all characteristics with any or all of the carrier receiving, fabricating, and/or preparing discussed herein (e.g., with regard to block 120 of the example method 100 of FIG. 1, with regard to block 320 of the example method 300 of FIG. 3, etc.). Various example aspects of block 520 are provided in the example 600A of FIG. 6A.

As discussed herein any or all of the carriers discussed herein may, for example, comprise only bulk material (e.g., bulk silicon, bulk glass, bulk metal, etc.). Any or all of such carriers may also comprise a signal redistribution (RD) structure on (or instead of) the bulk material. Block 520 provides an example of the receiving, fabricating, and/or preparing of such a carrier.

Block 520 may comprise forming an RD structure 646*a* on the bulk carrier 621*a* in any of a variety of manners, non-limiting examples of which are presented herein. In an example implementation, one or more dielectric layers and one or more conductive layers may be formed to laterally and/or vertically distribute electrical connections to the second die interconnection structures 614 (formed later) that will ultimately connect to the functional die 611 and 612 (connected later).

Figure 6A:
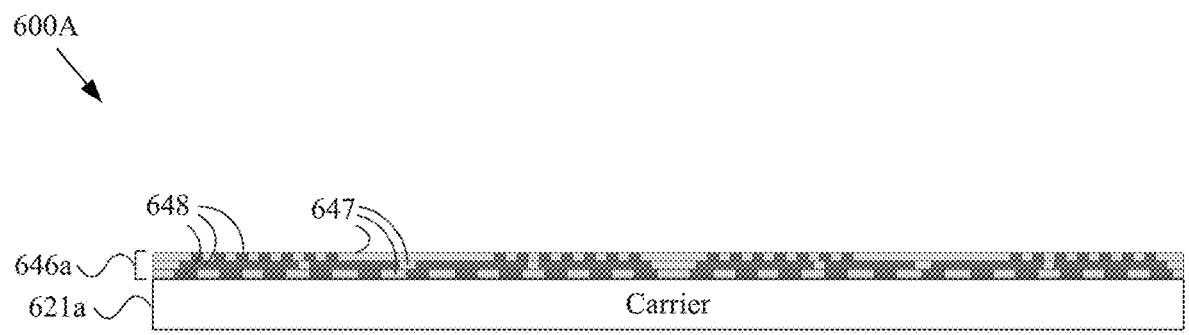
FIGS. 6A-6M show cross-sectional views illustrating an example electronic device and an example method of making an example electronic device, in accordance with various aspects of the present disclosure.

FIG. 6A shows an example in which the RD structure 646*a* comprises three dielectric layers 647 and three conductive layers 648. Such number of layers is merely an example, and the scope of this disclosure is not limited thereto. In another example implementation the RD structure 646*a* may comprise only a single dielectric layer 647 and a single conductive layer 648, two of each layers, etc. The example redistribution (RD) structure 646*a* is formed on the bulk carrier 621*a* material.

The dielectric layers 647 may be formed of any of a variety of materials (e.g., Si3N4, SiO2, SiON, PI, BCB, PBO, WPR, epoxy, or other insulating material). The dielectric layers 647 may be formed utilizing any of a variety of processes (e.g., PVD, CVD, printing, spin coating, spray coating, sintering, thermal oxidation, etc.). The dielectric layers 647 may, for example, be patterned to expose various surfaces (e.g., to expose lower traces or pads of the conductive layers 648, etc.).

The conductive layers 648 may be formed of any of a variety of materials (e.g., copper, silver, gold, aluminum, nickel, combinations thereof, alloys thereof, etc.). The conductive layers 648 may be formed utilizing any of a variety of processes (e.g., electrolytic plating, electroless plating, CVD, PVD, etc.).

The redistribution structure 646*a* may, for example, comprise conductors exposed at an outer surface thereof (e.g., exposed at the top surface of the example 600A). Such exposed conductors may, for example, be utilized for the attachment (or formation) of die interconnection structures (e.g., at block 525, etc.). In such an implementation, the exposed conductors may comprise pads and may, for example, comprise underbump metal (UBM) formed thereon to enhance attachment (or formation) of the die interconnection structures. Such underbump metal may, for example, comprise one or more layers of Ti, Cr, Al, TiW, TiN, or other electrically conductive material.

Example redistribution structures and/or the formation thereof are provided in U.S. patent application Ser. No. 14/823,689, filed Aug. 11, 2015, and titled "SEMICONDUCTOR PACKAGE AND FABRICATING METHOD THEREOF"; and U.S. Pat. No. 8,362,612, titled "SEMICONDUCTOR DEVICE AND MANUFACTURING METHOD THEREOF"; the contents of each of which are hereby incorporated herein by reference in their entirety.

The redistribution structure 646*a* may, for example, perform a fan-out redistribution of at least some electrical connections, for example laterally moving electrical connections to at least a portion of the die interconnection structures 614 (to be formed) to locations outside the footprint of the functional dies 611 and 612 to be attached via such die interconnection structures 614. Also for example, the redistribution structure 646*a* may perform a fan-in redistribution of at least some electrical connections, for example laterally moving electrical connections to at least a portion of the die interconnection structures 614 (to be formed) to locations inside the footprint of the connect die 616*b* (to be connected) and/or to inside the footprints of the functional dies 611 and 612 (to be connected). The redistribution structure 646*a* may also, for example, provide connectivity of various signals between the functional dies 611 and 612 (e.g., in addition to the connections provided by the connect die 616*b*).

In various example implementations, block 520 may comprise forming only a first portion 646*a* of an overall RD structure 646, where a second portion 646*b* of the overall RD structure 646 may be formed later (e.g., at block 570).

In general, block 520 may comprise receiving, fabricating, and/or preparing a carrier with a signal redistribution (RD) structure thereon. Accordingly, the scope of this disclosure should not be limited by characteristics of any particular manner of making such a carrier and/or signal redistribution structure or by any particular characteristics of such a carrier and/or signal redistribution structure.

The example method 500 may, at block 525, comprise forming tall die interconnection structures on the RD structure (e.g., as provided at block 520). Block 525 may comprise forming the tall die interconnection structures on the RD structure in any of a variety of manners, non-limiting examples of which are provided herein.

Block 525 may, for example, share any or all characteristics (e.g., the second die interconnection structure forming characteristics, etc.) with any or all of the functional die receiving, fabricating, and/or preparing discussed herein (e.g., with regard to block 110 of the example method 100 of FIG. 1 and the forming of the second die interconnection structures 214 and/or the forming of the first die interconnection structures 213, with regard to block 347 of the example method 347 of FIG. 3 and the forming of the second die interconnection structures 414, etc.).

Figure 6B:
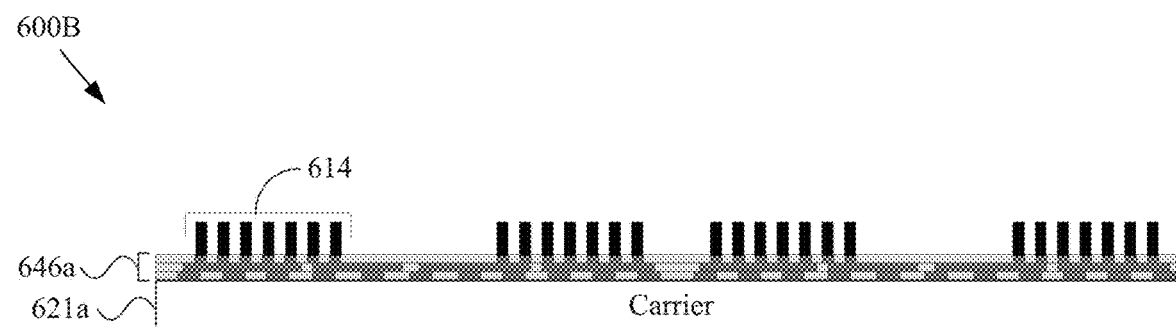
Figure 6C:
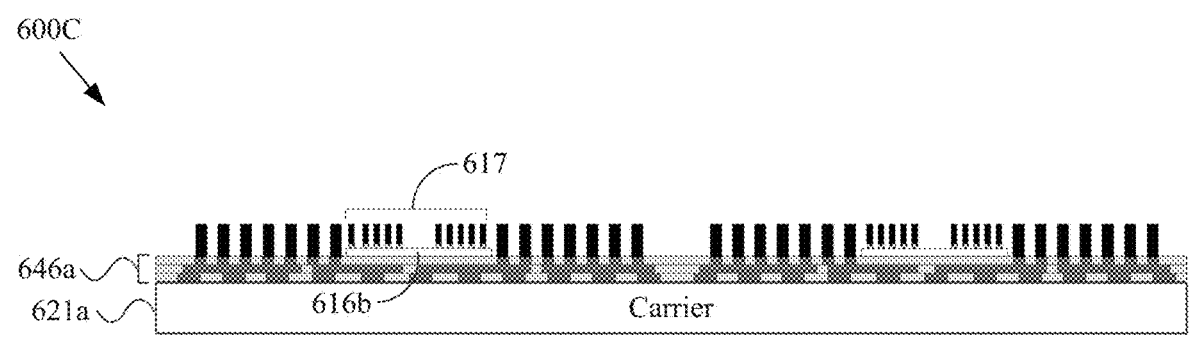

Various example aspects of block 525 are provided in the example 600B of FIG. 6B. The tall interconnection structures 614 (and/or the forming thereof) may share any or all characteristics with the second die interconnection structures 214 of FIG. 2A (and/or the forming thereof) and/or with the second die interconnection structures 414 of FIG. 4H-2 (and/or the forming thereof).

In general, block 525 may comprise forming tall die interconnection structures on the RD structure (e.g., as provided at block 520). Accordingly, the scope of this disclosure should not be limited by characteristics of any particular manner of forming such tall die interconnection structures and/or of any particular type of tall interconnection structure.

The example method 500 may, at block 530, comprise mounting the connect die to the RD structure (e.g., as provided at block 520). Block 530 may comprise performing such mounting (or attaching or coupling) in any of a variety of manners, non-limiting examples of which are provided herein. Block 530 may, for example, share any or all characteristics with any of the die attaching discussed herein (e.g., with regard to block 325 of the example method 300 shown in FIG. 3 and discussed herein, with regard to block 125 of the example method 100 shown in FIG. 1 and discussed herein, etc. Various example aspects of block 530 are presented in the example 600C shown at FIG. 6C.

Block 530 may, for example, comprise utilizing a die-attach adhesive (e.g., a tape, a liquid, a paste, etc.) to attach the back-side of the connect die 616b to the RD structure 646a. Although in FIG. 6C the connect die 616b is shown coupled to a dielectric layer of the RD structure 646a, in other example implementations, the back side of the connect die 616b may be coupled to a conductive layer (e.g., to enhance heat dissipation, to provide additional structural support, etc.).

Additionally, as discussed herein, any of the connect die discussed herein may be two-sided. In such an example implementation, back side interconnection structures may be electrically connected to corresponding interconnection structures (e.g., pads, lands, bumps, etc.) of the RD structure 646a.

In general, block 530 may comprise mounting the connect die to the RD structure (e.g., as provided at block 520). Accordingly, the scope of this disclosure should not be limited by characteristics of any particular manner of mounting a connect die.

The example method 500 may, at block 535, comprise encapsulating. Block 535 may comprise performing such encapsulating in any of a variety of manners, non-limiting examples of which are provided herein. Block 535 may, for example, share any or all characteristics with other encapsulating blocks (or steps) discussed herein (e.g., with block 130 of the example method 100 of FIG. 1, with block 330 of the example method 300 of FIG. 3, etc.). Various example aspects of block 535 are presented at FIG. 6D.

Block 535 may, for example, comprise performing a wafer (or panel) level molding process. As discussed herein, prior to singulating individual modules, any or all of the process steps discussed herein may be performed at the panel or wafer level. Referring to the example implementation 600D shown at FIG. 6D, the encapsulating material 651' may cover a top side of the RD structure 646a, the tall pillars 614, the connect die interconnection structures 617, the top (or active or front) side of the connect die 616b, and at least portions (or all) of lateral side surfaces of the connect die 616b.

Figure 6D:
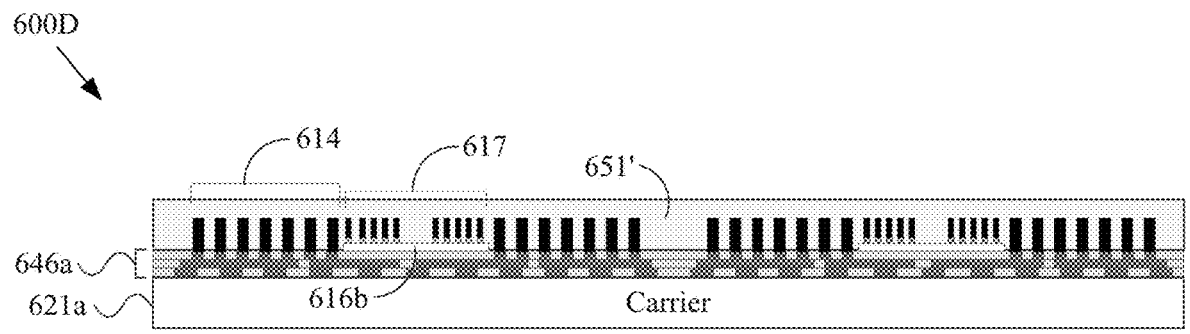
Figure 6E:
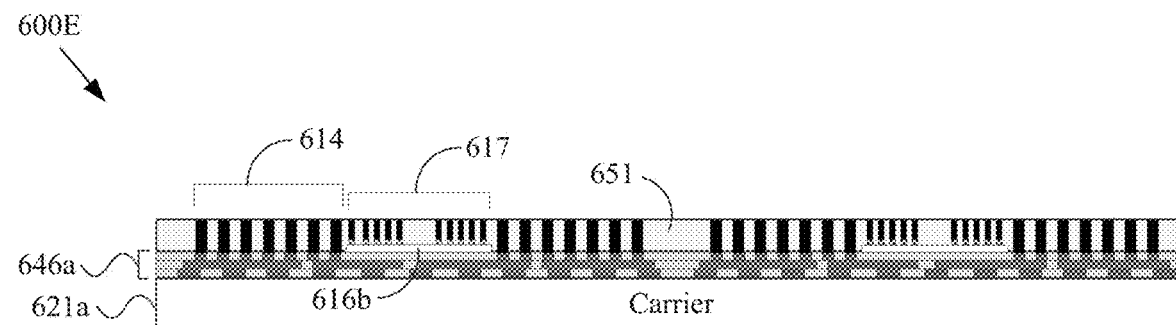

Though the encapsulating material 651' (as shown in FIG. 6D) is shown covering the top ends of the tall interconnection structures 614 and of the connect die interconnection structures 617, any or all of such ends may be exposed from the encapsulating material 651' (as shown in FIG. 6E). Block 535 may, for example, comprise originally forming the encapsulating material 651' with the top ends of the various interconnections exposed or protruding (e.g., utilizing a film assisted molding technique, die-seal molding technique, etc.). Alternatively, block 535 may comprise forming the encapsulating material 651' followed by a thinning (or planarizing or grinding) process (e.g., performed at block 540) to thin the encapsulating material 651' enough to expose the top sides of any or all of the tall interconnection structures 614 and the connect die interconnection structures 617, etc.

In general, block 535 may comprise encapsulating. Accordingly, the scope of this disclosure should not be limited by characteristics of any particular manner of performing such encapsulating or of any particular type of encapsulating material or configuration thereof.

The example method 500 may, at block 540, comprise grinding the encapsulating material and/or various interconnection structures. Block 540 may comprise performing such grinding (or any thinning or planarizing) in any of a variety of manners, non-limiting examples of which are provided herein. Various example aspects of block 540 are presented in the example 600E shown at FIG. 6E. Block 540 may, for example, share any or all characteristics with other grinding (or thinning or planarizing) blocks (or steps) discussed herein.

As discussed herein, in various example implementations, the encapsulating material 651' may originally be formed to a thickness that is greater than ultimately desired, and/or the tall interconnection structures 614 and connect die interconnection structures 617 may originally be formed to a thickness that is greater than ultimately desired. In such example implementations, block 540 may be performed to grind (or otherwise thin or planarize) the encapsulating material 651', the tall interconnection structures 614, and/or the connect die interconnection structures 617. In the example 600E shown in FIG. 6E, the encapsulating material 651, the tall interconnection structures 614, and/or the connect die interconnection structures 617 have been ground to result in the encapsulating material 651 and interconnection structures 613 and 617 (as shown in FIG. 6E). The top surface of the grinded encapsulating material 651, the top surfaces of the tall interconnection structures 614 and/or the top surfaces of the connect die interconnection structures 617 may, for example, be coplanar.

Note that in various example implementations, the top surfaces of the tall interconnection structures 614 and/or the top surfaces of the connect die interconnection structures 617 may protrude from the top surface of the encapsulating material 651, for example utilizing a chemical or mechanical process that thins the encapsulating material 651 more than the interconnection structures 614 and/or 617, utilizing a film-assisted and/or sealed molding process at block 535, etc.

In general, block 540 may comprise grinding (or thinning or planarizing) the encapsulating material and/or various interconnection structures. Accordingly, the scope of this disclosure should not be limited by characteristics of any particular manner of performing such grinding (or thinning or planarizing).

The example method 500 may, at block 545, comprise attaching (or coupling or mounting) the functional die to the tall interconnection structures and to the connect die interconnection structures. Block 545 may comprise performing such attaching in any of a variety of manners, non-limiting examples of which are provided herein. Block 545 may, for example, share any or all characteristics with any die attaching process discussed herein. Various example aspects of block 545 are presented in the example 600F shown at FIG. 6F.

For example, die interconnection structures (e.g., pads, bumps, etc.) of the first functional die 611*a* may be mechanically and electrically connected to respective tall interconnection structures 614 and to respective connect die interconnection structures 617. Similarly, die interconnection structures (e.g., pads, bumps, etc.) of the second functional die 612*a* may be mechanically and electrically connected to respective tall interconnection structures 614 and to respective connect die interconnection structures 617.

Such interconnection structures may be connected in any of a variety of manners. For example, the connection may be performed by soldering. In an example implementation, the tall die interconnection structures 614, the connect die interconnection structures 617, and/or the respective interconnection structures of the first 611*a* and second 612*a* functional die may comprise solder caps (or other solder structures) that may be reflowed to perform the connection. Such solder caps may, for example, be reflowed by mass reflow, thermal compression bonding (TCB), etc. In another example implementation, the connection may be performed by direct metal-to-metal (e.g., copper-to-copper, etc.) bonding, instead of utilizing solder. Examples of such connections are provided in U.S. patent application Ser. No. 14/963,037, filed on Dec. 8, 2015, and titled "Transient Interface Gradient Bonding for Metal Bonds," and U.S. patent application Ser. No. 14/989,455, filed on Jan. 6, 2016, and titled "Semiconductor Product with Interlocking Metal-to-Metal Bonds and Method for Manufacturing Thereof," the entire content of each of which is hereby incorporated herein by reference. Any of a variety of techniques may be utilized to attach the functional die interconnection structures to the tall interconnection structures 614 and the connect die interconnection structures 617 (e.g., mass reflow, thermal-compression bonding (TCB), direct metal-to-metal intermetallic bonding, conductive adhesive, etc.).

As shown in the example implementation 600F, first connect die interconnection structures 617 of the connect die 616*b* are connected to respective interconnection structures of the first functional die 611*a*, and second connect die interconnection structures 617 of the connect die 616*b* are connected to respective interconnection structures of the second functional die 612*a*. As connected, the connect die 616*b* provides an electrical connection between various die interconnection structures of the first functional die 611*a* and the second functional die 612*a* via the RD structures 298 of the connect die 616*b* (e.g., as shown in the example 200B-4 of FIG. 2B-1, etc.).

Figure 6F:
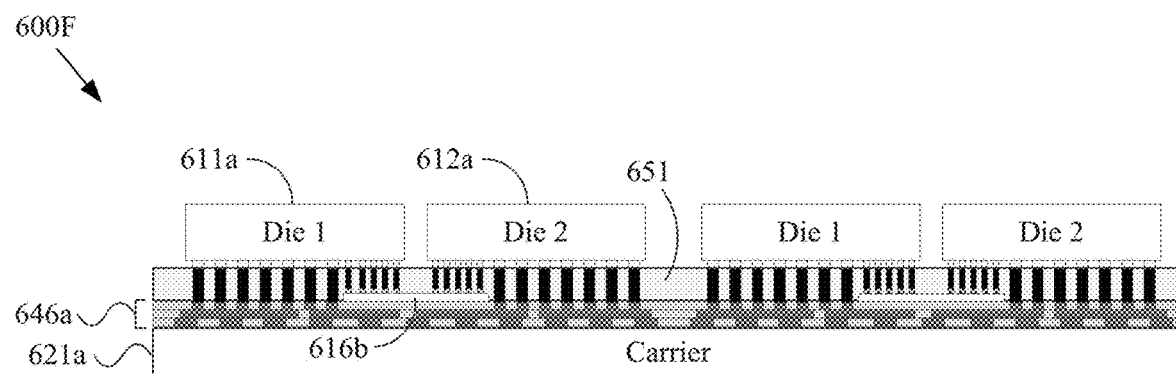
Figure 6G:
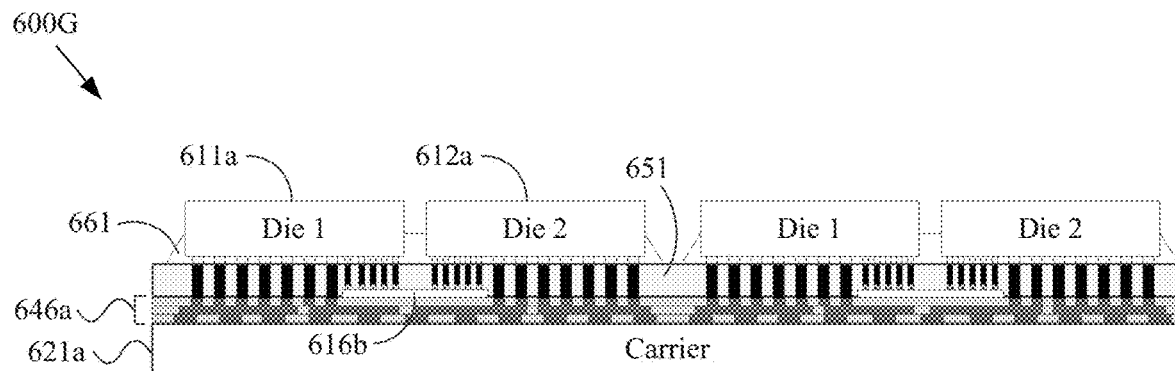

In the example 600F shown in FIG. 6F, the height of the tall interconnection structures 614 may, for example, be equal to (or greater) the combined height of the connect die interconnection structures 217 and the support layer 290*b* of the connect die 616*b*, and adhesive or other means utilized to attach the connect die 616*b* to the RD structure 646*a*.

In general, block 545 may comprise attaching (or coupling or mounting) the functional die to the tall interconnection structures and to the connect die interconnection structures. Accordingly, the scope of this disclosure should not be limited by characteristics of any particular manner of performing such attaching or by characteristics of any particular type of attaching structure.

The example method 500 may, at block 550, comprise underfilling the functional die. Block 550 may comprise performing such underfilling in any of a variety of manners, non-limiting examples of which are provided herein. Block 550 may, for example, share any or all characteristics with any underfilling discussed herein (e.g., with block 155 and/or block 175 of the example method 100 of FIG. 1, with block 355 and/or block 375 of the example method 300 of FIG. 3, etc.). Various example aspects of block 550 are presented in the example 600G shown at FIG. 6G.

Note that underfill may be applied between the functional die 611*a* and 612*a* and the encapsulating material 651. In a scenario in which pre-applied underfill (PUF) is utilized, such PUF may be applied to the functional die 611*a* and 612*a*, and/or to the encapsulating material 651 and/or top exposed ends of the interconnection structures 614 and 617, before the coupling of the functional die.

Block 550 may comprise forming the underfill after the attachment performed at block 545 (e.g., a capillary underfill, injected underfill, etc.). As shown in the example implementation 600G of FIG. 6G, the underfill material 661 (e.g., any underfill material discussed herein, etc.) may completely or partially cover the bottom sides of the functional die 611*a* and 612*a* (e.g., as oriented in FIG. 6G) and/or at least a portion (if not all) of lateral sides of the functional die 611*a* and 612*a*. The underfill material 661 may also, for example, cover most (or all) of the top side of the encapsulating material 651. The underfill material 661 may also, for example, surround respective interconnection structures of the functional die 611*a* and 612*a* to which the tall interconnection structures 614 and the connect die interconnection structures 617 are attached. In an example implementation in which end portions of the tall interconnection structures 614 and/or the connect die interconnection structures 617 protrude from the encapsulating material 651, the underfill material 661 may also surround such protruding portions.

Note that in various example implementations of the example method 500, the underfilling performed at block 550 may be skipped. For example, underfilling the functional die may be performed at another block (e.g., at block 555, etc.). Also for example, such underfilling may be omitted entirely.

In general, block 550 may comprise underfilling the functional die. Accordingly, the scope of this disclosure should not be limited by characteristics of any particular manner of performing such underfilling or by characteristics of any particular type of underfill material.

The example method 500 may, at block 555, comprise encapsulating. Block 555 may comprise performing such encapsulating in any of a variety of manners, non-limiting examples of which are provided herein. For example, block 555 may share any or all characteristics with other encapsulating blocks (or steps) discussed herein (e.g., with block 535, with block 130 of the example method 100 of FIG. 1, with block 330 of the example method 300 of FIG. 3, etc.).

Figure 6H:
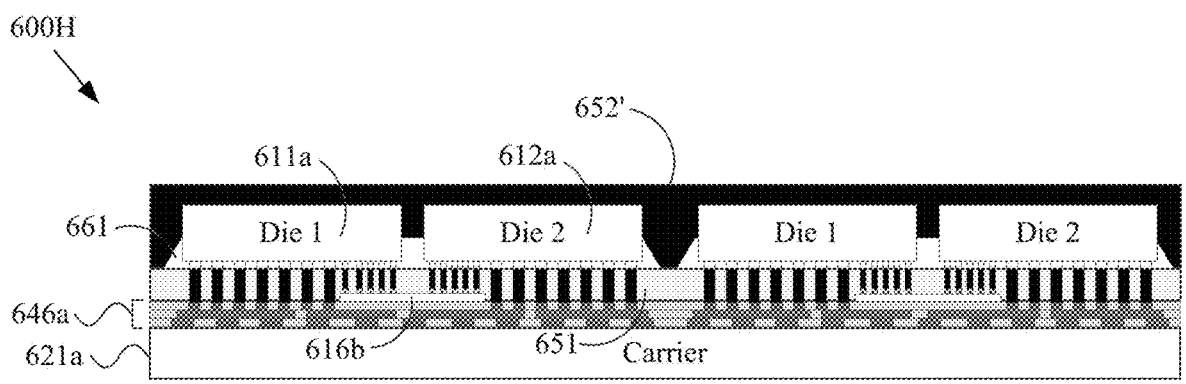

Various example aspects of block 555 are presented in the example 600H shown at FIG. 6H. For example, the encapsulating material 652' (and/or the forming thereof) may share any or all characteristics with the encapsulating material 226' (and/or the forming thereof) of FIG. 2E, with the encapsulating material 426 (and/or the forming thereof) of FIG. 4K, with the encapsulating material 651 (and/or the forming there) of FIG. 6D, etc.

The encapsulating material 652' covers the top side of the encapsulating material 651, covers lateral side surfaces of the underfill 661, covers at least some (if not all) of the lateral side surfaces of the functional die 611*a* and 612*b*, covers top sides of the functional die 611*a* and 612*b*, etc.

As discussed herein with regard to other encapsulating materials (e.g., the encapsulating material 226' of FIG. 2E, etc.), the encapsulating material 652' need not be originally formed to cover the top sides of the functional die 611a and 612a. For example, block 555 may comprise utilizing film-assisted molding, sealed molding, etc., to form the encapsulating material 652'.

In general, block 555 may comprise encapsulating. Accordingly, the scope of this disclosure should not be limited by characteristics of any particular manner of performing such encapsulating, of any particular type of encapsulating material, etc.

The example method 500 may, at block 560, comprise grinding (or otherwise thinning or planarizing) the encapsulating material. Block 560 may comprise performing such grinding (or any thinning or planarizing process) in any of a variety of manners, non-limiting examples of which are provided herein. For example, block 560 may, for example, share any or all characteristics with other grinding (or thinning) blocks (or steps) discussed herein (e.g., with block 135 of the example method 100 of FIG. 1, with block 335 of the example method 300 of FIG. 3, with block 540, etc.).

Figure 6I:
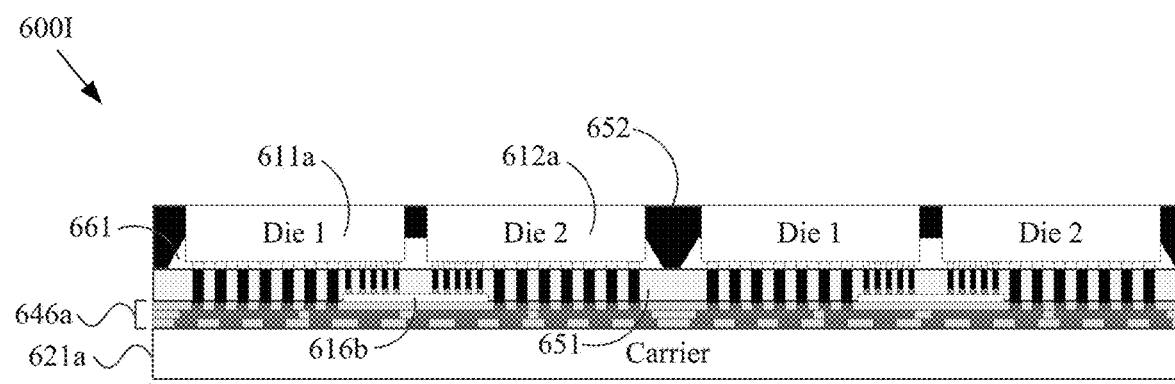

Various example aspects of block 560 are presented in the example 600I shown at FIG. 6I. The example grinded (or thinned or planarized, etc.) encapsulating material 652 (and/or the forming thereof) may share any or all characteristics with the encapsulating material 226 (and/or the forming thereof) of FIG. 2F, with the encapsulating material 426 (and/or the forming thereof) of FIG. 4F, with the encapsulating material 651 (and/or the forming thereof) of FIG. 6E, etc.

Block 560 may, for example comprising grinding the encapsulating material 652 and/or the functional die 611a and 612a such that the top surface of the encapsulating material 652 is coplanar with the top surface of the functional die 611a and/or with the top surface of the functional die 612a.

In general, block 560 may comprise grinding (or otherwise thinning or planarizing) the encapsulating material. Accordingly, the scope of this disclosure should not be limited by characteristics of any particular manner of performing such grinding (or thinning or planarizing).

The example method 500 may, at block 565, comprise removing the carrier. Block 565 may comprise removing the carrier in any of a variety of manners, non-limiting examples of which are provided herein. For example, block 565 may share any or all characteristics with any carrier-removal process discussed herein (e.g., with block 145 and/or block 160 of the example method 100 of FIG. 1, with block 345 and/or block 360 of the example method 300 of FIG. 3, etc.). Various example aspects of block 565 are shown in the example 600J at FIG. 6J.

Figure 6J:
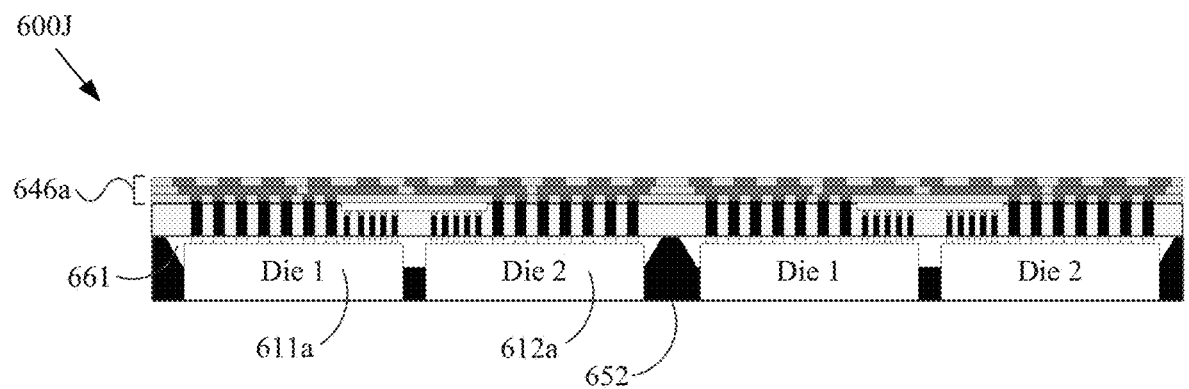

For example, the example 600J of FIG. 6J shows the first carrier 621a removed (e.g., in comparison with the example 600I of FIG. 6I). Block 565 may comprise performing such carrier removal in any of a variety of manners (e.g., grinding, etching, chemical-mechanical planarization, peeling, shearing, thermal or laser releasing, etc.). Also for example, block 565 may comprise removing an adhesive layer, if for example an adhesive layer was utilized during the formation of the RD structure 646a at block 520.

Note that, in various example implementations, as shown and discussed herein with regard to the example methods 100 and 300 of FIGS. 1 and 3, a second carrier may be utilized (e.g., coupled to the encapsulating material 652 and/or to the functional die 611a and 612a. In other example implementations, various tooling structures may be utilized instead of a carrier.

In general, block 565 may comprise removing the carrier. Accordingly, the scope of this disclosure should not be limited by characteristics of any particular manner of removing a carrier or by characteristics of any particular type of carrier.

The example method 500 may, at block 570, comprise completing the signal redistribution (RD) structure. Block 570 may comprise completing the RD structure in any of a variety of manners, non-limiting examples of which are provided herein. Block 570 may, for example, share any or all characteristics with block 520 (e.g., with regard to the RD structure forming aspects of block 520). Various aspects of block 570 are presented in the example 600K shown at FIG. 6K.

As discussed herein, for example with regard to block 520, the carrier may have (but need not have) been received (or fabricated or prepared) with only part of the desired RD structure formed. In such an example scenario, block 570 may comprise completing the formation of the RD structure.

Figure 6K:
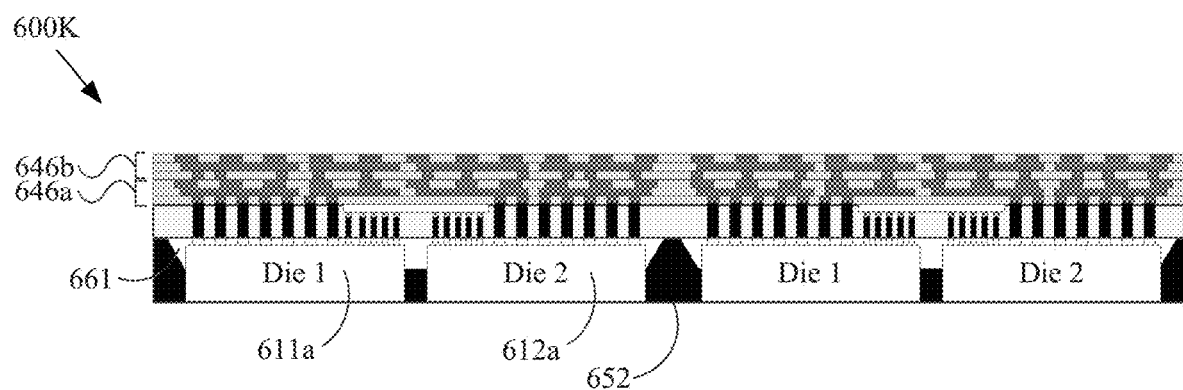

Referring to FIG. 6K, block 570 may comprise forming the second portion of the RD structure 646b on the first portion of the RD structure 646a (e.g., the first portion of the RD structure 646a having been received or fabricated or prepared at block 520). Block 570 may, for example, comprise forming the second portion of the RD structure 646b in the same manner as that in which the first portion of the RD structure 646a is formed.

Note that in various implementations, the first portion of the RD structure 646a and the second portion of the RD structure 646b may be formed utilizing different materials and/or different processes. For example the first portion of the RD structure 646a may be formed utilizing inorganic dielectric layers, and the second portion of the RD structure 646b may be formed utilizing organic dielectric layers. Also for example, the first portion of the RD structure 646a may be formed having a finer pitch (or thinner traces, etc.), and the second portion of the RD structure 646b may be formed having a coarser pitch (or thicker traces, etc.). Also for example, the first portion of the RD structure 646a may be formed utilizing a back end of line (BEOL) semiconductor wafer fabrication (fab) process, and the second portion of the RD structure 646b may be form utilizing a post-fab electronic device packaging process. Additionally, the first portion of the RD structure 646a and the second portion of the RD structure 646b may be formed at different geographical locations.

As with the first portion of the RD structure 646a, the second portion of the RD structure 646b may have any number of dielectric and/or conductive layers.

As discussed herein, interconnection structures may be formed on the RD structure 646b. In such an example implementation, block 565 may comprise forming under bump metallization (UBM) on exposed pads to enhance the formation (or attachment) of such interconnection structures.

In general, block 570 may comprise completing the signal redistribution (RD) structure. Accordingly, the scope of this disclosure should not be limited by characteristics of any particular manner of forming a signal redistribution structure or by characteristics of any particular type of signal distribution structure.

The example method 500 may, at block 575, comprise forming interconnection structures on the redistribution structure. Block 575 may comprise forming the interconnection structures in any of a variety of manners, non-limiting examples of which are provided herein. For example, block 575 may share any or all characteristics with any interconnection structure forming discussed hereon.

Figure 6L:
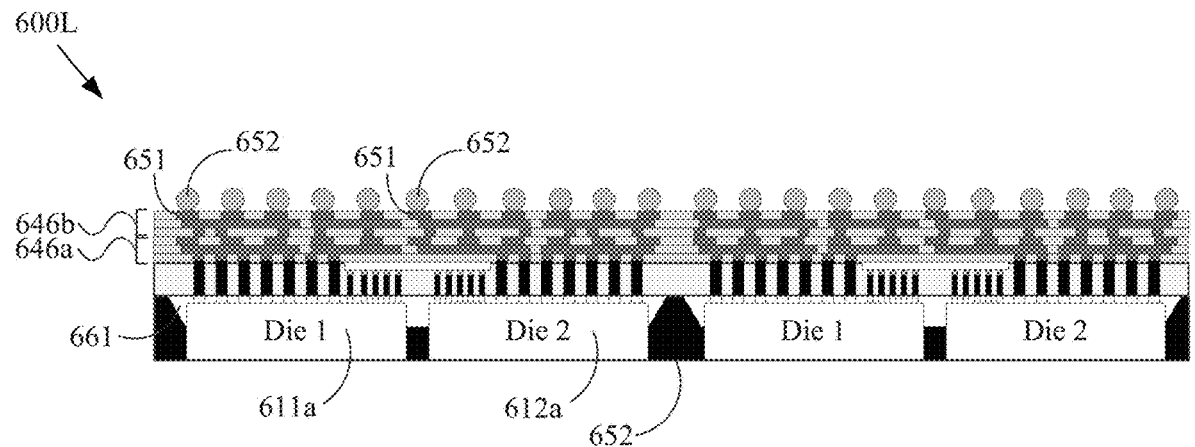

Various example aspects of block 575 are presented in the example 600L shown at FIG. 6L. The example interconnection structures 652 (e.g., package interconnection structures, etc.) may comprise characteristics of any of a variety of interconnection structures. For example, the package interconnection structures 652 may comprise conductive balls (e.g., solder balls, etc.), conductive bumps, conductive pillars, wires, etc.

Block 575 may comprise forming the interconnection structures 652 in any of a variety of manners. For example, the interconnection structures 652 may be pasted and/or printed on the RD structure 646b (e.g., to respective pads 651 and/or UBM thereof) and then reflowed. Also for example, the interconnection structures 652 (e.g., conductive balls, conductive bumps, pillars, wires, etc.) may be preformed prior to attaching and then attached to the RD structure 646b (e.g., to respective pads 651 thereof), for example reflowed, plated, epoxied, wire-bonded, etc.).

Note that, as discussed above, the pads 651 of the RD structure 646b may be formed with underbump metal (UBM) or any metallization to assist with the formation (e.g., building, attaching, coupling, depositing, etc.) of the interconnection structures 652. Such UBM forming may, for example, be performed at block 570 and/or at block 575.

In general, block 575 may comprise forming interconnection structures on the redistribution structure. Accordingly, the scope of this disclosure should not be limited by characteristics of any particular manner of forming such interconnection structures or by any particular characteristics of an interconnection structure.

The example method 500 may, at block 580, comprise singulating. Block 580 may comprise performing such singulating in any of a variety of manners, non-limiting examples of which are discussed herein. Block 580 may, for example, share any or all characteristics with any singulating discussed herein (e.g., as discussed with regard to block 165 of the example method 100 of FIG. 1, as discussed with regard to block 365 of the example method 300 of FIG. 3, etc.).

Figure 6M:
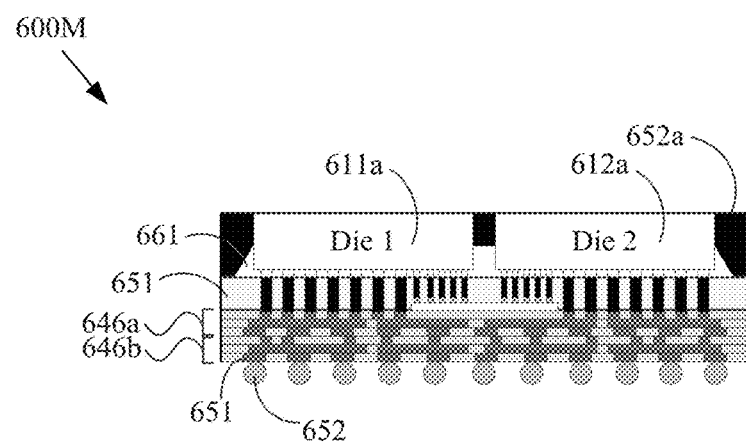

Various example aspects of block 580 are presented in the example 600M shown in FIG. 6M. The singulated structure (e.g., corresponding to an encapsulating material portions 652a) may, for example, share any or all characteristics with the singulated structures (e.g., corresponding to the two encapsulating material portions 226a and 226b) of FIG. 2L, with the singulated structures (e.g., corresponding to the two encapsulating material portions 426a and 426b) of FIG. 4L, etc.

In general, block 580 may comprise singulating. Accordingly, the scope of this disclosure should not be limited by characteristics of any particular manner of singulating.

The example method 500 may, at block 590, comprise performing continued processing. Such continued processing may comprise any of a variety of characteristics, non-limiting examples of which are provided herein. For example, block 590 may share any or all characteristics with block 190 of the example method 100 of FIG. 1, with block 390 of the example method 300 of FIG. 3, etc.

For example, block 590 may comprise returning execution flow of the example method 500 to any block thereof. Also for example, block 590 may comprise directing execution flow of the example method 500 to any other method block (or step) discussed herein (e.g., with regard to the example method 100 of FIG. 1, the example method 300 of FIG. 3, the example method 700 of FIG. 7, etc.).

For example, as shown in the example 200O of FIG. 2O, the example 200P of FIG. 2P, and the example 200Q of FIG. 2Q, block 590 may comprise forming (or skipping the forming of) encapsulating material and/or underfill.

Figure 9:
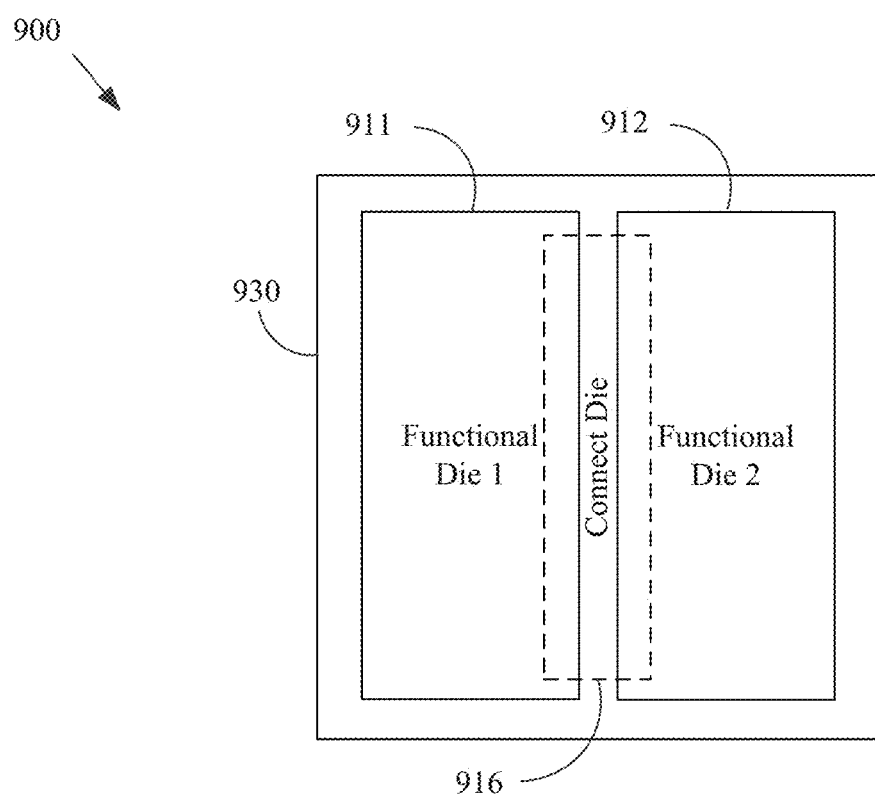
FIG. 9 shows a top view of an example electronic device, in accordance with various aspects of the present disclosure.
Figure 10:
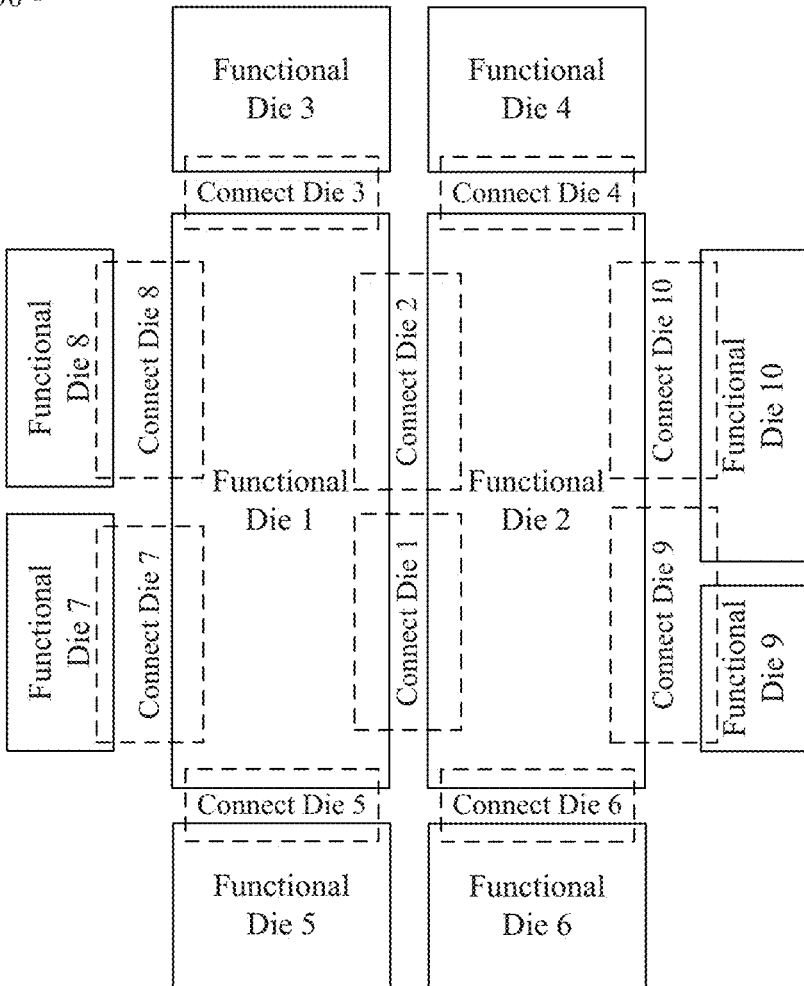
FIG. 10 shows a top view of an example electronic device, in accordance with various aspects of the present disclosure.

As discussed herein, the functional die and the connect die may be mounted to a substrate, for example in a multi-chip module configuration. Non-limiting examples of such configurations are shown in FIGS. 9 and 10.

Figure 7:
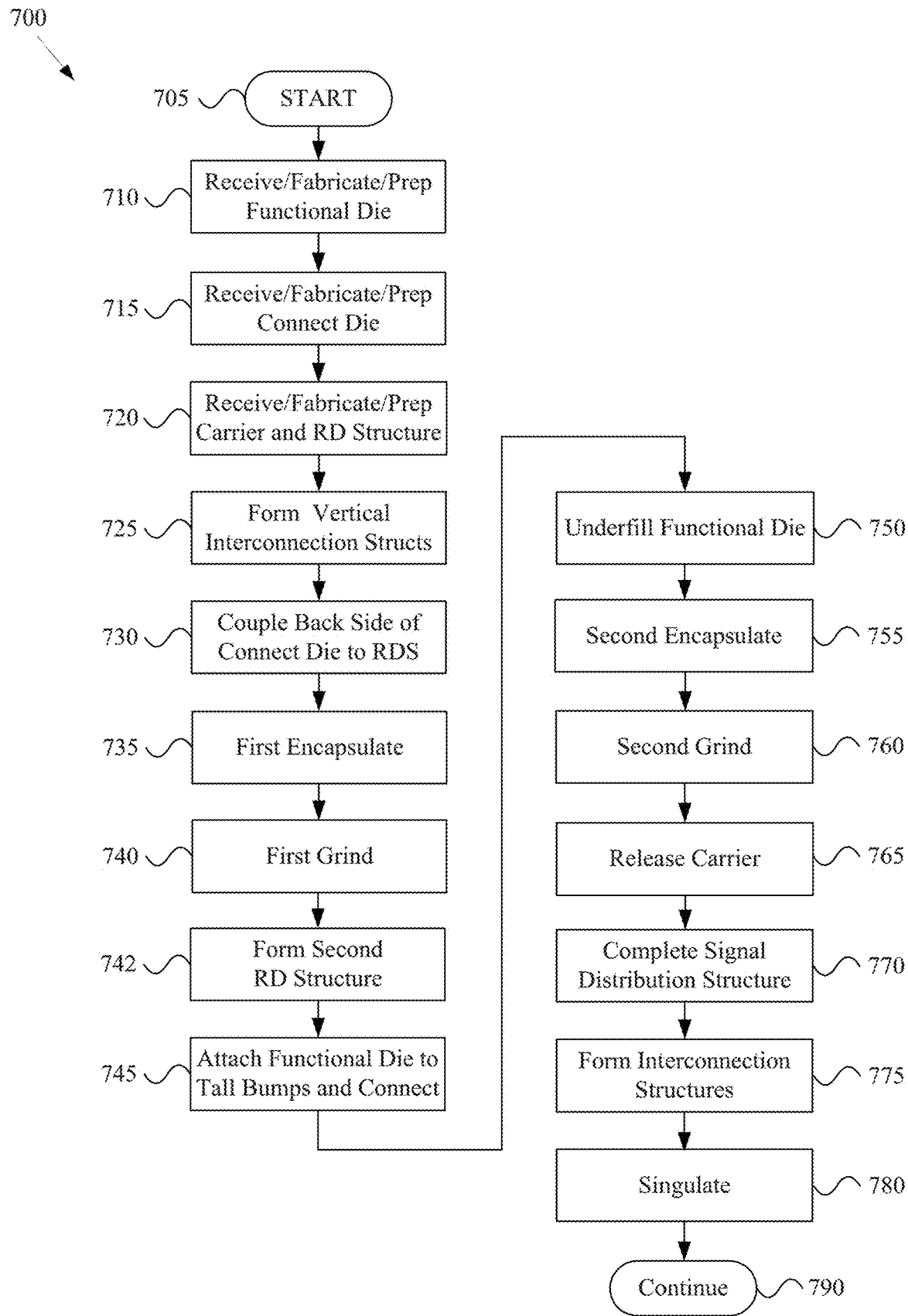
FIG. 7 shows a flow diagram of an example method of making an electronic device, in accordance with various aspects of the present disclosure.
Figure 8A:
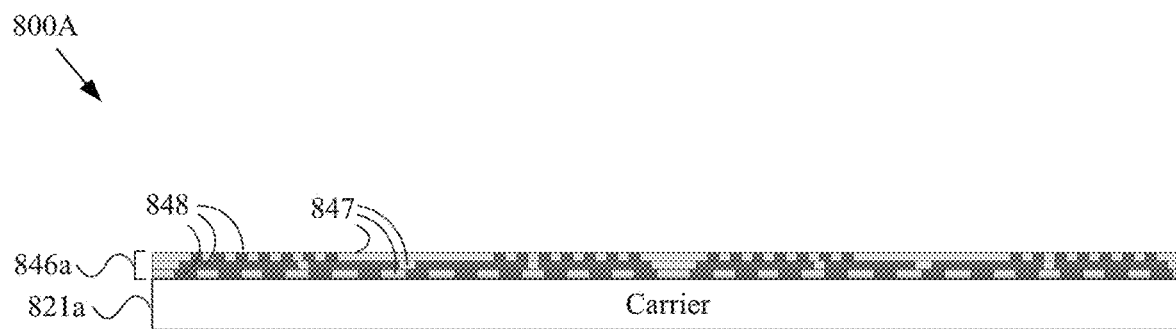
FIGS. 8A-8N show cross-sectional views illustrating an example electronic device and an example method of making an example electronic device, in accordance with various aspects of the present disclosure.

FIG. 7 shows a flow diagram of an example method 700 of making an electronic device, in accordance with various aspects of the present disclosure. The example method 700 may, for example, share any or all characteristics with any other example method(s) discussed herein (e.g., the example method 100 of FIG. 1, the example method 300 of FIG. 3, the example method 500 of FIG. 5, etc.). FIGS. 8A-8N show cross-sectional views illustrating an example electronic device (e.g., a semiconductor package, etc.) and an example method of making an example electronic device, in accordance with various aspects of the present disclosure. FIGS. 8A-8N may, for example, illustrate an example electronic device at various blocks (or steps) of the method 700 of FIG. 7. FIGS. 7 and 8A-8N will now be discussed together. It should be noted that the order of the example blocks of the method 700 may vary without departing from the scope of this disclosure. In an example implementation, the method 700 of FIG. 7 may be considered to be analogous to the method of FIG. 5 with the addition of block 742 for forming a second redistribution structure.

The example method 700 may begin executing at block 705. The method 700 may begin executing in response to any of a variety of causes or conditions, non-limiting examples of which are provided herein. For example, the method 700 may begin executing automatically in response to one or more signals received from one or more upstream and/or downstream manufacturing stations, in response to a signal from a central manufacturing line controller, etc. Also for example, the method 700 may begin executing in response to an operator command to begin. Additionally for example, the method 700 may begin executing in response to receiving execution flow from any other method block (or step) discussed herein.

The example method 700 may, at block 710, comprise receiving, fabricating, and/or preparing a plurality of functional die. Block 710 may comprise receiving, fabricating, and/or preparing a plurality of functional die in any of a variety of manners, non-limiting examples of which are provided herein. For example, block 710 may share any or all characteristics with block 510 of the example method 500 shown in FIG. 5 and discussed herein, when block 310 of the example method 300 shown in FIG. 3 and discussed herein, etc. Various aspects of block 710 are presented in the examples 400A-1 to 400A-4 shown at FIG. 4A. Note that block 710 may also, for example, share any or all characteristics with block 110 of the example method 100 shown in FIG. 1 and discussed herein.

The functional die 811a and 812a as shown in many of FIGS. 8A-8N (and/or the forming thereof) may, for example, share any or all characteristics with the functional die 611a and 612a (and/or the forming thereof), the functional die 411 and 412 (and/or the forming thereof), the functional die 211 and 212 (and/or the forming thereof), etc. For example and without limitation, the functional die 811a and 812a may comprise characteristics of any of a variety of electronic components (e.g., passive electronic components, active electronic components, bare dies or components, packaged dies or components, etc.).

In general, block 710 may comprise receiving, fabricating, and/or preparing a plurality of functional die. Accordingly, the scope of this disclosure should not be limited by characteristics of any particular manner of performing such receiving and/or fabricating, nor by any particular characteristics of such functional die.

The example method 700 may, at block 715, comprise receiving, fabricating, and/or preparing connect die. Block 715 may comprise receiving and/or fabricating a plurality of connect die in any of a variety of manners, non-limiting examples of which are provided herein. For example, block 715 may share any or all characteristics with block 115 of the example method 100 shown in FIG. 1 and discussed herein. Various example aspects of block 715 are presented in the examples 200B-1 and 200B-7 shown at FIGS. 2B-1 to 2B-2. Note that block 715 may also, for example, share any or all characteristics with block 315 of the example method 100 shown in FIG. 3 and discussed herein, with block 515 of the example method 500 shown in FIG. 5, etc.

The connect die 816b and the connect die interconnection structures 817 as shown in many of FIGS. 8A-8N (and/or the forming thereof) may, for example, share any or all characteristics with the connect die 216b and connect die interconnection structures 217 (and/or the forming thereof) of FIGS. 2B-1 to 2B-2.

Note that the connect die interconnection structures 817 (and/or the forming thereof) may, for example, share any or all characteristics with the first die interconnection structures 213 (and/or the forming thereof). For example, in an example implementation, instead of the first die interconnection structures like the first die interconnection structures 213 of FIG. 2A being formed on the functional die 211/212, same or similar connect die interconnection structures 817 may be formed on the connect die 816b.

In general, block 715 may comprise receiving, fabricating, and/or preparing connect die. Accordingly, the scope of this disclosure should not be limited by characteristics of any particular manner of such receiving, fabricating, and/or preparing or by any particular characteristics of such connect die.

The example method 700 may, at block 720, comprise receiving, fabricating, and/or preparing a carrier with a signal redistribution (RD) structure (or distribution structure) thereon. Block 720 may comprise performing such receiving fabricating, and/or preparing in any of a variety of manners, non-limiting examples of which are provided herein.

Block 720 may, for example, share any or all characteristics with any or all of the carrier receiving, fabricating, and/or preparing discussed herein (e.g., with regard to block 120 of the example method 100 of FIG. 1, with regard to block 320 of the example method 300 of FIG. 3, with regard to block 520 of the example method 500 of FIG. 5, etc.). Various example aspects of block 720 are provided in the example 800A of FIG. 8A.

As discussed herein any or all of the carriers discussed herein may, for example, comprise only bulk material (e.g., bulk silicon, bulk glass, bulk metal, etc.). Any or all of such carriers may also comprise a signal redistribution (RD) structure on (or instead of) the bulk material. Block 720 provides an example of the receiving, fabricating, and/or preparing of such a carrier.

Block 720 may comprise forming an RD structure 846a on the bulk carrier 821a in any of a variety of manners, non-limiting examples of which are presented herein. In an example implementation, one or more dielectric layers and one or more conductive layers may be formed to laterally and/or vertically distribute electrical connections to the vertical interconnection structures 814 (formed later) that will ultimately electrically connect to the second redistribution structure 896 and/or functional die 811 and 812 (connected later). The RD structure 846a may thus be coreless. Note however, that in various alternative implementations, the RD structure 846a may be a cored structure.

FIG. 8A shows an example in which the RD structure 846a comprises three dielectric layers 847 and three conductive layers 848. Such number of layers is merely an example, and the scope of this disclosure is not limited thereto. In another example implementation the RD structure 846a may comprise only a single dielectric layer 847 and a single conductive layer 848, two of each layers, etc. The example redistribution (RD) structure 846a is formed on the bulk carrier 821a material.

The dielectric layers 847 may be formed of any of a variety of materials (e.g., Si3N4, SiO2, SiON, PI, BCB, PBO, WPR, epoxy, or other insulating material). The dielectric layers 847 may be formed utilizing any of a variety of processes (e.g., PVD, CVD, printing, spin coating, spray coating, sintering, thermal oxidation, etc.). The dielectric layers 847 may, for example, be patterned to expose various surfaces (e.g., to expose lower traces or pads of the conductive layers 848, etc.).

The conductive layers 848 may be formed on any of a variety of materials (e.g., copper, silver, gold, aluminum, nickel, combinations thereof, alloys thereof, etc.). The conductive layers 848 may be formed utilizing any of a variety of processes (e.g., electrolytic plating, electroless plating, CVD, PVD, etc.).

The redistribution structure 846a may, for example, comprise conductors exposed at an outer surface thereof (e.g., exposed at the top surface of the example 800A). Such exposed conductors may, for example, be utilized for the attachment (or formation) of die interconnection structures (e.g., at block 725, etc.). In such an implementation, the exposed conductors may comprise pads and may, for example, comprise underbump metal (UBM) formed thereon to enhance attachment (or formation) of the die interconnection structures. Such underbump metal may, for example, comprise one or more layers of Ti, Cr, Al, TiW, TiN, or other electrically conductive material.

Example redistribution structures and/or the formation thereof are provided in U.S. patent application Ser. No. 14/823,689, filed Aug. 11, 2015, and titled "SEMICONDUCTOR PACKAGE AND FABRICATING METHOD THEREOF"; and U.S. Pat. No. 8,362,612, titled "SEMICONDUCTOR DEVICE AND MANUFACTURING METHOD THEREOF"; the contents of each of which are hereby incorporated herein by reference in their entirety.

The redistribution structure 846a may, for example, perform a fan-out redistribution of at least some electrical connections, for example laterally moving electrical connections to at least a portion of the vertical interconnection structures 814 (to be formed) to locations outside the footprint of the functional dies 811 and 812 to be attached via such vertical interconnection structures 814. Also for example, the redistribution structure 846a may perform a fan-in redistribution of at least some electrical connections, for example laterally moving electrical connections to at least a portion of the vertical interconnection structures 814 (to be formed) to locations inside the footprint of the connect die 816b (to be connected) and/or to inside the footprints of the functional dies 811 and 812 (to be connected). The redistribution structure 846a may also, for example, provide connectivity of various signals between the functional dies 811 and 812 (e.g., in addition to the connections provided by the connect die 816b).

In various example implementations, block 720 may comprise forming only a first portion 846a of an overall RD structure 846, where a second portion 846b of the overall RD structure 846 may be formed later (e.g., at block 770).

In general, block 720 may comprise receiving, fabricating, and/or preparing a carrier with a signal redistribution (RD) structure thereon. Accordingly, the scope of this disclosure should not be limited by characteristics of any particular manner of making such a carrier and/or signal redistribution structure or by any particular characteristics of such a carrier and/or signal redistribution structure.

The example method 700 may, at block 725, comprise forming vertical interconnection structures on the RD structure (e.g., as provided at block 720). Block 725 may comprise forming the vertical interconnection structures on the RD structure in any of a variety of manners, non-limiting examples of which are provided herein. Note that the vertical interconnection structures may also be referred to herein as tall bumps, tall pillars, tall posts, die interconnection structures, functional die interconnection structures, etc.

Block 725 may, for example, share any or all characteristics (e.g., the second die interconnection structure forming characteristics, etc.) with any or all of the functional die receiving, fabricating, and/or preparing discussed herein (e.g., with regard to block 110 of the example method 100 of FIG. 1 and the forming of the second die interconnection structures 214 and/or the forming of the first die interconnection structures 213, with regard to block 347 of the example method 347 of FIG. 3 and the forming of the second die interconnection structures 414, with regard to block 525 of the example method 500 of FIG. 5, etc.).

Figure 8B:
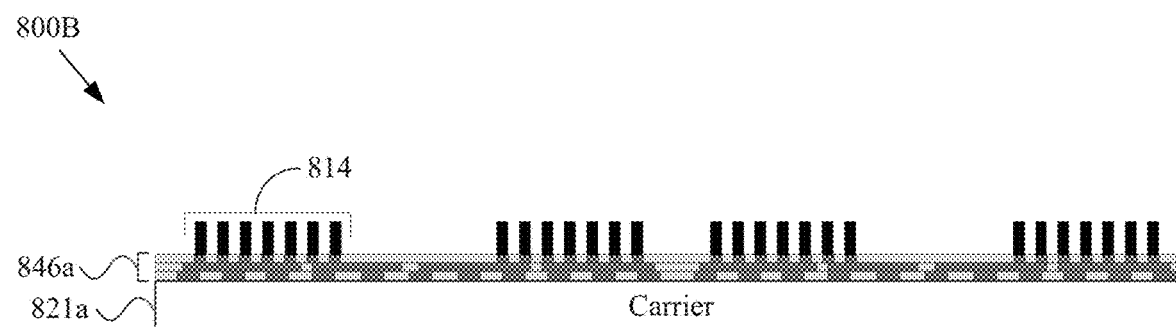

Various example aspects of block 725 are provided in the example 800B of FIG. 8B. The vertical interconnection structures 814 (and/or the forming thereof) may share any or all characteristics with the second die interconnection structures 214 of FIG. 2A (and/or the forming thereof) and/or with the second die interconnection structures 414 of FIG. 4H-2 (and/or the forming thereof). Also, the vertical interconnection structures 814 (and/or the forming thereof) may share any or all characteristics with the interconnection structures 614 of FIG. 6B (and/or the forming thereof)

In general, block 725 may comprise forming vertical interconnection structures on the RD structure (e.g., as provided at block 720). Accordingly, the scope of this disclosure should not be limited by characteristics of any particular manner of forming such vertical interconnection structures and/or of any particular type of vertical interconnection structure.

Figure 8C:
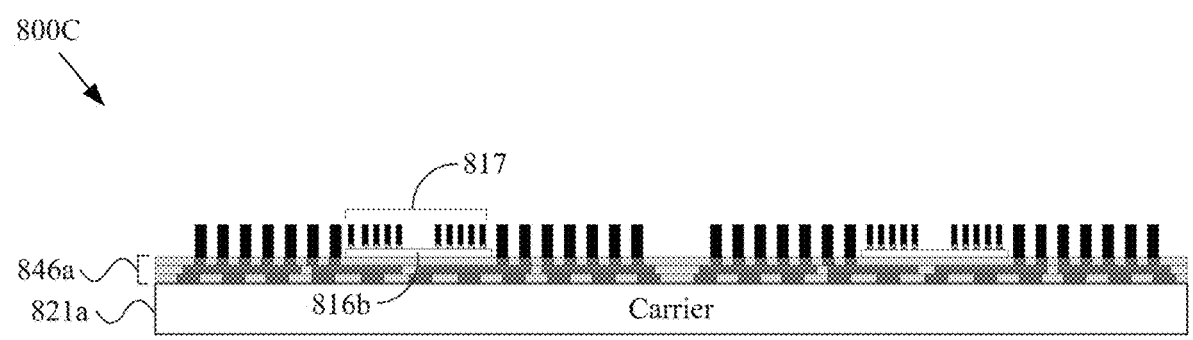

The example method 700 may, at block 730, comprise mounting the connect die to the RD structure (e.g., as provided at block 720). Block 730 may comprise performing such mounting (or attaching or coupling) in any of a variety of manners, non-limiting examples of which are provided herein. Block 730 may, for example, share any or all characteristics with any of the die attaching discussed herein (e.g., with regard to block 530 of the example method 500 shown in FIG. 5 and discussed herein, with regard to block 325 of the example method 300 shown in FIG. 3 and discussed herein, with regard to block 125 of the example method 100 shown in FIG. 1 and discussed herein, etc. Various example aspects of block 730 are presented in the example 800C shown at FIG. 8C.

Block 730 may, for example, comprise utilizing a die-attach adhesive (e.g., a tape, a liquid, a paste, etc.) to attach the back-side of the connect die 816b to the RD structure 846a. Although in FIG. 8C the connect die 816b is shown coupled to a dielectric layer of the RD structure 846a, in other example implementations, the back side of the connect die 816b may be coupled to a conductive layer (e.g., to enhance heat dissipation, to provide additional structural support, etc.).

Additionally, as discussed herein, any of the connect die discussed herein may be two-sided. In such an example implementation, back side interconnection structures may be electrically connected to corresponding interconnection structures (e.g., pads, lands, bumps, etc.) of the RD structure 846a.

In general, block 730 may comprise mounting the connect die to the RD structure (e.g., as provided at block 720). Accordingly, the scope of this disclosure should not be limited by characteristics of any particular manner of mounting a connect die.

The example method 700 may, at block 735, comprise encapsulating. Block 735 may comprise performing such encapsulating in any of a variety of manners, non-limiting examples of which are provided herein. Block 735 may, for example, share any or all characteristics with other encapsulating blocks (or steps) discussed herein (e.g., with block 130 of the example method 100 of FIG. 1, with block 330 of the example method 300 of FIG. 3, with block 530 of the example method 500 of FIG. 5, etc.). Various example aspects of block 735 are presented at FIG. 8D.

Block 735 may, for example, comprise performing a wafer (or panel) level molding process. As discussed herein, prior to singulating individual modules, any or all of the process steps discussed herein may be performed at the panel or wafer level. Referring to the example implementation 800D shown at FIG. 8D, the encapsulating material 851' may cover a top side of the RD structure 846a, the vertical interconnection structures 814, the connect die interconnection structures 817, the top (or active or front) side of the connect die 816b, and at least portions (or all) of lateral side surfaces of the connect die 816b.

Figure 8D:
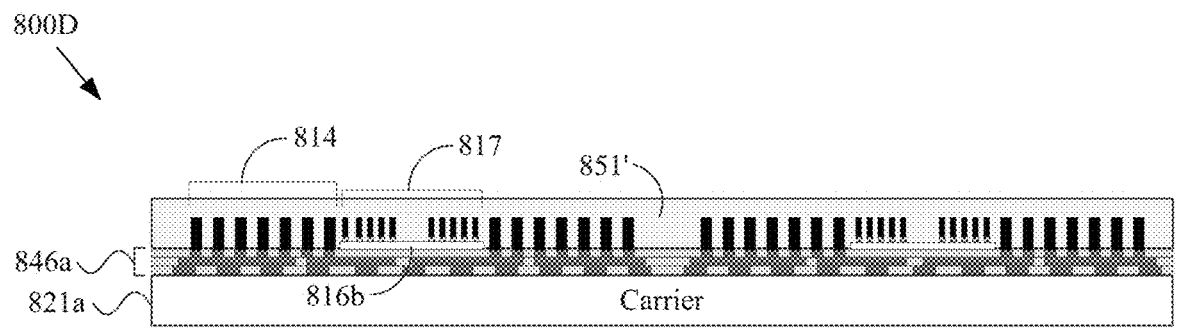
Figure 8E:
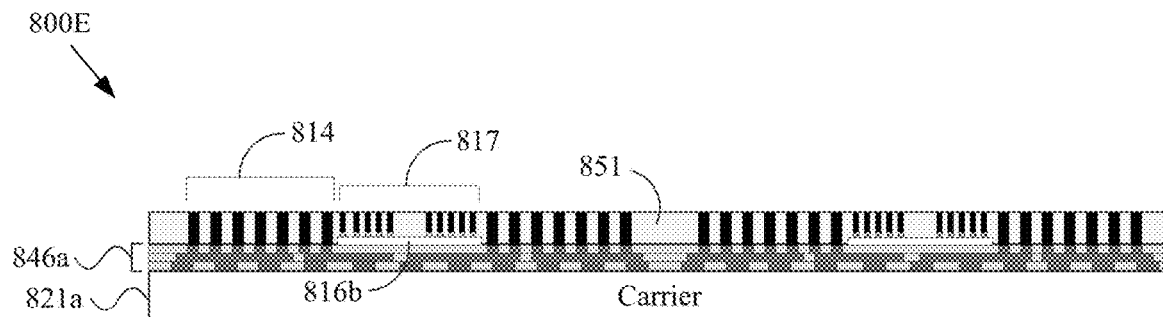

Though the encapsulating material 851' (as shown in FIG. 8D) is shown covering the top ends of the vertical interconnection structures 814 and of the connect die interconnection structures 817, any or all of such ends may be exposed from the encapsulating material 851' (as shown in FIG. 8E). Block 735 may, for example, comprise originally forming the encapsulating material 851' with the top ends of the various interconnections exposed or protruding (e.g., utilizing a film assisted molding technique, die-seal molding technique, etc.). Alternatively, block 735 may comprise forming the encapsulating material 851' followed by a thinning (or planarizing or grinding) process (e.g., performed at block 740) to thin the encapsulating material 851' enough to expose the top sides of any or all of the vertical interconnection structures 814 and the connect die interconnection structures 817, etc.

In general, block 735 may comprise encapsulating. Accordingly, the scope of this disclosure should not be limited by characteristics of any particular manner of performing such encapsulating or of any particular type of encapsulating material or configuration thereof.

The example method 700 may, at block 740, comprise grinding the encapsulating material and/or various interconnection structures. Block 740 may comprise performing such grinding (or any thinning or planarizing) in any of a variety of manners, non-limiting examples of which are provided herein. Various example aspects of block 740 are presented in the example 800E shown at FIG. 8E. Block 740 may, for example, share any or all characteristics with other grinding (or thinning or planarizing) blocks (or steps) discussed herein.

As discussed herein, in various example implementations, the encapsulating material 851' may originally be formed to a thickness that is greater than ultimately desired, and/or the vertical interconnection structures 814 and connect die interconnection structures 817 may originally be formed to a thickness that is greater than ultimately desired. In such example implementations, block 740 may be performed to grind (or otherwise thin or planarize) the encapsulating material 851', the vertical interconnection structures 814, and/or the connect die interconnection structures 817. In the example 800E shown in FIG. 8E, the encapsulating material 851, the vertical interconnection structures 814, and/or the connect die interconnection structures 817 have been ground to result in the encapsulating material 851 and vertical interconnection structures 814 and connect die interconnection structures 817 (as shown in FIG. 8E). The top surface of the grinded encapsulating material 851, the top surfaces of the vertical interconnection structures 814 and/or the top surfaces of the connect die interconnection structures 817 may, for example, be coplanar.

Note that in various example implementations, the top surfaces of the vertical interconnection structures 814 and/or the top surfaces of the connect die interconnection structures 817 may protrude from the top surface of the encapsulating material 851, for example utilizing a chemical or mechanical process that thins the encapsulating material 851 more than the vertical interconnection structures 814 and/or the connect die interconnection structures 817, utilizing a film-assisted and/or sealed molding process at block 735, etc.

In general, block 740 may comprise grinding (or thinning or planarizing) the encapsulating material and/or various interconnection structures. Accordingly, the scope of this disclosure should not be limited by characteristics of any particular manner of performing such grinding (or thinning or planarizing).

The example method 700 may, at block 742, comprise forming a second signal redistribution (RD) structure (or distribution structure). Block 742 may comprise performing such forming in any of a variety of manners, non-limiting examples of which are provided herein.

Block 742 may, for example, share any or all characteristics with any or all of the signal distribution structure forming discussed herein (e.g., with regard to block 120 of the example method 100 of FIG. 1, with regard to block 320 of the example method 300 of FIG. 3, with regard to block 520 of the example method 500 of FIG. 5, with regard to block 720, etc.). Various example aspects of block 742 are provided in the example 800F of FIG. 8F.

As discussed herein, an example structure 800E resulting from block 740 may comprise a top surface that comprises a top surface of the encapsulating material 851, exposed top end surfaces of the vertical interconnection structures 814 and/or the connect die interconnection structures 817, exposed top lateral surfaces of the vertical interconnection structures 814 and/or the connect die interconnection structures 817, etc. Block 742 may, for example, comprise forming the second signal redistribution structure on any or all of such surfaces.

Figure 8F:
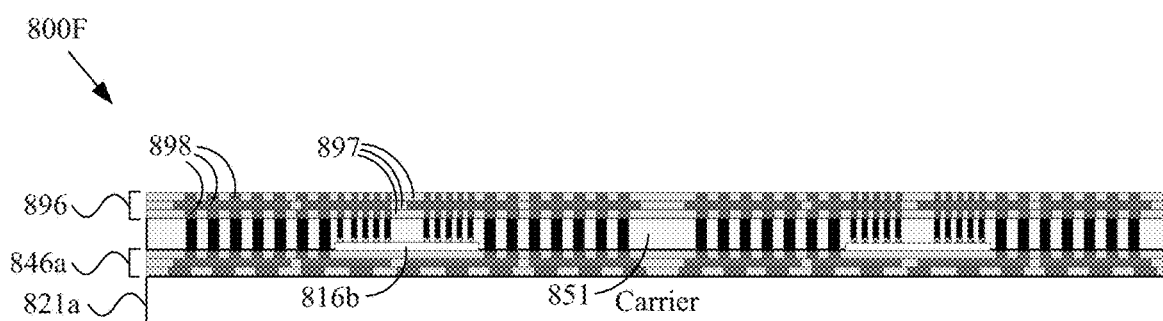

Block 742 may comprise forming a second RD structure, for example on top of the structure 800E, in any of a variety of manners, non-limiting examples of which are presented herein. In an example implementation, one or more dielectric layers and one or more conductive layers may be formed to laterally and/or vertically distribute electrical connections between the vertical interconnection structures 814 and/or the connect die interconnection structures 817 to electrical components mounted therein (e.g., to semiconductor dies, for example dies 811 and 812, passive electrical components, shielding components, etc.). FIG. 8F shows an example in which the second RD structure 896 comprises three dielectric layers 897 and three conductive layers 898. Such number of layers is merely an example, and the scope of this disclosure is not limited thereto. In another example implementation the second RD structure 896 may comprise only a single dielectric layer 897 and a single conductive layer 898, two of each layers, etc. The second RD structure 896 may thus be coreless. Note however, that in various alternative implementations, the second RD structure 896 may be a cored structure. In another example implementation, the second redistribution (or distribution) structure 896 may comprise only a single vertical metal structure (e.g., of one or more layers), for example an under bump metallization structure.

The dielectric layers 897 may be formed of any of a variety of materials (e.g., Si3N4, SiO2, SiON, PI, BCB, PBO, WPR, epoxy, or other insulating material). The dielectric layers 897 may be formed utilizing any of a variety of processes (e.g., PVD, CVD, printing, spin coating, spray coating, sintering, thermal oxidation, etc.). The dielectric layers 897 may, for example, be patterned to expose various surfaces (e.g., to expose lower traces or pads of the conductive layers 898, etc.).

The conductive layers 898 may be formed of any of a variety of materials (e.g., copper, silver, gold, aluminum, nickel, combinations thereof, alloys thereof, etc.). The conductive layers 898 may be formed utilizing any of a variety of processes (e.g., electrolytic plating, electroless plating, CVD, PVD, etc.).

The second RD structure 896 may, for example, comprise conductors exposed at an outer surface thereof (e.g., exposed at the top surface of the example 800F). Such exposed conductors may, for example, be utilized for the attachment (or formation) of electrical components and/or attachment structures thereof (e.g., at block 745, etc.). Such exposed conductors may, for example, comprise pad structures, under bump metallization structures, etc. In such an implementation, the exposed conductors may comprise pads and may, for example, comprise underbump metal (UBM) formed thereon to enhance attachment (or formation) of the components and/or interconnection structures thereof. Such underbump metal may, for example, comprise one or more layers of Ti, Cr, Al, TiW, TiN, or other electrically conductive material.

Example redistribution structures and/or the formation thereof are provided in U.S. patent application Ser. No. 14/823,689, filed Aug. 11, 2015, and titled "SEMICONDUCTOR PACKAGE AND FABRICATING METHOD THEREOF"; and U.S. Pat. No. 8,362,612, titled "SEMICONDUCTOR DEVICE AND MANUFACTURING METHOD THEREOF"; the contents of each of which are hereby incorporated herein by reference in their entirety.

The second RD structure 896 may, for example, perform a fan-out redistribution of at least some electrical connections or signals, laterally moving electrical connections or signals from at least a portion of the connect die interconnection structures 817 and/or of the vertical interconnection structures 814 (attached to the bottom side of the second RD structure 896) to locations outside the footprint of the connect die interconnection structures 817 (or connect die 816b) and/or of the vertical interconnection structures 814. Also for example, the second RD structure 896 may perform a fan-in redistribution of at least some electrical connections or signals, laterally moving electrical connections or signals from at least a portion of the connect die interconnection structures 817 and/or of the vertical interconnection structure 814 to locations inside the footprint of the connect die interconnection structures 817 (or connect die 816b) and/or of the vertical interconnection structures 814. The second RD structure 896 may also, for example, provide connectivity of various signals between the functional dies 811 and 812 (e.g., in addition to the connections provided by the connect die 816b, in addition to the connections provided by the RD structure 846a, etc.).

Though the example block 742 has been described as forming the second RD structure layer-by-layer, it should be noted that the second RD structure may be received in a preformed format and then attached (e.g., soldered, epoxied, etc.) at block 742.

In general, block 742 may comprise forming a second redistribution (RD) structure. Accordingly, the scope of this disclosure should not be limited by characteristics of any particular manner of making such a carrier and/or signal redistribution structure or by any particular characteristics of such a carrier and/or signal redistribution structure.

Figure 8G:
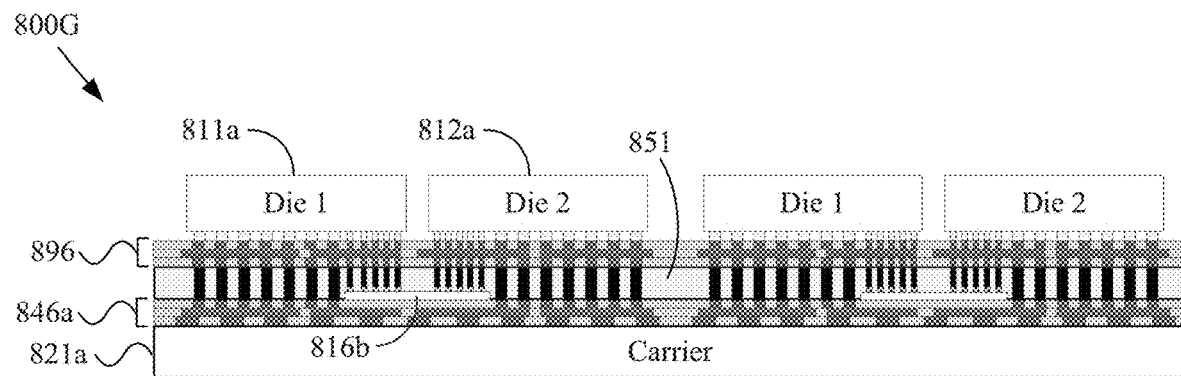

The example method 700 may, at block 745, comprise attaching (or coupling or mounting) the functional die to the second redistribution (RD) structure (e.g., as formed at block 742). Block 745 may comprise performing such attaching in any of a variety of manners, non-limiting examples of which are provided herein. Block 745 may, for example, share any or all characteristics with any die attaching process discussed herein. Various example aspects of block 745 are presented in the example 800G shown at FIG. 8G.

For example, die interconnection structures (e.g., pads, bumps, etc.) of the first functional die 811a may be mechanically and electrically connected to respective conductors (e.g., pads, under bump metals, exposed traces, etc.) of the second RD structure 896. For example, the die interconnection structures of the first functional die 811a may be electrically connected to respective vertical interconnection structures 814 and/or to respective connect die interconnection structures 817 through conductors of the second RD structure 896. Similarly, die interconnection structures (e.g., pads, bumps, etc.) of the second functional die 812a may be mechanically and electrically connected to respective conductors (e.g., pads, under bump metals, exposed traces, etc.) of the second RD structure 896. For example, the die interconnection structures of the second functional die 812a may be electrically connected to respective vertical interconnection structures 814 and/or to respective connect die interconnection structures 817 through conductors of the second RD structure 896.

Such interconnection structures of the functional dies may be connected in any of a variety of manners. For example, the connection may be performed by soldering. In an example implementation, the interconnection structures of the functional dies 811a and 812a may comprise solder caps (or other solder structures) that may be reflowed by mass reflow, thermal compression bonding (TCB), etc. Similarly, pads or under bump metals of the second RD structure 896 may have been formed (e.g., at block 742) with solder caps (or other solder structures) that may be reflowed by mass reflow, thermal compression bonding (TCB), etc. In another example implementation, the connection may be performed by direct metal-to-metal (e.g., copper-to-copper, etc.) bonding, instead of utilizing solder and/or by utilizing one or more intervening layers of non-solder metal. Examples of such connections are provided in U.S. patent application Ser. No. 14/963,037, filed on Dec. 8, 2015, and titled "Transient Interface Gradient Bonding for Metal Bonds," and U.S. patent application Ser. No. 14/989,455, filed on Jan. 6, 2016, and titled "Semiconductor Product with Interlocking Metal-to-Metal Bonds and Method for Manufacturing Thereof," the entire content of each of which is hereby incorporated herein by reference. Any of a variety of techniques may be utilized to attach the functional die interconnection structures to the second RD structure 896 (e.g., mass reflow, thermal-compression bonding (TCB), direct metal-to-metal intermetallic bonding, conductive adhesive, etc.).

As shown in the example implementation 800G, first connect die interconnection structures 817 of the connect die 816b are connected to respective interconnection structures of the first functional die 811a through the second RD structure 896, and second connect die interconnection structures 817 of the connect die 816b are connected to respective interconnection structures of the second functional die 812a through the second RD structure 896. As connected, the connect die 816b (e.g., in conjunction with the second RD structure 896) provides an electrical connection between various die interconnection structures of the first functional die 811a and the second functional die 812a via the RD structures 298 of the connect die 816b (e.g., as shown in the example 200B-4 of FIG. 2B-1, etc.).

In the example 800G shown in FIG. 8F, the height of the vertical interconnection structures 814 may, for example, be equal to (or greater) the combined height of the connect die interconnection structures 217 and the support layer 290b of the connect die 816b, and adhesive or other means utilized to attach the connect die 816b to the RD structure 846a. The second RD structure 896 may thus, for example, comprise a generally planar lower side, a generally uniform thickness, and a generally planar upper side.

In general, block 745 may comprise attaching (or coupling or mounting) the functional die to the second RD structures. Accordingly, the scope of this disclosure should not be limited by characteristics of any particular manner of performing such attaching or by characteristics of any particular type of attaching structure.

Figure 8H:
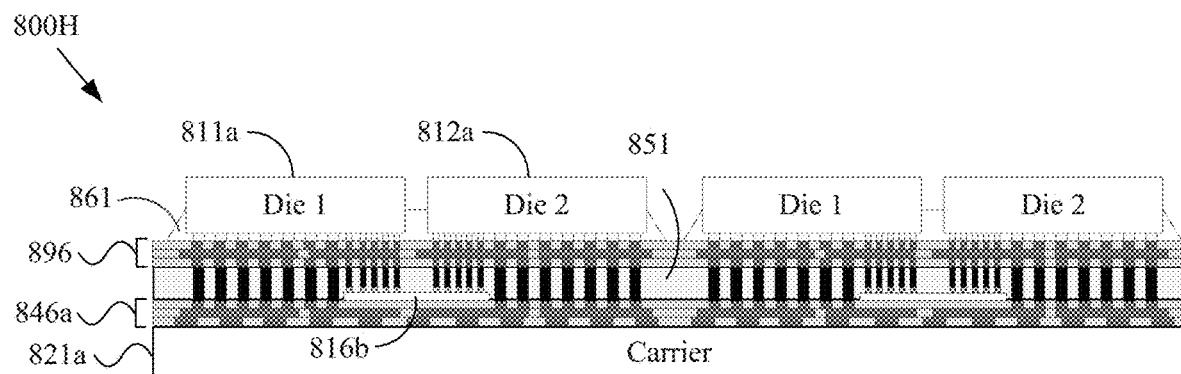

The example method 700 may, at block 750, comprise underfilling the functional die. Block 750 may comprise performing such underfilling in any of a variety of manners, non-limiting examples of which are provided herein. Block 750 may, for example, share any or all characteristics with any underfilling discussed herein (e.g., with block 155 and/or block 175 of the example method 100 of FIG. 1, with block 355 and/or block 375 of the example method 300 of FIG. 3, with block 550 of the example method 500 of FIG. 5, etc.). Various example aspects of block 750 are presented in the example 800H shown at FIG. 8H.

Note that underfill may be applied between the functional die 811a and 812a and the second RD structure 896. In a scenario in which pre-applied underfill (PUF) is utilized, such PUF may be applied to the functional die 811a and 812a, and/or to the second RD structure 896 and/or top exposed conductors (e.g., pads, under bump metallizations, exposed traces, etc.) of the second RD structure 896 before the coupling of the functional die 811a and 812a.

Block 750 may comprise forming the underfill after the attachment performed at block 745 (e.g., a capillary underfill, injected underfill, etc.). As shown in the example implementation 800H of FIG. 8H, the underfill material 861 (e.g., any underfill material discussed herein, etc.) may completely or partially cover the bottom sides of the functional die 811a and 812a (e.g., as oriented in FIG. 8H) and/or at least a portion (if not all) of lateral sides of the functional die 811a and 812a. The underfill material 861 may also, for example, cover most (or all) of the top side of the second RD structure 896. The underfill material 861 may also, for example, surround respective interconnection structures (e.g., pads, bumps, etc.) of the functional die 811a and 812a to which respective interconnection structures (e.g., pads, lands, traces, under bump metallizations, etc.) of the second RD structure 896 are attached. In an example implementation in which end portions of interconnection structures of the second RD structure 896 protrude from a top surface (e.g., a top dielectric layer surface) of the second RD structure 896, the underfill material 861 may also surround such protruding portions.

Note that in various example implementations of the example method 700, the underfilling performed at block 750 may be skipped. For example, underfilling the functional die may be performed at another block (e.g., at block 755, etc.). Also for example, such underfilling may be omitted entirely.

In general, block 750 may comprise underfilling the functional die. Accordingly, the scope of this disclosure should not be limited by characteristics of any particular manner of performing such underfilling or by characteristics of any particular type of underfill material.

The example method 700 may, at block 755, comprise encapsulating. Block 755 may comprise performing such encapsulating in any of a variety of manners, non-limiting examples of which are provided herein. For example, block 755 may share any or all characteristics with other encapsulating blocks (or steps) discussed herein (e.g., with block 735, with block 130 of the example method 100 of FIG. 1, with block 330 of the example method 300 of FIG. 3, with blocks 535 and 555 of the example method 500 of FIG. 5, etc.).

Figure 8I:
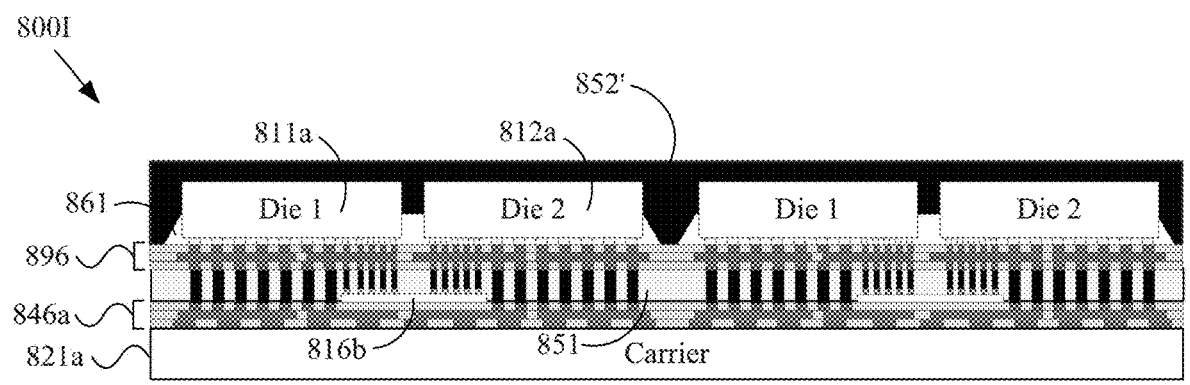

Various example aspects of block 755 are presented in the example 800I shown at FIG. 8I. For example, the encapsulating material 852' (and/or the forming thereof) may share any or all characteristics with the encapsulating material 226' (and/or the forming thereof) of FIG. 2E, with the encapsulating material 426 (and/or the forming thereof) of FIG. 4K, with the encapsulating material 651 and 652' (and/or the forming there) of FIGS. 6D and 6H, with the encapsulating material 851 of FIG. 8E, etc.

The encapsulating material 852' covers the top side of the second RD structure 896, covers lateral side surfaces of the underfill 861, covers top surfaces of the underfill 861 (e.g., between the dies 811a and 812a), covers at least some (if not all) of the lateral side surfaces of the functional die 811a and 812a, covers top sides of the functional die 811a and 812a, etc. In other examples, the encapsulating material 852' can be substituted for the underfill 861, and thus provide underfill between the functional die 811a and/or 812a, and the second RD structure 896.

As discussed herein with regard to other encapsulating materials (e.g., the encapsulating material 226' of FIG. 2E, etc.), the encapsulating material 852' need not be originally formed to cover the top sides of the functional die 811a and 812a. For example, block 755 may comprise utilizing film-assisted molding, sealed molding, etc., to form the encapsulating material 852'.

In general, block 755 may comprise encapsulating. Accordingly, the scope of this disclosure should not be limited by characteristics of any particular manner of performing such encapsulating, of any particular type of encapsulating material, etc.

The example method 700 may, at block 760, comprise grinding (or otherwise thinning or planarizing) the encapsulating material. Block 760 may comprise performing such grinding (or any thinning or planarizing process) in any of a variety of manners, non-limiting examples of which are provided herein. For example, block 760 may, for example, share any or all characteristics with other grinding (or thinning) blocks (or steps) discussed herein (e.g., with block 135 of the example method 100 of FIG. 1, with block 335 of the example method 300 of FIG. 3, with blocks 540 and 555 of the example method 500 of FIG. 5, with block 735, etc.).

Figure 8J:
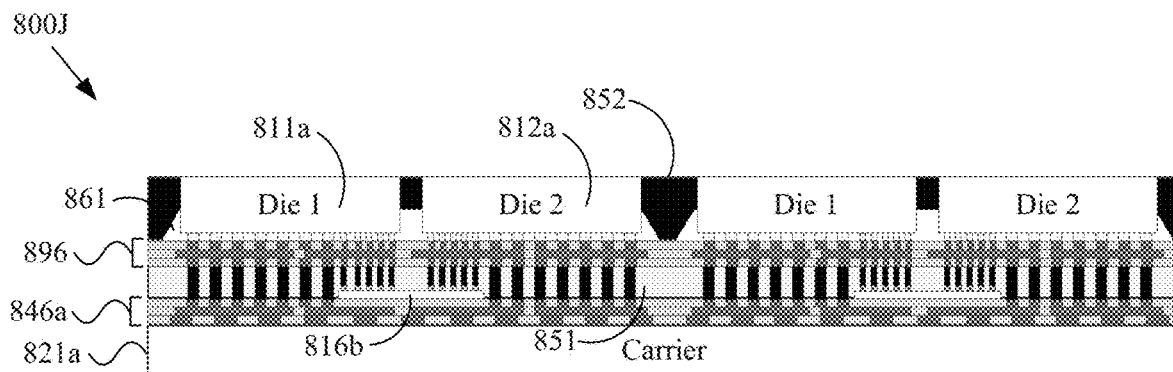

Various example aspects of block 760 are presented in the example 800J shown at FIG. 8J. The example grinded (or thinned or planarized, etc.) encapsulating material 852 (and/or the forming thereof) may share any or all characteristics with the encapsulating material 226 (and/or the forming thereof) of FIG. 2F, with the encapsulating material 426 (and/or the forming thereof) of FIG. 4F, with the encapsulating material 651 and 652 (and/or the forming thereof) of FIGS. 6E and 6I, with the encapsulating material 851, etc.

Block 760 may, for example comprising grinding the encapsulating material 852 and/or the functional die 811a and 812a such that the top surface of the encapsulating material 852 is coplanar with the top surface of the functional die 811a and/or with the top surface of the functional die 812a.

In general, block 760 may comprise grinding (or otherwise thinning or planarizing) the encapsulating material. Accordingly, the scope of this disclosure should not be limited by characteristics of any particular manner of performing such grinding (or thinning or planarizing).

The example method 700 may, at block 765, comprise removing the carrier. Block 765 may comprise removing the carrier in any of a variety of manners, non-limiting examples of which are provided herein. For example, block 765 may share any or all characteristics with any carrier-removal process discussed herein (e.g., with block 145 and/or block 160 of the example method 100 of FIG. 1, with block 345 and/or block 360 of the example method 300 of FIG. 3, with block 565 of the example method 500 of FIG. 5, etc.). Various example aspects of block 765 are shown in the example 800K at FIG. 8K.

Figure 8K:
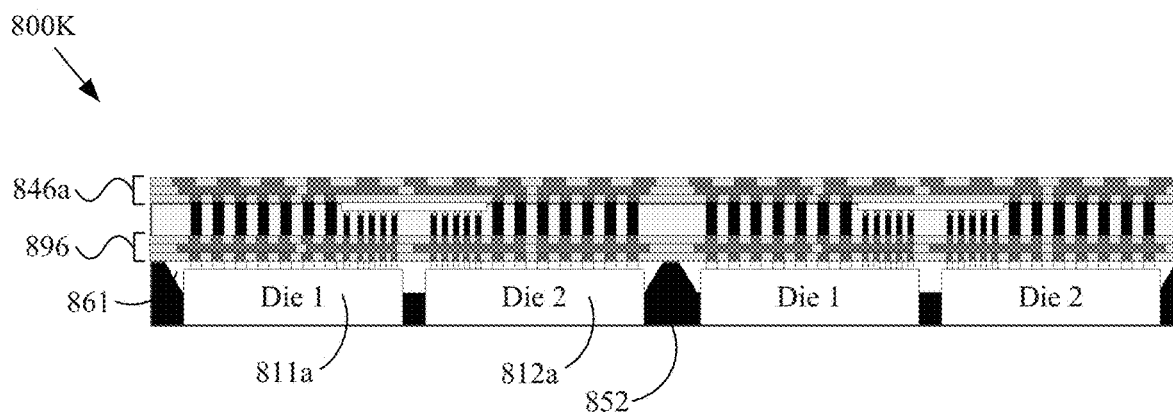

For example, the example 800K of FIG. 8K shows the first carrier 821a removed (e.g., in comparison with the example 800J of FIG. 8J). Block 765 may comprise performing such carrier removal in any of a variety of manners (e.g., grinding, etching, chemical-mechanical planarization, peeling, shearing, thermal or laser releasing, etc.). Also for example, block 765 may comprise removing an adhesive layer, if for example an adhesive layer was utilized during the formation of the RD structure 846a at block 720.

Note that, in various example implementations, as shown and discussed herein with regard to the example methods 100 and 300 of FIGS. 1 and 3, a second carrier may be utilized (e.g., coupled to the encapsulating material 852 and/or to the functional die 811a and 812a. In other example implementations, various tooling structures may be utilized instead of a carrier.

In general, block 765 may comprise removing the carrier. Accordingly, the scope of this disclosure should not be limited by characteristics of any particular manner of removing a carrier or by characteristics of any particular type of carrier.

The example method 700 may, at block 770, comprise completing the signal redistribution (RD) structure (e.g., if the RD structure 846*a* was not completely formed at block 820). Block 770 may comprise completing the RD structure in any of a variety of manners, non-limiting examples of which are provided herein. Block 770 may, for example, share any or all characteristics with block 720 (e.g., with regard to the RD structure forming aspects of block 720). Various aspects of block 770 are presented in the example 800L shown at FIG. 8L.

As discussed herein, for example with regard to block 720, the carrier may have (but need not have) been received (or fabricated or prepared) with only part of the desired RD structure formed. In such an example scenario, block 770 may comprise completing the formation of the RD structure.

Figure 8L:
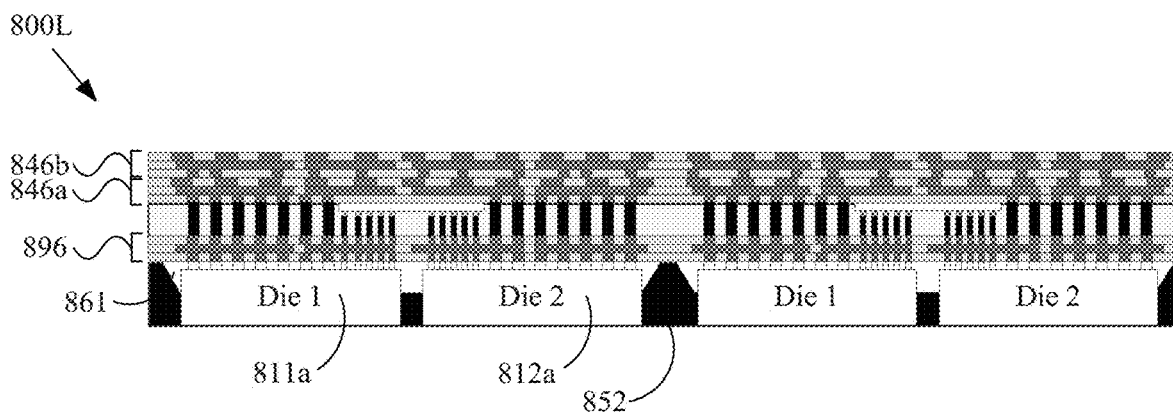

Referring to FIG. 8L, block 770 may comprise forming the second portion of the RD structure 846*b* on the first portion of the RD structure 846*a* (e.g., the first portion of the RD structure 846*a* having been received or fabricated or prepared at block 720). Block 770 may, for example, comprise forming the second portion of the RD structure 846*b* in the same manner as that in which the first portion of the RD structure 846*a* is formed.

Note that in various implementations, the first portion of the RD structure 846*a* and the second portion of the RD structure 846*b* may be formed utilizing different materials and/or different processes. For example the first portion of the RD structure 846*a* may be formed utilizing inorganic dielectric layers, and the second portion of the RD structure 846*b* may be formed utilizing organic dielectric layers. Also for example, the first portion of the RD structure 846*a* may be formed having a finer pitch (or thinner traces, etc.), and the second portion of the RD structure 846*b* may be formed having a coarser pitch (or thicker traces, etc.). Also for example, the first portion of the RD structure 846*a* may be formed utilizing a back end of line (BEOL) semiconductor wafer fabrication (fab) process, and the second portion of the RD structure 846*b* may be form utilizing a post-fab electronic device packaging process. Additionally, the first portion of the RD structure 846*a* and the second portion of the RD structure 846*b* may be formed at different geographical locations.

As with the first portion of the RD structure 846*a*, the second portion of the RD structure 846*b* may have any number of dielectric and/or conductive layers.

As discussed herein, interconnection structures may be formed on the RD structure 846*b*. In such an example implementation, block 765 may comprise forming under bump metallization (UBM) on exposed pads to enhance the formation (or attachment) of such interconnection structures.

In general, block 770 may comprise completing the signal redistribution (RD) structure. Accordingly, the scope of this disclosure should not be limited by characteristics of any particular manner of forming a signal redistribution structure or by characteristics of any particular type of signal distribution structure.

The example method 700 may, at block 775, comprise forming interconnection structures on the redistribution structure. Block 775 may comprise forming the interconnection structures in any of a variety of manners, non-limiting examples of which are provided herein. For example, block 775 may share any or all characteristics with any interconnection structure forming discussed hereon.

Figure 8M:
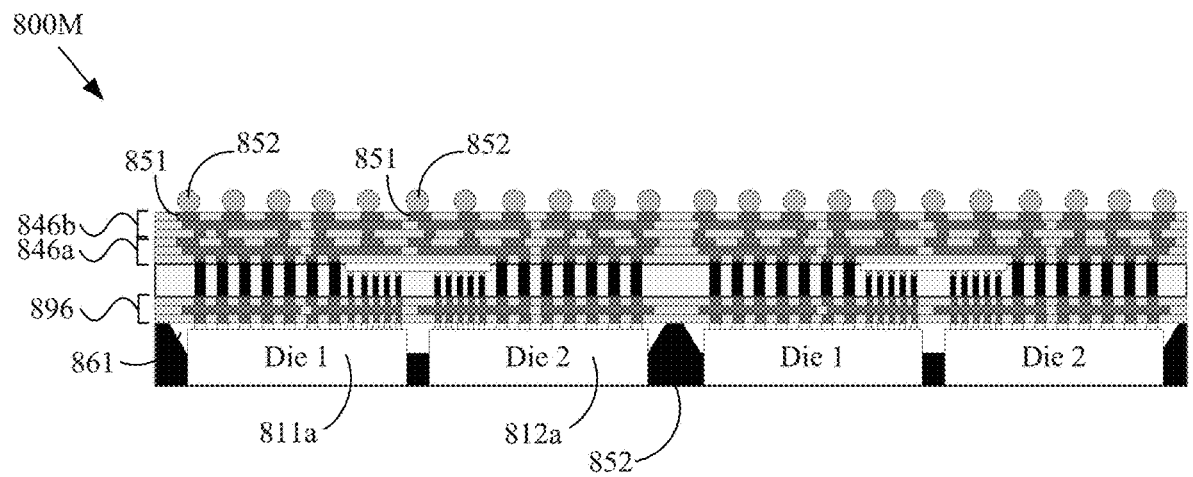
Figure 8N:
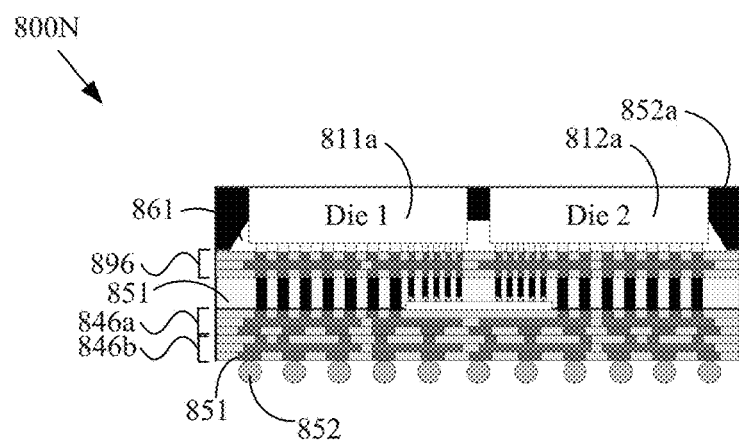

Various example aspects of block 775 are presented in the example 800M shown at FIG. 8M. The example interconnection structures 852 (e.g., package interconnection structures, etc.) may comprise characteristics of any of a variety of interconnection structures. For example, the package interconnection structures 852 may comprise conductive balls (e.g., solder balls, etc.), conductive bumps, conductive pillars, wires, etc.

Block 775 may comprise forming the interconnection structures 852 in any of a variety of manners. For example, the interconnection structures 852 may be pasted and/or printed on the RD structure 846*b* (e.g., to respective pads 851 and/or UBM thereof) and then reflowed. Also for example, the interconnection structures 852 (e.g., conductive balls, conductive bumps, pillars, wires, etc.) may be preformed prior to attaching and then attached to the RD structure 846*b* (e.g., to respective pads 851 thereof), for example reflowed, plated, epoxied, wire-bonded, etc.).

Note that, as discussed above, the pads 851 of the RD structure 846*b* may be formed with underbump metal (UBM) or any metallization to assist with the formation (e.g., building, attaching, coupling, depositing, etc.) of the interconnection structures 852. Such UBM forming may, for example, be performed at block 770 and/or at block 775.

In general, block 775 may comprise forming interconnection structures on the redistribution structure. Accordingly, the scope of this disclosure should not be limited by characteristics of any particular manner of forming such interconnection structures or by any particular characteristics of an interconnection structure.

The example method 700 may, at block 780, comprise singulating. Block 780 may comprise performing such singulating in any of a variety of manners, non-limiting examples of which are discussed herein. Block 780 may, for example, share any or all characteristics with any singulating discussed herein (e.g., as discussed with regard to block 165 of the example method 100 of FIG. 1, as discussed with regard to block 365 of the example method 300 of FIG. 3, as discussed with regard to block 580 of the example method 500 of FIG. 5, etc.).

Various example aspects of block 780 are presented in the example 800N shown in FIG. 8N. The singulated structure (e.g., corresponding to an encapsulating material portions 852*a*) may, for example, share any or all characteristics with the singulated structures (e.g., corresponding to the two encapsulating material portions 226*a* and 226*b*) of FIG. 2L, with the singulated structures (e.g., corresponding to the two encapsulating material portions 426*a* and 426*b*) of FIG. 4L, with the singulated structure 600M of FIG. 6M, etc.

In general, block 780 may comprise singulating. Accordingly, the scope of this disclosure should not be limited by characteristics of any particular manner of singulating.

The example method 700 may, at block 790, comprise performing continued processing. Such continued processing may comprise any of a variety of characteristics, non-limiting examples of which are provided herein. For example, block 790 may share any or all characteristics with block 190 of the example method 100 of FIG. 1, with block 390 of the example method 300 of FIG. 3, with block 590 of the example method 500 of FIG. 5, etc.

For example, block 790 may comprise returning execution flow of the example method 700 to any block thereof. Also for example, block 790 may comprise directing execution flow of the example method 700 to any other method block (or step) discussed herein (e.g., with regard to the example method 100 of FIG. 1, the example method 300 of FIG. 3, the example method 500 of FIG. 5, etc.).

For example, as shown in the example 200O of FIG. 2O, the example 200P of FIG. 2P, and the example 200Q of FIG.

2Q, block 790 may comprise forming (or skipping the forming of) encapsulating material and/or underfill.

As discussed herein, the functional die and the connect die may be mounted to a substrate, for example in a multi-chip module configuration. Non-limiting examples of such configurations are shown in FIGS. 9 and 10.

FIG. 9 shows a top view of an example electronic device 900, in accordance with various aspects of the present disclosure. The example electronic device 900 may, for example, share any or all characteristics with any or all electronic devices discussed herein. For example, the functional dies 911 and 912 may share any or all characteristics with any or all of the functional dies (211, 212, 201-204, 411, 412, 401-404, 611*a*, 612*a*, 811*a*, 812*a*, etc.) discussed herein. Also for example, the connect die 916 may share any or all characteristics with any or all of the connect dies (216*a*, 216*b*, 216*c*, 290*a*, 290*b*, 416*a*, 416*b*, 616*b*, 816*b*, etc.) discussed herein. Additionally for example, the substrate 930 may share any or all characteristics with any or all substrates and/or RD structures (288, 488, 646, 846, 896, etc.) discussed herein.

FIG. 10 shows a top view of an example electronic device, in accordance with various aspects of the present disclosure. The example electronic device 1000 may, for example, share any or all characteristics with any or all electronic devices discussed herein. For example, the functional dies (Functional Die 1 to Functional Die 10) may share any or all characteristics with any or all of the functional dies (211, 212, 201-204, 411, 412, 401-404, 611*a*, 612*a*, 811*a*, 812*a*, 911, 912, etc.) discussed herein. Also for example, the connect dies (Connect Die 1 to Connect Die 10) may share any or all characteristics with any or all of the connect dies (216*a*, 216*b*, 216*c*, 290*a*, 290*b*, 416*a*, 416*b*, 616*b*, 816*b*, 916, etc.) discussed herein. Additionally for example, the substrate 1030 may share any or all characteristics with any or all substrates and/or RD structures (288, 488, 646, 846, 896, 930, etc.) discussed herein.

Though the illustrations discussed herein generally comprise a connect die between two functional die, the scope of this disclosure is not limited thereto. For example, as shown in FIG. 10, Connect Die 9 is connected to three functional die (e.g., Functional Die 2, Functional Die 9, and Functional Die 10), for example electrically connecting each of such functional die to the others. Thus, a single connect die may couple numerous functional die (e.g., two functional die, three functional die, four functional die, etc.).

Also, though the illustrations discussed herein generally comprise a functional die connected to only one connect die, the scope of this disclosure is not limited thereto. For example, a single functional die may be connected to two or more connect die. For example, as shown in FIG. 10, Functional Die 1 is connected to many other functional die via many respective connect die.

The discussion herein included numerous illustrative figures that showed various portions of semiconductor device assemblies (or packages) and/or methods of manufacturing thereof. For illustrative clarity, such figures did not show all aspects of each example assemblies. Any of the example assemblies presented herein may share any or all characteristics with any or all other assemblies presented herein.

In summary, various aspects of this disclosure provide a semiconductor package structure and a method for making a semiconductor package. As non-limiting examples, various aspects of this disclosure provide various semiconductor package structures, and methods for making thereof, that comprise a connect die that routes electrical signals between a plurality of other semiconductor die. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   a first signal redistribution structure;
   a first vertical interconnection structure on a first side of the first signal redistribution structure;
   a connect die comprising a back side and a front side, wherein the back side is facing and is coupled to the first side of the first signal redistribution structure;
   a first connect die interconnection structure coupled to the front side of the connect die; and
   a second signal redistribution structure on the first vertical interconnection structure and on the first connect die interconnection structure.

2. The electronic device of claim 1, comprising:
   a second vertical interconnection structure on the first side of the first signal redistribution structure; and
   a second connect die interconnection structure coupled to the front side of the connect die, wherein the second connect die interconnection structure is electrically coupled to the first connect die interconnection structure.

3. The electronic device of claim 1, comprising a first encapsulating material that covers the first side of the first signal redistribution structure and laterally surrounds the first vertical interconnection structure and the first connect die interconnection structure.

4. The electronic device of claim 3, wherein the first encapsulating material laterally surrounds the connect die.

5. The electronic device of claim 3, wherein a first side of the first encapsulating material is coplanar with an end surface of the first vertical interconnection structure and an end surface of the first connect die interconnection structure.

6. The electronic device of claim 5, wherein a first lateral side of the first signal redistribution structure, a first lateral side of the second signal redistribution structure, and a first lateral side of the first encapsulating material are coplanar.

7. The electronic device of claim 5, comprising a second encapsulating material that covers the second signal redistribution structure.

8. The electronic device of claim 7, wherein a first lateral side of the first signal redistribution structure, a first lateral side of the second signal redistribution structure, a first lateral side of the first encapsulating material, and a first lateral side of the second encapsulating material are coplanar.

9. The electronic device of claim 1, wherein the back side of the connect die is free of electrical connections.

10. The electronic device of claim 1, wherein at least a portion of the connect die is above a topmost surface of the first signal distribution structure.

11. The electronic device of claim 1, wherein the volume directly vertically between the first and second signal redistribution structures is free of active electronic components.

12. The electronic device of claim 1, wherein the first and second signal redistribution structures are coreless.

13. The electronic device of claim 1, wherein the connect die is a portion of a wafer or panel of connect dies.

14. The electronic device of claim 1, further comprising a second connect die coupled to the first side of the first signal redistribution structure.

15. The electronic device of claim 1, wherein the connect die comprises electrical routing circuitry without active electronic components and without passive electronic components.

16. The electronic device of claim 1, wherein the connect die comprises a passive electronic component.

17. The electronic device of claim 16, wherein the passive electronic component is a resistor.

18. The electronic device of claim 16, wherein the passive electronic component is a capacitor or inductor.

19. The electronic device of claim 16, wherein the passive electronic component is an integrated passive device.

20. The electronic device of claim 1, wherein the connect die comprises no active electronic components.

* * * * *